United States Patent
Sharma

(10) Patent No.: US 12,119,809 B1
(45) Date of Patent: Oct. 15, 2024

(54) DRIVER CIRCUITS FOR GALLIUM NITRIDE HALF BRIDGE POWER CONVERTERS

(71) Applicant: Navitas Semiconductor Limited, Dublin (IE)

(72) Inventor: Santosh Sharma, Rancho Santa Margarita, CA (US)

(73) Assignee: Navitas Semiconductor Limited, Dublin (IE)

( * ) Notice: Subject to any disclaimer, the term of this patent is extended or adjusted under 35 U.S.C. 154(b) by 325 days.

(21) Appl. No.: 17/571,395

(22) Filed: Jan. 7, 2022

Related U.S. Application Data

(60) Provisional application No. 63/136,547, filed on Jan. 12, 2021.

(51) Int. Cl.
*H03K 17/06* (2006.01)
*H02M 1/088* (2006.01)
*H02M 3/158* (2006.01)

(52) U.S. Cl.
CPC .......... *H03K 17/063* (2013.01); *H02M 1/088* (2013.01); *H02M 3/158* (2013.01); *H03K 2217/0063* (2013.01); *H03K 2217/0072* (2013.01); *H03K 2217/0081* (2013.01)

(58) Field of Classification Search
CPC ........ H03K 17/063; H03K 2217/0072; H02M 1/088; H02M 3/158
See application file for complete search history.

(56) References Cited

U.S. PATENT DOCUMENTS

2022/0021300 A1\* 1/2022 Wang .................. H02M 7/2195

\* cited by examiner

*Primary Examiner* — Metasebia T Retebo
(74) *Attorney, Agent, or Firm* — Fisher Broyles, LLP

(57) ABSTRACT

A driver circuit is disclosed. The driver circuit is configured to generate a drive voltage for driving a bootstrap transistor. The driver circuit includes an input node and an output node, a first circuit including a plurality of switches, a first capacitor and a second capacitor, and a pass gate switch coupled between the output node and the first capacitor. In one aspect, the first circuit, the first and second capacitors and the pass gate switch are arranged to cause an output voltage at the output node to change from a first output voltage to a second output voltage. In another aspect, a resistor is connected between the first capacitor and the second capacitor, and a feedback switch is connected in parallel to the resistor. The feedback switch is turned on in response to a feedback signal, thereby reducing an impedance value of the resistor.

20 Claims, 34 Drawing Sheets

DRIVER CIRCUITS FOR GALLIUM NITRIDE HALF BRIDGE POWER CONVERTERS

CROSS REFERENCE TO RELATED APPLICATIONS

This application claims priority to U.S. provisional patent application Ser. No. 63/136,547, for "GAN DRIVER CIRCUIT" filed on Jan. 12, 2021 which is hereby incorporated by reference in entirety for all purposes.

FIELD

The present disclosure relates generally to power conversion circuits, and in particular to power conversion circuits utilizing one or more GaN-based semiconductor devices.

BACKGROUND

Electronic devices such as computers, servers and televisions, among others, can employ one or more electrical power conversion circuits to convert one form of electrical energy to another. Some electrical power conversion circuits can convert a DC voltage to another DC voltage using a half bridge circuit. As many electronic devices are sensitive to size and efficiency of the power conversion circuit, new power converters utilizing half bridge circuits can provide relatively higher efficiency and lower size for the new electronic devices.

SUMMARY

In some embodiments a driver circuit is disclosed. The driver circuit includes an input for receiving an input signal, an output for transmitting a drive signal, and a first switch having a first source, a first drain and a first gate. In addition, the first gate is coupled to a circuit node, the first drain is coupled to a first voltage source and the first source is coupled to the circuit node via a capacitor. The driver circuit further includes a resistor coupled between the first gate and the circuit node, a second switch coupled between the first gate and the circuit node, a feedback signal generator circuit coupled to the second switch, and a third switch having a third source, a third drain and a third gate. In addition, the third source is coupled to the circuit node, the third gate is coupled to the feedback signal generator circuit and the third drain is coupled to the output.

In some embodiments, the driver circuit further includes a fourth switch coupled between the first source and a ground.

In some embodiments, the driver circuit further includes a fifth switch coupled between a second voltage source and the capacitor.

In some embodiments, the driver circuit further includes a sixth switch coupled between the first gate and the ground.

In some embodiments, a gate of the fourth switch is coupled to a gate of the sixth switch.

In some embodiments, the gate of the fourth switch and the gate of the sixth switch are coupled to the input.

In some embodiments, the circuit node is a first circuit node, and the first circuit node is coupled to a second circuit node, and the second circuit node is coupled to the third gate via the feedback signal generator circuit.

In some embodiments a method of operating a driver circuit is disclosed. The method includes providing a driver circuit that includes: an input node and an output node; a first switch having a first source, a first drain and a first gate, where the first gate is coupled to a first node, the first drain is coupled to a first voltage source and the first source is coupled to a second node, the second node coupled to a third node via a capacitor; a resistor coupled between the third node and the first node; a second switch coupled between the third node and the first node; a feedback signal generator circuit coupled to the second switch; a third switch having a third source, a third drain and a third gate, where the third source is coupled to the third node, the third gate is coupled to the feedback signal generator circuit and the third drain is coupled to the output node. The method further includes receiving an input signal at the input node, and generating an output signal at the output node in response to receiving the input signal at the input node. In addition, the driver circuit operates in at least three states: in a first state the capacitor is coupled between a second voltage source having a second voltage and a ground causing the capacitor to charge to the second voltage; in a second state a charge on the capacitor causes the first switch to transition to an on state; and in a third state the feedback signal generator circuit turns on the third switch, thereby connecting the third node to the output node. In some embodiments, the driver circuit may further include a fourth switch coupled between the second node and the ground. In some embodiments, the driver circuit may further include a fifth switch coupled between the third node and the second voltage source. In some embodiments, in the first state the fourth switch is in an on state, the first switch is on an off state, and the fifth switch is in an on state such that the capacitor is coupled between the second voltage source and the ground causing the capacitor to charge to the second voltage. In some embodiments, in the second state the fourth and fifth switches transition to an off state, such that a charge on the capacitor causes the first switch to transition to an on state. In some embodiments, in the second state a value of a voltage at the first node increases. In some embodiments, a transitioning of the first switch to an on state causes the second node to follow the first node, thereby causing a value of a voltage at the second node to increase. In some embodiments, an increase of the value of the voltage at the second node causes an increase of a voltage value at the third node.

In some embodiments, a driver circuit including an input for receiving an input signal, an output for transmitting a drive signal, and a first switch having a first source, a first drain and a first gate is disclosed. In addition, the first gate is coupled to a circuit node, the first drain is coupled to a first voltage source and the first source is coupled to the circuit node via a capacitor. The driver circuit further includes a resistor coupled between the first gate and the circuit node, a pass gate switch control circuit, and a second switch having a second source, a second drain and a second gate. In addition, the second source is coupled to the circuit node, the second gate is coupled to the pass gate switch control circuit and the second drain is coupled to the output.

In some embodiments, the driver circuit further includes a third switch coupled between the first source and a ground.

In some embodiments, the driver circuit further includes a fourth switch coupled between a second voltage source and the capacitor.

In some embodiments, the driver circuit further includes a fifth switch coupled between the first gate and the ground.

In some embodiments, a gate of the third switch is coupled to a gate of the fifth switch.

DETAILED DESCRIPTION

Circuits and related techniques disclosed herein relate generally to power converters. More specifically, circuits, devices and related techniques disclosed herein relate to power conversion circuits employing half bridge circuits. In some embodiments, the half bridge circuits can utilize one or more gallium nitride (GaN) devices. By utilizing GaN devices, embodiments of the present disclosure can enable the power converter to operate at relatively higher frequencies with relatively higher efficiencies than traditional silicon-based circuits. A bootstrap circuit can be used in the half bridge circuit where an N-channel FET (field-effect-transistor) is utilized as the high side switch in the half bridge circuit.

Embodiments of the present disclosure include integrated driver circuits for bootstrap transistors which may also be commonly referred to as bootFETs. In various embodiments, the disclosed driver circuits can operate with relatively faster response times and increased efficiency as compared to traditional bootFET driver circuits. In one embodiment a bootFET driver circuit can include a pass gate, a first charge pump circuit and second charge pump circuit that are connected via a resistor, where a feedback FET is connected in parallel with the resistor. When activated, the feedback FET can short out the resistor, resulting in an increased speed of charging of internal nodes of the driver circuit, and resulting in the pass gate becoming conductive faster than if the feedback FET was not used. This can result in an output voltage of the driver circuit increasing to a specified voltage value relatively faster than if the feedback FET was not used. Various inventive embodiments are described herein, including methods, processes, systems, devices, and the like.

Figure 38:
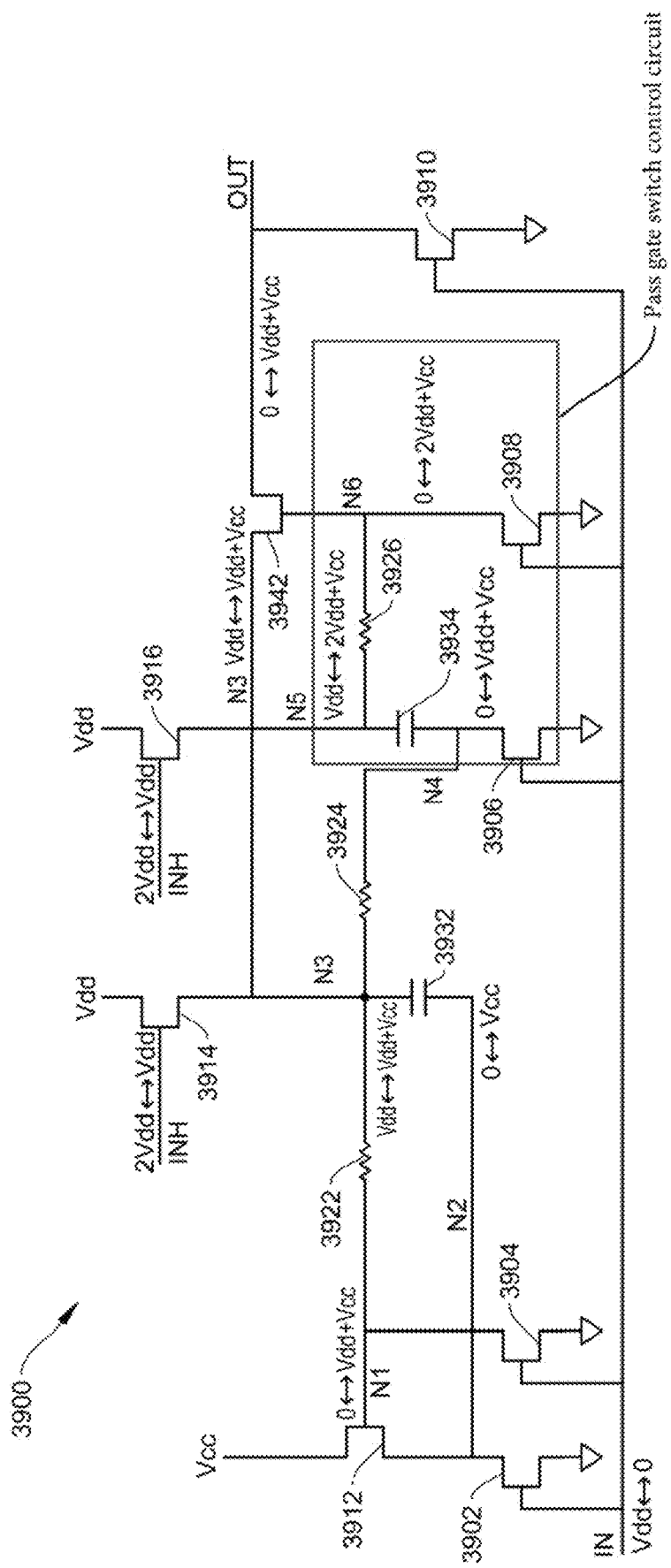
FIG. 38 is a schematic illustration of an embodiment of a driver circuit.
Figure 39:
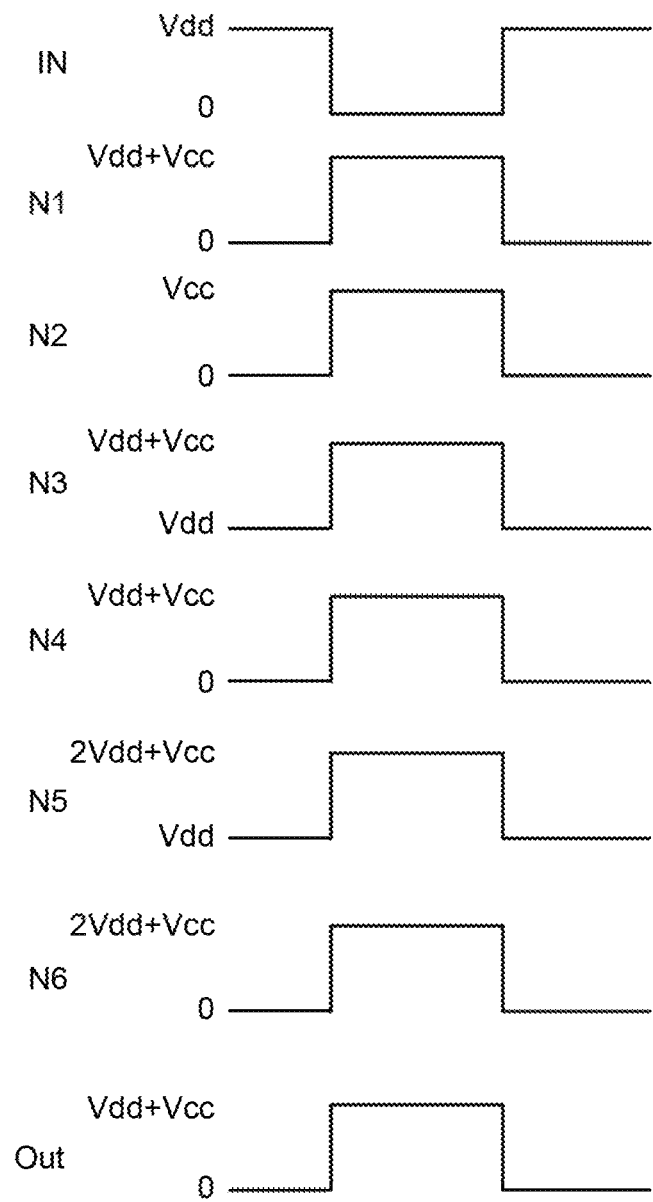
FIG. 39 is a timing diagram illustrating timing relationships between various signals of the driver circuit of FIG. 38.
Figure 40:
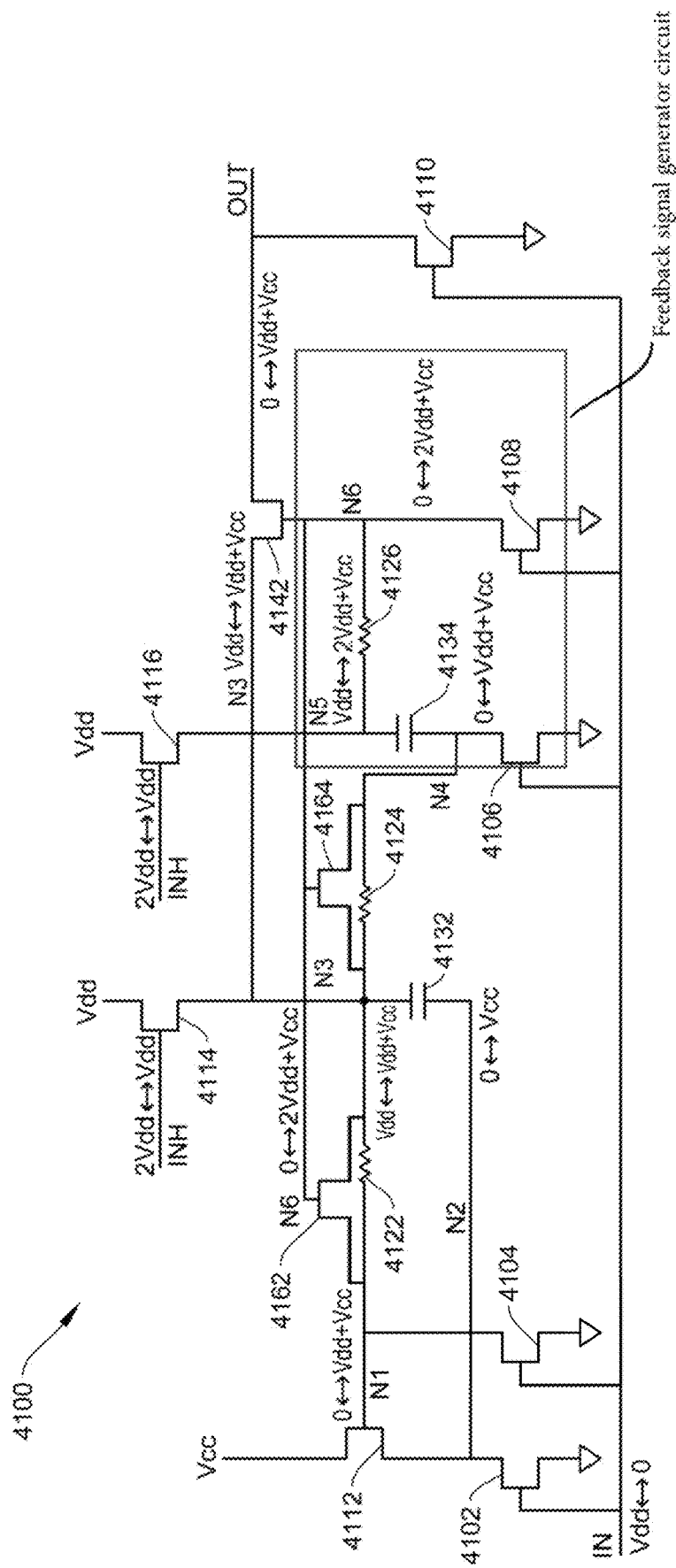
FIG. 40 is a schematic illustration of an embodiment of a driver circuit with feedback switches.
Figure 41:
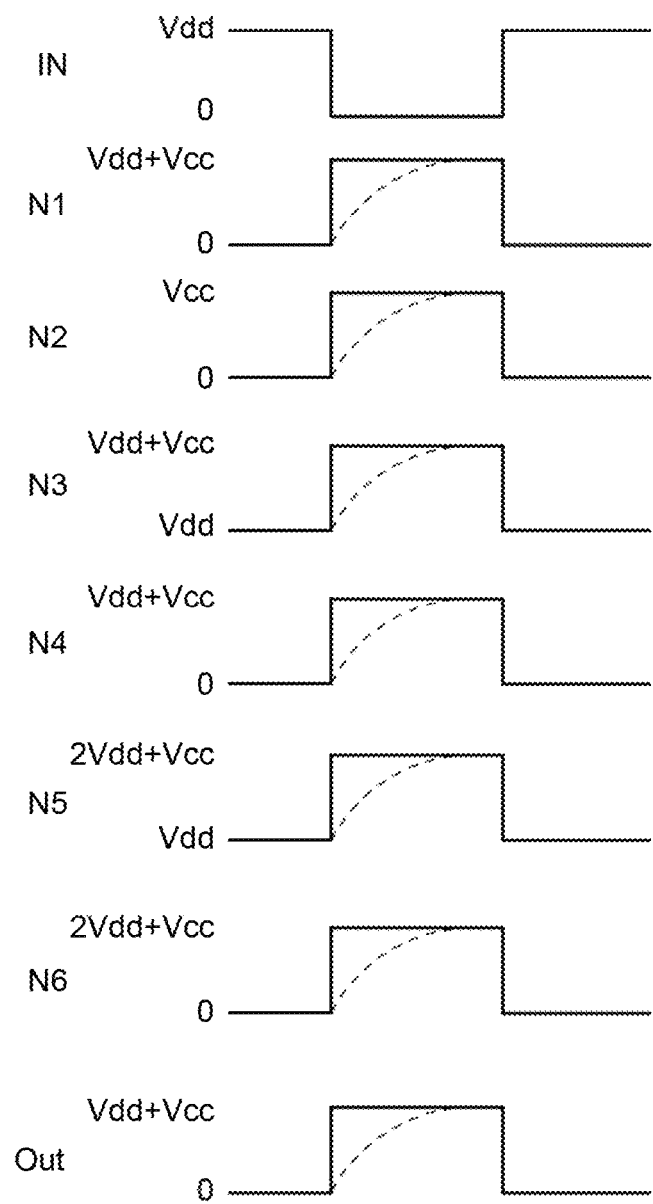
FIG. 41 is a timing diagram illustrating timing relationships between various signals of the driver circuit of FIG. 40.

In particular, FIGS. 38 and 40 illustrate examples of such improved driver circuits, with FIGS. 39 and 41 showing timing diagrams for the operation of the circuits in FIGS. 38 and 40, respectively. In some embodiments, the driver circuits can achieve a relatively fast response time by including feedback switches in the driver circuit. In various embodiments, the disclosed driver circuits can be used for driving a gate of a MOSFET which may form a portion of a bootstrap circuit. Embodiments of the present disclosure can further include integrated level shift circuits, integrated bootstrap capacitor charging circuits, integrated driver circuits, and integrated startup circuits, among other suitable circuits.

Half Bridge Circuit #1

Figure 1:
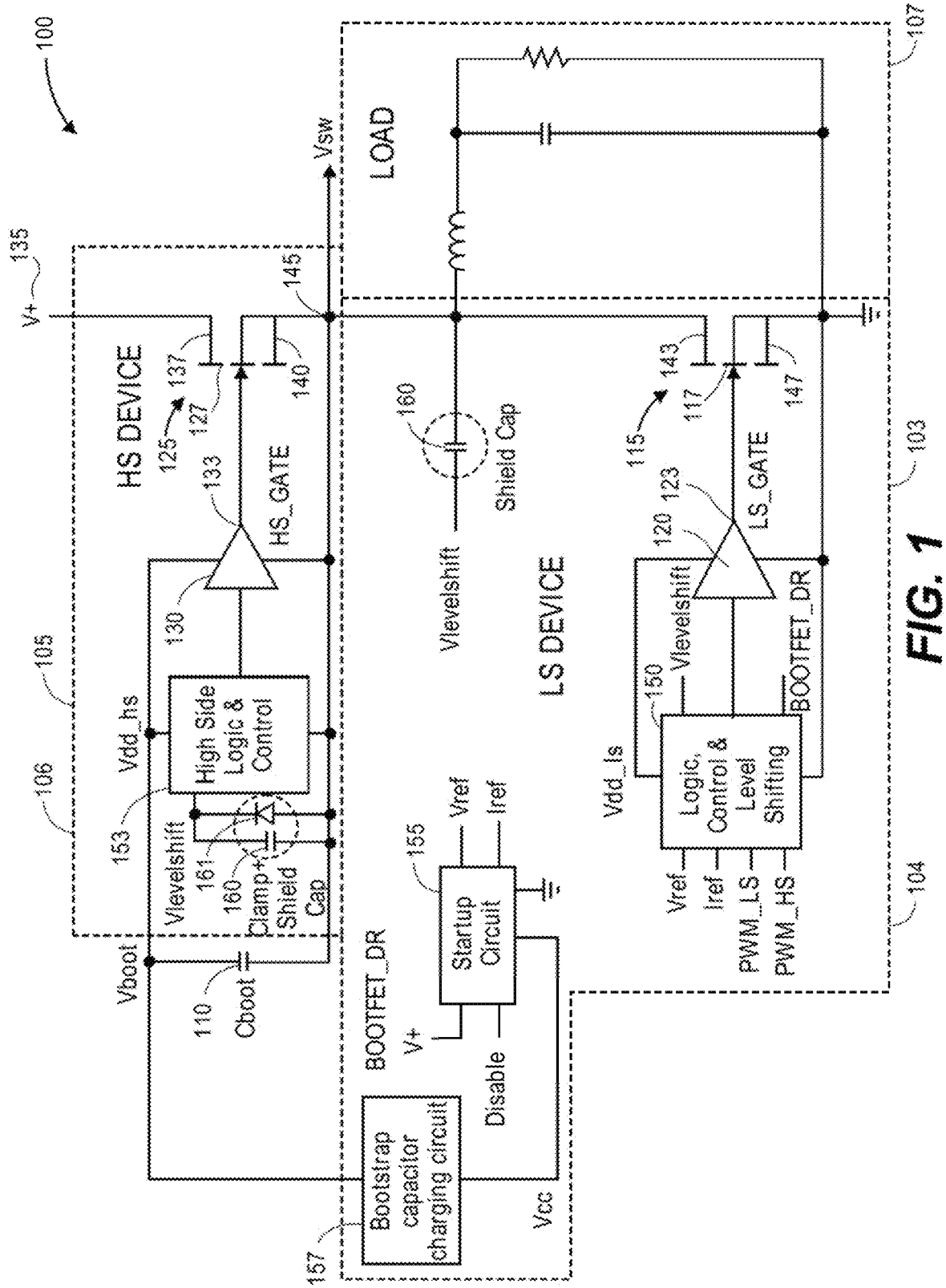
FIG. 1 is a simplified schematic of a half bridge power conversion circuit according to an embodiment of the disclosure.

Now referring to FIG. 1, in some embodiments, circuit 100 may include a pair of complementary power transistors (also referred to herein as switches) that are controlled by one or more control circuits configured to regulate power delivered to a load. In some embodiments a high side power transistor is disposed on a high side device along with a portion of the control circuit and a low side power transistor is disposed on a low side device along with a portion of the control circuit, as described in more detail below.

The integrated half bridge power conversion circuit 100 illustrated in FIG. 1 includes a low side GaN device 103, a high side GaN device 105 a load 107, a bootstrap capacitor 110 and other circuit elements, as illustrated and discussed in more detail below. Some embodiments may also have an external controller (not shown in FIG. 1) providing one or more inputs to circuit 100 to regulate the operation of the circuit. Circuit 100 is for illustrative purposes only and other variants and configurations are within the scope of this disclosure.

In one embodiment, low side GaN device 103 may have a GaN-based low side circuit 104 that includes a low side power transistor 115 having a low side control gate 117. Low side circuit 104 may further include an integrated low side transistor driver 120 having an output 123 connected to low side transistor control gate 117. In another embodiment high, side GaN device 105 may have a GaN-based high side circuit 106 that includes a high side power transistor 125 having a high side control gate 127. High side circuit 106 may further include an integrated high side transistor driver 130 having an output 133 connected to high side transistor control gate 127.

A voltage source 135 (also known as a rail voltage) may be connected to a drain 137 of high side transistor 125, and the high side transistor may be used to control power input into power conversion circuit 100. High side transistor 125 may further have a source 140 that is coupled to a drain 143 of low side transistor 115, forming a switch node 145. Low side transistor 115 may have a source 147 connected to ground. In one embodiment, low side transistor 115 and high side transistor 125 may be GaN-based enhancement-mode field effect transistors. In other embodiments low side transistor 115 and high side transistor 125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 105 and low side device 103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN. In further embodiments, GaN-based low side circuit 104 and GaN-based high side circuit 106 may be disposed on a monolithic GaN-based device. In other embodiments GaN-based low side circuit 104 may be disposed on a first GaN-based device and GaN-based high side circuit 106 may be disposed on a second GaN-based device. In yet further embodiments, GaN-based low side circuit 104 and GaN-based high side circuit 106 may be disposed on more than two GaN-based devices. In one embodiment, GaN-based low side circuit 104 and GaN-based high side circuit 106 may contain any number of active or passive circuit elements arranged in any configuration.

Low Side Device

Low side device 103 may include numerous circuits used for the control and operation of the low side device and high side device 105. In some embodiments, low side device 103 may include logic, control and level shift circuits (low side control circuit) 150 that controls the switching of low side transistor 115 and high side transistor 125 along with other functions, as discussed in more detail below. Low side device 103 may also include a startup circuit 155, a bootstrap capacitor charging circuit 157 and a shield capacitor 160, as also discussed in more detail below.

Figure 2:
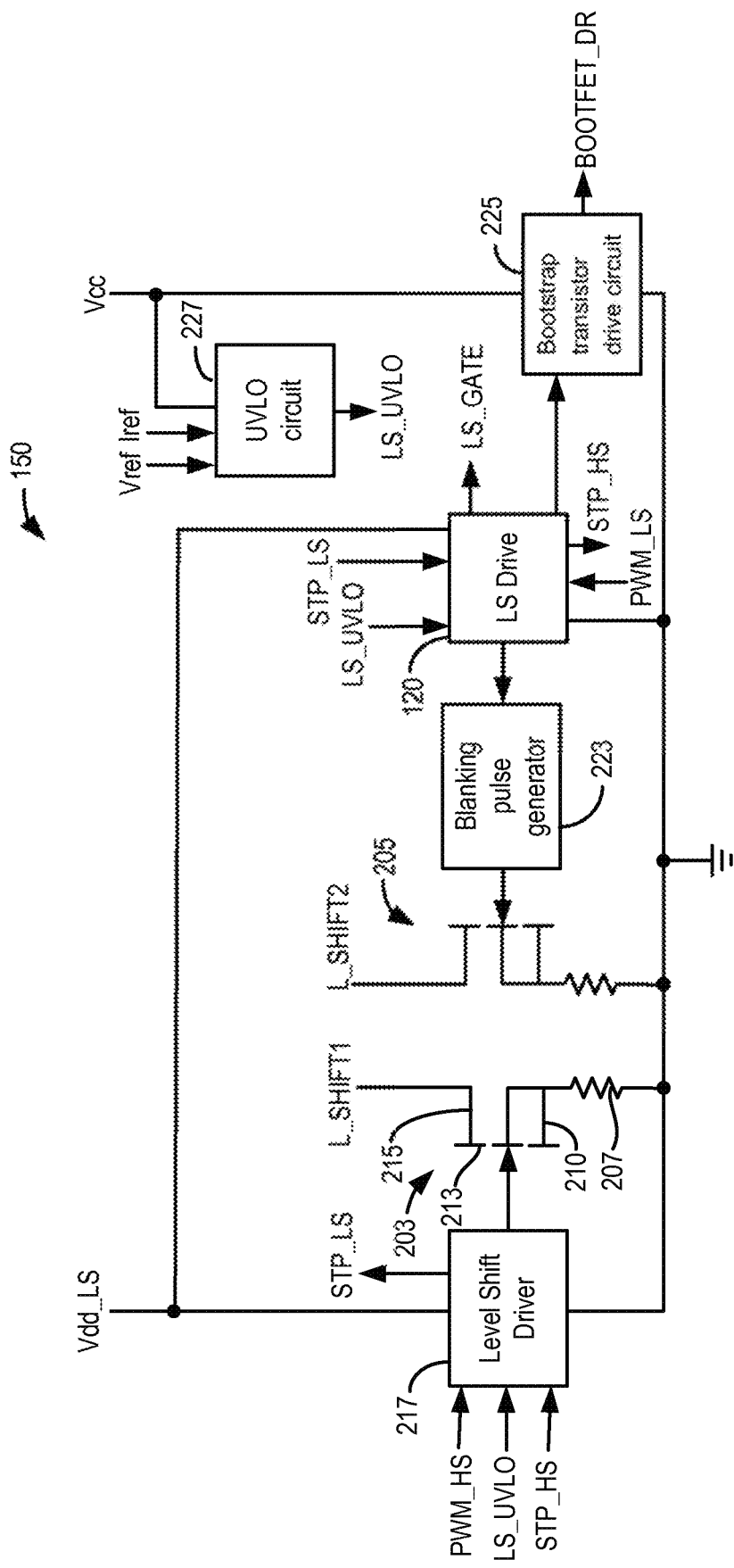
FIG. 2 is a simplified schematic of the circuits within the low side control circuit illustrated in FIG. 1.

Now referring to FIG. 2, the circuits within low side control circuit 150 are functionally illustrated. Each circuit within low side control circuit 150 is discussed below, and in some cases is shown in more detail in FIGS. 3-14. In one embodiment the primary function of low side control circuit 150 may be to receive one or more input signals, such as a PWM signal from a controller, and control the operation of low side transistor 115, and high side transistor 125.

In one embodiment, first and a second level shift transistors 203, 205, respectively, may be employed to communicate with high side logic and control circuit 153 (see FIG. 1). In some embodiments, first level shift transistor 203 may be a high voltage enhancement-mode GaN transistor. In further embodiments, first level shift transistor 203 may be similar to low side transistor 115 (see FIG. 1) and high side transistor 125, except it may be much smaller in size (e.g., first level shift transistor may be tens of microns in gate width with minimum channel length).

In other embodiments first level shift transistor 203 may experience high voltage and high current at the same time (i.e. the device may operate at the high power portion of the device Safe Operating Area) for as long as high side transistor 125 (see FIG. 1) is on. Such conditions may cause relatively high power dissipation, thus some embodiments may involve design and device reliability considerations in the design of first level shift transistor 203, as discussed in more detail below. In further embodiments, a first level shift resistor 207 may be added in series with a source 210 of first level shift transistor 203 to limit gate 213 to source 210 voltage and consequently the maximum current through the first level shift transistor. Other methods may be employed to limit the current through first level shift transistor 203, and are within the scope of this disclosure. Drain 215 of first level shift transistor 203 may be coupled to high side logic and control circuit 153 (see FIG. 1), as discussed in more detail below.

In one embodiment, first level shift transistor 203 may comprise a portion of an inverter circuit having a first input and a first output and configured to receive a first input logic signal at the first input terminal and in response, provide a first inverted output logic signal at the first output terminal, as discussed in more detail below. In further embodiments the first input and the first inverted output logic signals can be referenced to different voltage potentials. In some embodiments, first level shift resistor 207 may be capable of operating with the first inverted output logic signal referenced to a voltage that is more than 13 volts higher than a reference voltage for the first input logic signal. In other embodiments it may be capable of operating with the first inverted output logic signal referenced to a voltage that is more than 20 volts higher than a reference voltage for the first input logic signal, while in other embodiments it may be between 80-400 volts higher.

In other embodiments, first level shift resistor 207 may be replaced by any form of a current sink. For example, in one embodiment, source 210 of first level shift transistor 203 may be connected to a gate to source shorted depletion-mode device. In a further embodiment, the depletion-mode device may be fabricated by replacing the enhancement-mode gate stack with a high voltage field plate metal superimposed on top of the field dielectric layers. The thickness of the field dielectric and the work function of the metal may be used to determine the pinch-off voltage of the stack.

In other embodiments first level shift resistor 207 may be replaced by a current sink. The current sink may use a reference current (Iref) that may be generated by startup circuit 155 (illustrated in FIG. 1 and discussed in more detail below). Both the depletion-mode transistor and current sink embodiments may result in a significant device area reduction compared to the resistor embodiment (i.e., because a relatively small depletion-mode transistor would suffice and Iref is already available from startup circuit 155).

Second level shift transistor 205 may be designed similar to first level shift transistor 203 (e.g., in terms of voltage capability, current handling capability, thermal resistance, etc.). Second level shift transistor 205 may also be built with either an active current sink or a resistor, similar to first level shift transistor 203. In one embodiment the primary difference with second level shift transistor 205 may be in its operation. In some embodiments the primary purpose of second level shift transistor 205 may be to prevent false triggering of high side transistor 125 (see FIG. 1) when low side transistor 115 turns off.

In one embodiment, for example, false triggering can occur in a boost operation when low side transistor 115 turn-off results in the load current flowing through high side transistor 125 while the transistor is operating in the third quadrant with its gate shorted to its source (i.e., in synchronous rectification mode). This condition may introduce a dv/dt condition at switch node (Vsw) 145 since the switch node was at a voltage close to ground when low side transistor 115 was on and then transitions to rail voltage 135 over a relatively short time period. The resultant parasitic C*dv/dt current (i.e., where C=Coss of first level shift transistor 203 plus any other capacitance to ground) can cause first level shift node 305 (see FIG. 3) to get pulled low which will then turn on high side transistor 125. In some embodiments this condition may not be desirable because there may be no dead time control, and shoot through may occur from high side transistor 125 and low side transistor 115 being in a conductive state simultaneously.

Figure 3:
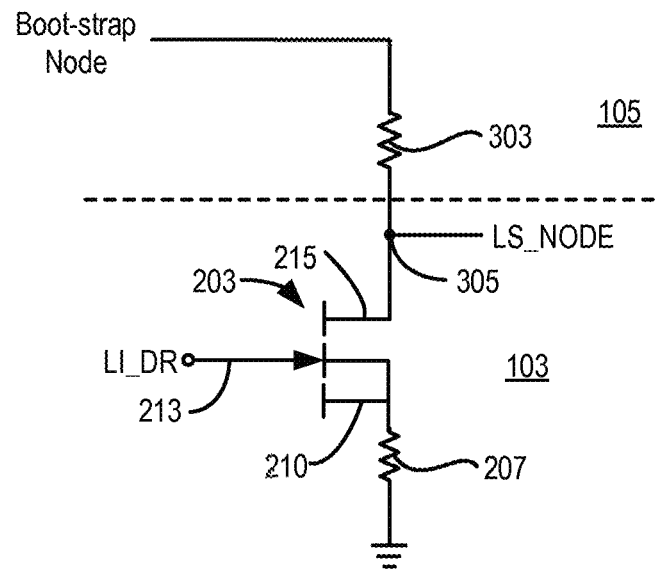
FIG. 3 is a schematic of the first level shift transistor illustrated in FIG. 1.

FIG. 3 illustrates one embodiment showing how first level shift transistor 203 may be electrically coupled to high side device 105. First level shift transistor 203, located on low side device 103, is illustrated along with a pull up resistor 303 that may be located on high side device 105 (see FIG. 1). In some embodiments, first level shift transistor 203 may operate as a pull down transistor in a resistor pull up inverter.

In further embodiments, when level shift driver circuit 217 (see FIG. 2) supplies a high gate signal (L1_DR) to first level shift transistor 203, a first level shift node 305 gets pulled low which is inverted by high side logic and control circuit 153 (see FIG. 1). The inverted signal appears as a high state signal that turns on high side transistor 137 (see FIG. 1) which then pulls the voltage at switch node (Vsw) 145 close to rail voltage 135.

Conversely, when level shift driver circuit 217 (see FIG. 2) supplies a low gate signal to first level shift transistor 203, a first level shift node 305 gets pulled to a high logic state which is inverted by high side logic and control circuit 153 (see FIG. 1). The inverted signal appears as a low logic state signal that turns off high side transistor 125. This scheme may result in a non-inverted gate signal to high side transistor 125. In further embodiments, first level shift transistor 203 may be designed large enough to be able to pull down on first level shift node 305, but not so large that its drain to source and drain to substrate (i.e., the semiconductor substrate) capacitances induce false triggering of high side logic and control circuit 153.

In some embodiments pull up resistor 303 may instead be an enhancement-mode transistor, a depletion-mode transistor or a reference current source element. In further embodiments pull up resistor 303 may be coupled between the drain and the positive terminal of a floating supply (e.g., a bootstrap capacitor, discussed in more detail below) that is referenced to a different voltage rail than ground. In yet further embodiments there may be a first capacitance between the first output terminal (LS_NODE) 305 and switch node (Vsw) 145 (see FIG. 1) and a second capacitance between the first output terminal and ground, where the first capacitance is greater than the second capacitance. The first capacitance may be designed such that in response to a high dv/dt signal at switch node (Vsw) 145 (see FIG. 1), a large portion of the C*dv/dt current is allowed to conduct through the first capacitance ensuring that the voltage at first output terminal 305 tracks the voltage at the switch node (Vsw). In some embodiments shield capacitor 160 (see FIG. 1) may be designed to act as the first capacitor as described above. In further embodiments shield capacitor 160 (see FIG. 1) may be used to create capacitance between first output terminal 305 and switch node (Vsw) 145 (see FIG. 1) in half bridge power conversion circuit 100. In yet further embodiments, shield capacitor 160 (see FIG. 1) may also be used to minimize a capacitance between first output terminal 305 and substrate (i.e., the semiconductor substrate). More specifically, in some embodiments shield capacitor 160 may be created by adding a conductive shield layer to the device and coupling the layer to switch node (Vsw) 145. This structure may effectively create two capacitors. One capacitor is coupled between output terminal 305 and switch node (Vsw) 145, and the other is coupled between the switch node and the substrate. The capacitance between output terminal 305 and the substrate is thereby practically eliminated. In further embodiments shield capacitor 160 (see FIG. 1) may be constructed on the low side chip 103.

Logic, control and level shifting circuit 150 (see FIG. 2) may have other functions and circuits such as, but not limited to, a level shift driver circuit 217, a low side transistor drive circuit 120, a blanking pulse generator 223, a bootstrap transistor drive circuit 225 and an under voltage lock out (in) circuit 227, as explained in separate figures with more detail below.

Figure 4:
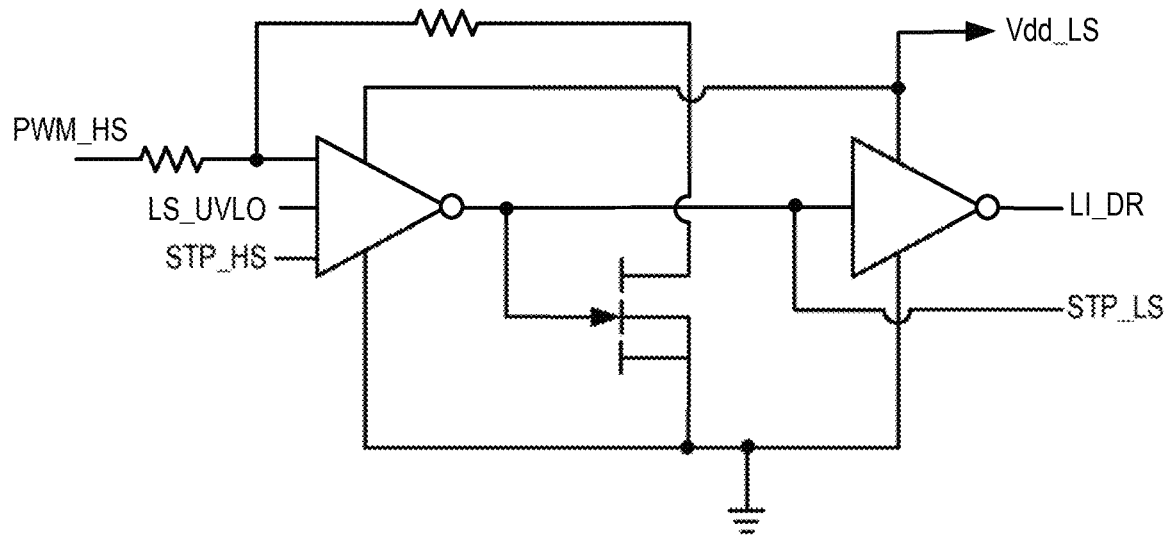
FIG. 4 is a schematic of the level shift driver circuit illustrated in FIG. 1.

Now referring to FIG. 4, level shift driver circuit 217 is shown in greater detail. In one embodiment level shift driver circuit 217 may include a first inverter 405 and a second inverter 410 in a sequential chain. In further embodiments, since level shift driver circuit 217 may be driving a small gate width first level shift transistor 203, there may be no need for a buffer stage.

In one embodiment, level shift driver circuit 217 is driven directly by the pulse-width modulated high side signal (PWM_HS) from the controller (not shown). In some embodiments the (PWM_HS) signal may be supplied by an external control circuit. In one embodiment the external control circuit may be an external controller that is in the same package with high side device 105, low side device 103, both devices, or packaged on its own. In further embodiments, level shift driver circuit 217 may also include logic that controls when the level shift driver circuit communicates with first level shift transistor 203 (see FIG. 3). In one embodiment an optional low side under voltage lock out signal (LS_UVLO) may be generated by an under voltage lock out circuit within level shift driver circuit 217. The low side under voltage lock out circuit can be used to turn off level shift driver circuit 217 if either Vcc or Vdd for the low side (Vdd_LS) go below a certain reference voltage, or a fraction of the reference voltage.

In further embodiments level shift driver circuit 217 may generate a shoot through protection signal for the low side transistor (STP_LS) that is used to prevent shoot through arising from overlapping gate signals on low side transistor 115 and high side transistor 125. The function of the (STP_LS) signal may be to ensure that low side driver circuit 120 (see FIG. 2) only communicates with the gate terminal of the low side transistor 115 when the gate signal to high side transistor 125 is low. In other embodiments, the output of first inverter 405 may be used to generate the shoot through protection signal (STP_LS) for the low side transistor 115.

In further embodiments, logic for UVLO and shoot-through protection may implemented by adding a multiple input NAND gate to first inverter 405, where the inputs to the NAND gate are the (PWM_HS), (LS_UVLO) and (STP_HS) signals. In yet further embodiments, first inverter 405 may only respond to the (PWM_HS) signal if both (STP_HS) and (LS_UVLO) signals are high. In further embodiments, the STP_HS signal may be generated from the low side gate driver block 120, as explained in separate figures with more detail.

Figure 5:
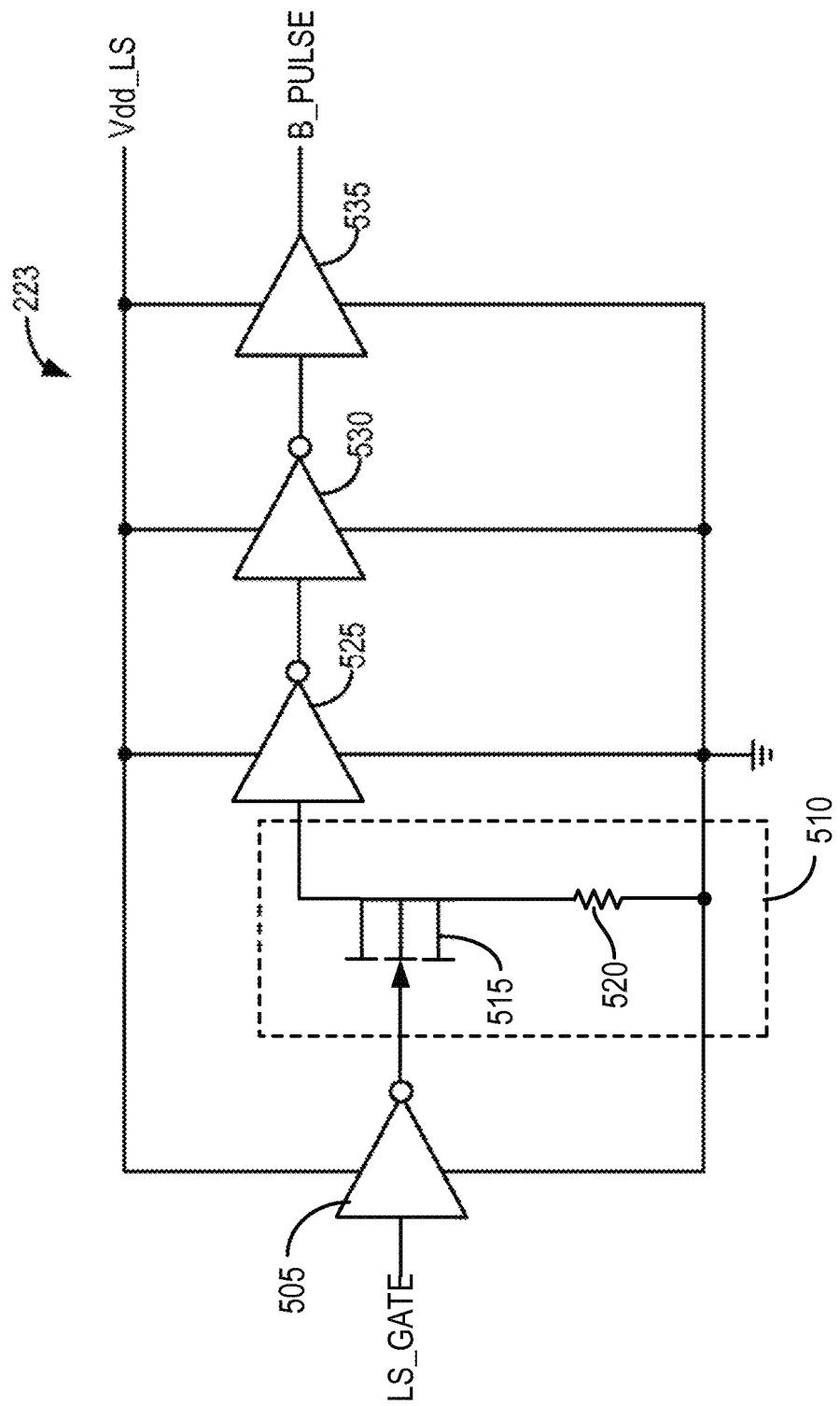
FIG. 5 is a schematic of the blanking pulse generator circuit illustrated in FIG. 1.

Now referring to FIG. 5, blanking pulse generator 223 may be used to generate a pulse signal that corresponds to the turn-off transient of low side transistor 115. This pulse signal may then turn on second level shift transistor 205 for the duration of the pulse, which triggers a control circuit on high side device 105 (see FIG. 1) to prevent false pull down of first level shift node 305 voltage.

FIG. 5 illustrates a schematic of one embodiment of blanking pulse generator 223. In some embodiments a low side transistor 115 gate signal (LS_GATE) is fed as an input to blanking pulse generator 223. The (LS_GATE) signal is inverted by a first stage inverter 505, then sent through an RC pulse generator 510 to generate a positive pulse. In some embodiments an inverted signal may be needed because the pulse corresponds to the falling edge of the (LS_GATE) signal. A capacitor 515 in RC pulse generator 510 circuit may be used as a high pass filter allowing the dv/dt at its input to appear across resistor 520. Once the dv/dt vanishes at the input to the RC pulse generator 510, capacitor 515 may charge slowly through resistor 520, resulting in a slow decaying voltage waveform across the resistor. The pulse may then be sent through a second inverter 525, a third inverter 530 and a buffer 535 to generate a square wave pulse for the blanking pulse (B_PULSE) signal. The duration of the pulse may be determined by the value of capacitor 515 and resistor 520 in RC pulse generator 510. In some embodiments, capacitor 515 may be constructed using a drain to source shorted enhancement-mode GaN transistor.

Figure 6:
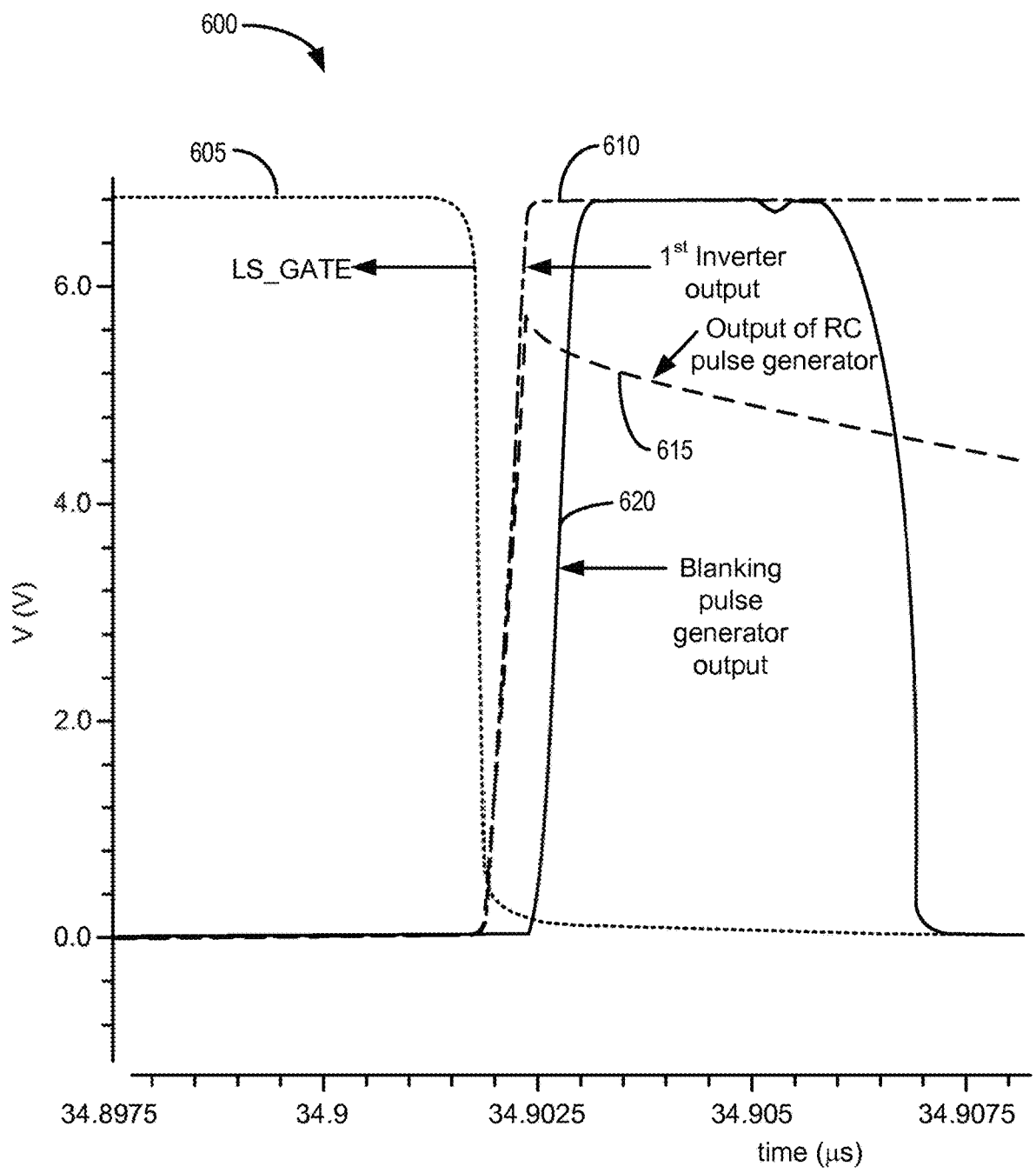
FIG. 6 is an example of waveforms within the blanking pulse generator illustrated in FIG. 5.

Now referring to FIG. 6, example waveforms 600 within blanking pulse generator 223 are illustrated for one embodiment. Trace 605 shows a falling edge of the low side gate pulse (LS_GATE). Trace 610 shows the rising edge of first stage inverter 505 output. Trace 615 shows the output of RC pulse generator 510 and trace 620 shows the resulting blanking pulse (B_PULSE) signal that is an output of blanking pulse generator 223.

Figure 7:
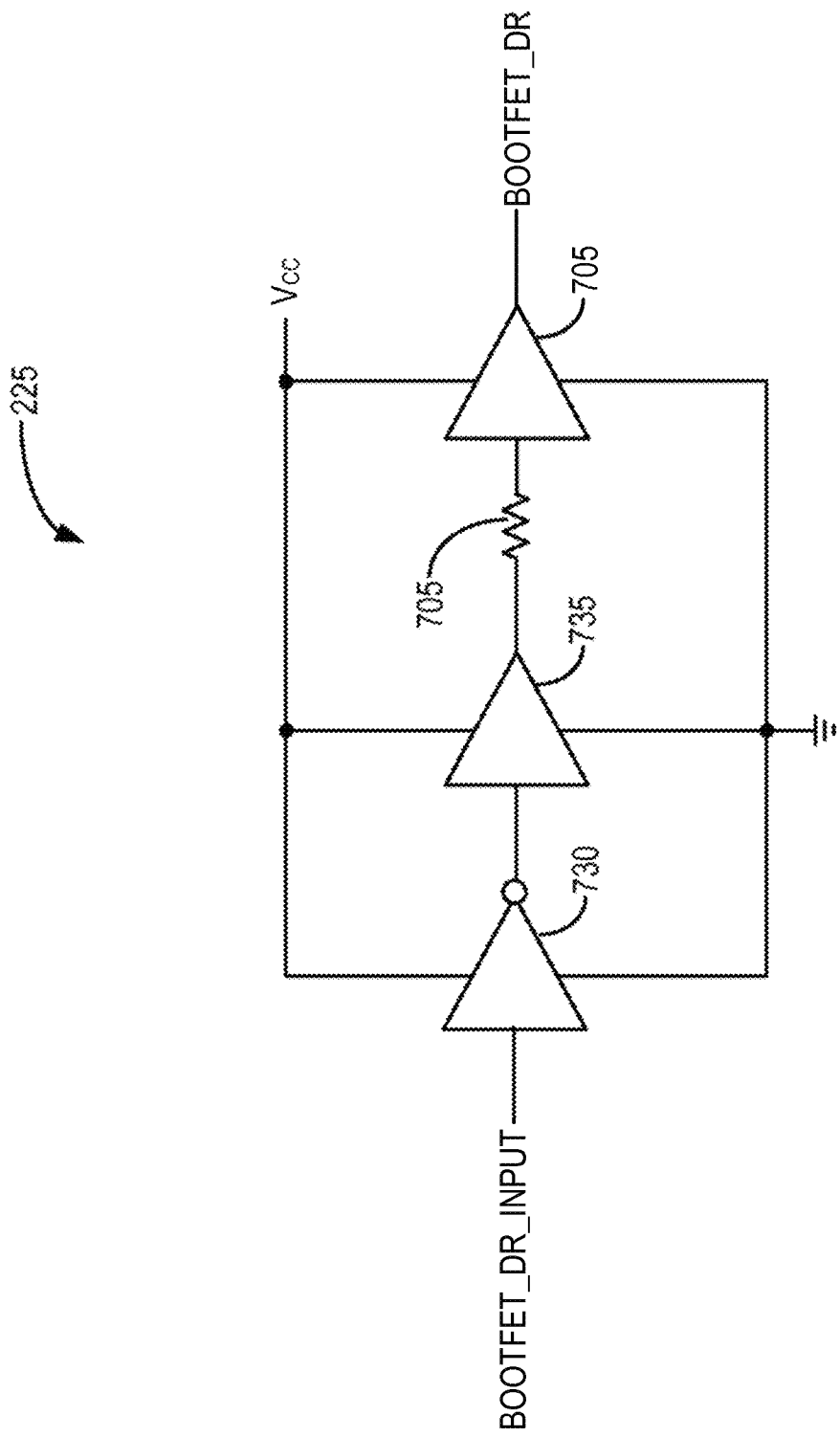
FIG. 7 is a schematic of the bootstrap transistor drive circuit illustrated in FIG. 1.

Now referring to FIG. 7, bootstrap transistor drive circuit 225 is illustrated in greater detail. Bootstrap transistor drive circuit 225 includes inverter 730, first buffer 735 and second buffer 745. Bootstrap transistor drive circuit 225 may receive the (BOOTFET_DR_IN) signal from low side driver circuit 120. The (BOOTFET_DR_IN) signal may be inverted with respect to the LS_GATE signal. Bootstrap transistor drive circuit 225 may be configured to provide a gate drive signal called (BOOTFET_DR) to a bootstrap transistor in bootstrap charging circuit 157 (see FIG. 1), discussed in more detail below. The (BOOTFET_DR) gate drive signal may be timed to turn on the bootstrap transistor when low side transistor 115 is turned on. Also, since bootstrap transistor drive circuit 225 is driven by (Vcc), the output of this circuit may have a voltage that goes from 0 volts in a low state to (Vcc)+6 volts in a high state. In one embodiment the bootstrap transistor is turned on after low side transistor 115 is turned on, and the bootstrap transistor is turned off before the low side transistor is turned off.

In some embodiments, the turn-on transient of the (BOOTFET_DR) signal may be delayed by the introduction of a series delay resistor 705 to the input of second buffer 745, that may be a gate of a transistor in a final buffer stage. In further embodiments, the turn-off transient of low side transistor 115 (see FIG. 1) may be delayed by the addition of a series resistor to a gate of a final pull down transistor in low side drive circuit 120. In one embodiment, one or more capacitors may be used in bootstrap transistor drive circuit 225, and support voltages of the order of (Vcc) which, for example, could be 20 volts, depending on the end user requirements and the design of the circuit. In some embodiments the one or more capacitors may be made with a field dielectric to GaN capacitor instead of a drain to source shorted enhancement-mode transistor.

Figure 8:
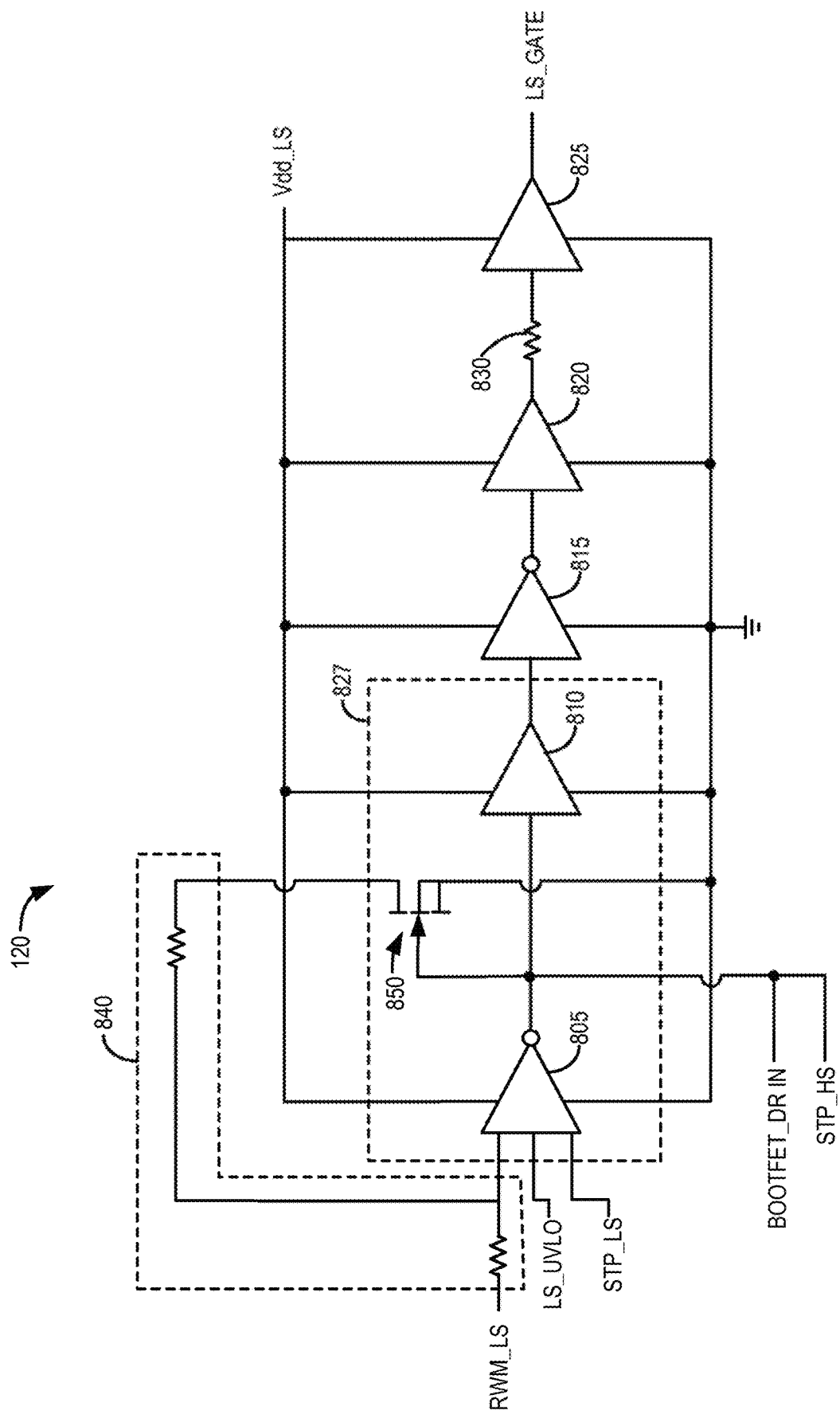
FIG. 8 is a block diagram for the low side transistor drive circuit illustrated in FIG. 1

Now referring to FIG. 8 a block diagram for low side transistor drive circuit 120 is illustrated. Low side transistor drive circuit 120 may have a first inverter 805, a buffer 810, a second inverter 815, a second buffer 820 and a third buffer 825. Third buffer 825 may provide the (LS_GATE) signal to low side transistor 115 (see FIG. 1). In some embodiments two inverter/buffer stages may be used because the input to the gate of low side transistor 115 (see FIG. 1) may be synchronous with (Vin). Thus, (Vin) in a high state may correspond to (Vgate) of low side transistor 115 in a high state and vice versa.

In further embodiments, certain portions of low side drive circuit 120 may have an asymmetric hysteresis. Some embodiments may include asymmetric hysteresis using a resistor divider 840 with a transistor pull down 850.

Further embodiments may have multiple input NAND gates for the (STP_LS) signal (shoot through protection on low side transistor 115). In one embodiment, low side drive circuit 120 may receive the shoot through protection signal (STP_LS) from level shift driver circuit 217. The purpose of the (STP_LS) signal may be similar to the (STP_HS) signal described previously. The (STP_LS) signal may ensure that low side transistor drive circuit 120 does not communicate with gate 117 (see FIG. 1) of low side transistor 115 when level shift driver circuit 217 output is at a high state. In other embodiments, the output of the first inverter stage 805 may be used as the (STP_HS) signal for level shift drive circuit 217 and the (BOOTFET_DR_IN) signal for bootstrap transistor drive circuit 225.

In some embodiments, low side transistor drive circuit 120 may employ multiple input NAND gates for the (LS_UVLO) signal received from UVLO circuit 227 (see FIG. 2). Further embodiments may employ a turn-off delay resistor that may be in series with a gate of a final pull down transistor in final buffer stage 825. The delay resistor may be used in some embodiments to make sure the bootstrap transistor is turned off before low side transistor 115 turns off.

Figure 9:
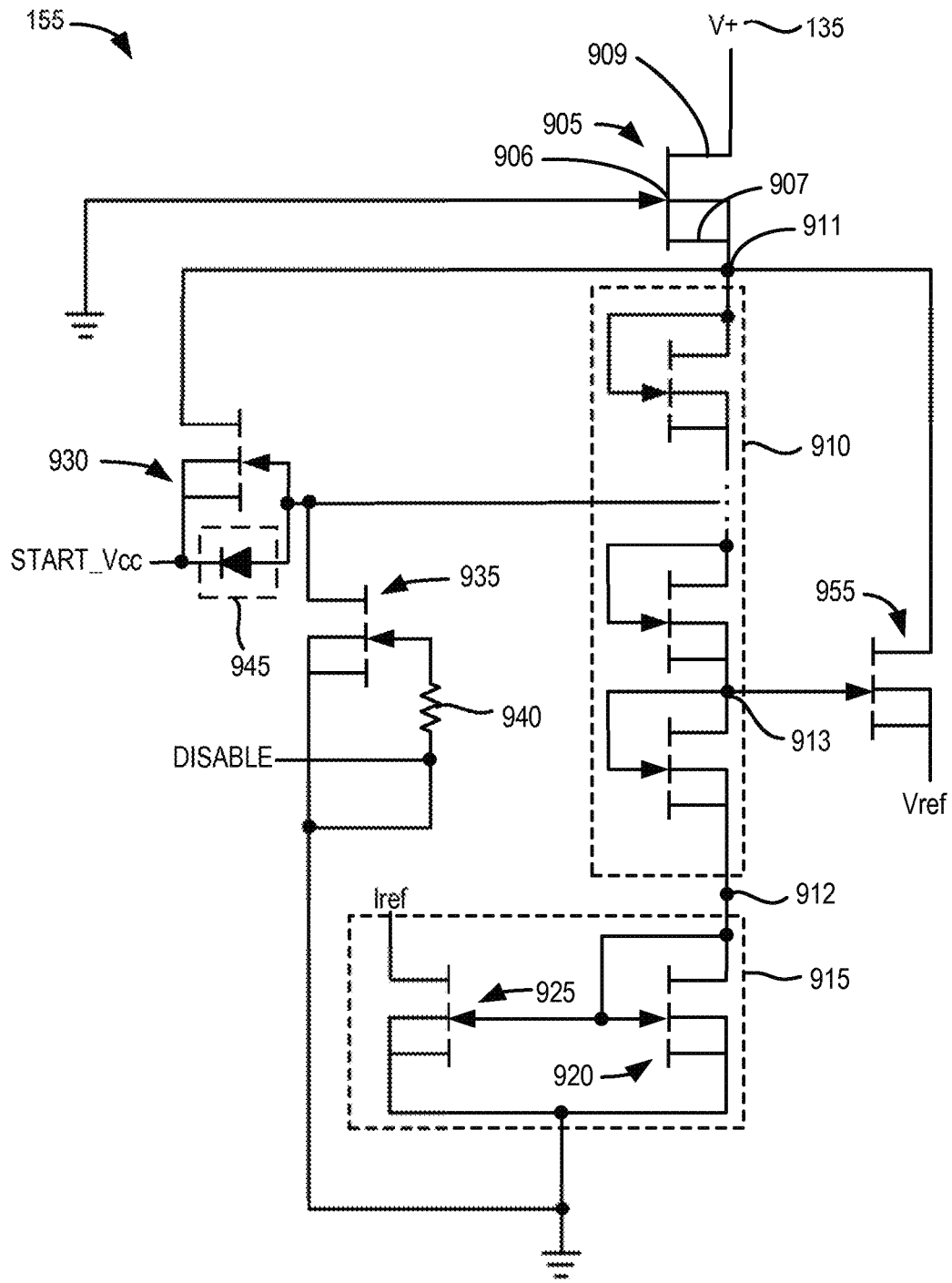
FIG. 9 is a schematic of the startup circuit illustrated in FIG. 1.

Now referring to FIG. 9, startup circuit 155 is illustrated in greater detail. Startup circuit 155 may be designed to have a multitude of functionalities as discussed in more detail below. Primarily, startup circuit 155 may be used to provide an internal voltage (in this case START_Vcc) and provide enough current to support the circuits that are being driven by (Vcc). This voltage may remain on to support the circuits until (Vcc) is charged up to the required voltage externally from rail voltage 135 (V+). Startup circuit 155 may also provide a reference voltage (Vref) that may be independent of the startup voltage, and a reference current sink (Iref).

In one embodiment, a depletion-mode transistor 905 may act as the primary current source in the circuit. In further embodiments depletion-mode transistor 905 may be formed by a metal layer disposed over a passivation layer. In some embodiments, depletion-mode transistor 905 may use a high voltage field plate (typically intrinsic to any high-voltage GaN technology) as the gate metal. In further embodiments a field dielectric may act as the gate insulator. The resultant gated transistor may be a depletion-mode device with a high channel pinch-off voltage (Vpinch) (i.e., pinch-off voltage is proportional to the field dielectric thickness). Depletion-mode transistor 905 may be designed to block relatively high voltages between its drain (connected to V+) and its source. Such a connection may be known as a source follower connection. Depletion-mode transistor 905 may have a gate 906 coupled to ground, a source 907 coupled to a first node 911 and a drain 909 coupled to voltage source 135.

In further embodiments a series of identical diode connected enhancement-mode low-voltage transistors 910 may be in series with depletion-mode transistor 905. Series of identical diode connected enhancement-mode low-voltage transistors 910 may be connected in series between a first node 911 and a second node 912. One or more intermediate nodes 913 may be disposed between each of series of identical diode connected enhancement-mode low-voltage transistors 910. The width to length ratio of the transistors may set the current drawn from (V+) as well as the voltage across each diode. To remove threshold voltage and process variation sensitivity, series of identical diode connected enhancement-mode low-voltage transistors 910 may be designed as large channel length devices. In some embodiments, series of identical diode connected enhancement-mode low-voltage transistors 910 may be replaced with one or more high value resistors.

In further embodiments, at the bottom end of series of identical diode connected enhancement-mode low-voltage transistors 910, a current mirror 915 may be constructed from two enhancement-mode low-voltage transistors and used to generate a reference current sink (Iref). First current mirror transistor 920 may be diode connected and second current mirror transistor 925 may have a gate connected to the gate of the first current mirror transistor. The sources of first and second current mirror transistors 920, 925, respectively may be coupled and tied to ground. A drain terminal of first current mirror transistor 920 may be coupled to second junction 912 and a source terminal of second current mirror transistor 925 may be used as a current sink terminal. This stack of current mirror 915 and series of identical diode connected enhancement-mode low-voltage transistors 910 may form what is known as a "source follower load" to depletion-mode transistor 905.

In other embodiments, when gate 906 of depletion-mode transistor 905 is tied to ground, source 907 of the depletion-mode transistor may assume a voltage close to (Vpinch) when current is supplied to the "source follower load". At the same time the voltage drop across diode connected transistor 920 in current mirror 915 may be close to the threshold voltage of the transistor (Vth). This condition implies that the voltage drop across each of series of identical diode connected enhancement-mode low-voltage transistors 910 may be equal to (Vpinch−Vth)/n where 'n' is the number of diode connected enhancement-mode transistors between current mirror 915 and depletion-mode transistor 905.

For example, if the gate of a startup transistor 930 is connected to the third identical diode connected enhancement-mode low-voltage transistor from the bottom, the gate voltage of the startup transistor may be 3*(Vpinch−Vth)/n+Vth. Therefore, the startup voltage may be 3*(Vpinch−Vth)/n+Vth−Vth=3*(Vpinch−Vth)/n. As a more specific example, in one embodiment where (Vpinch)=40 volts, (Vth)=2 volts where n=6 and (Vstartup)=19 volts.

In other embodiments, startup circuit 155 may generate a reference voltage signal (Vref). In one embodiment, the circuit that generates (Vref) may be similar to the startup voltage generation circuit discussed above. A reference voltage transistor 955 may be connected between two transistors in series of identical diode connected enhancement-mode low-voltage transistors 910. In one embodiment (Vref)=(Vpinch−Vth)/n.

Figure 10:
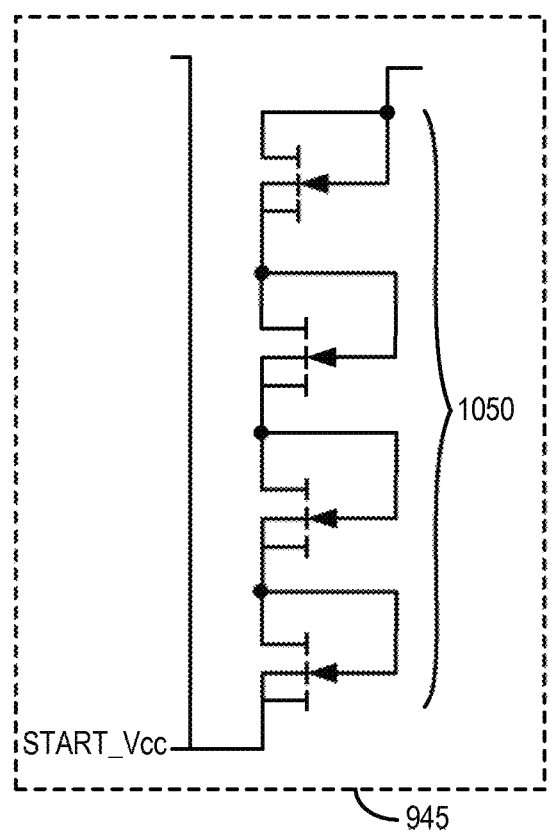
FIG. 10 is series of diode connected GaN-based enhancement-mode transistors that may be used as a diode clamp in the schematic of FIG. 9.

In further embodiments, a disable pull down transistor 935 may be connected across the gate to source of startup transistor 930. When the disable signal is high, startup transistor 930 will be disabled. A pull down resistor 940 may be connected to the gate of disable transistor 935 to prevent false turn-on of the disable transistor. In other embodiments a diode clamp 945 may be connected between the gate and the source terminals of startup transistor 930 to ensure that the gate to source voltage capabilities of the startup transistor are not violated during circuit operation (i.e., configured as gate overvoltage protection devices). In some embodiments, diode clamp 945 may be made with a series of diode connected GaN-based enhancement-mode transistors 1050, as illustrated in FIG. 10.

Figure 11:
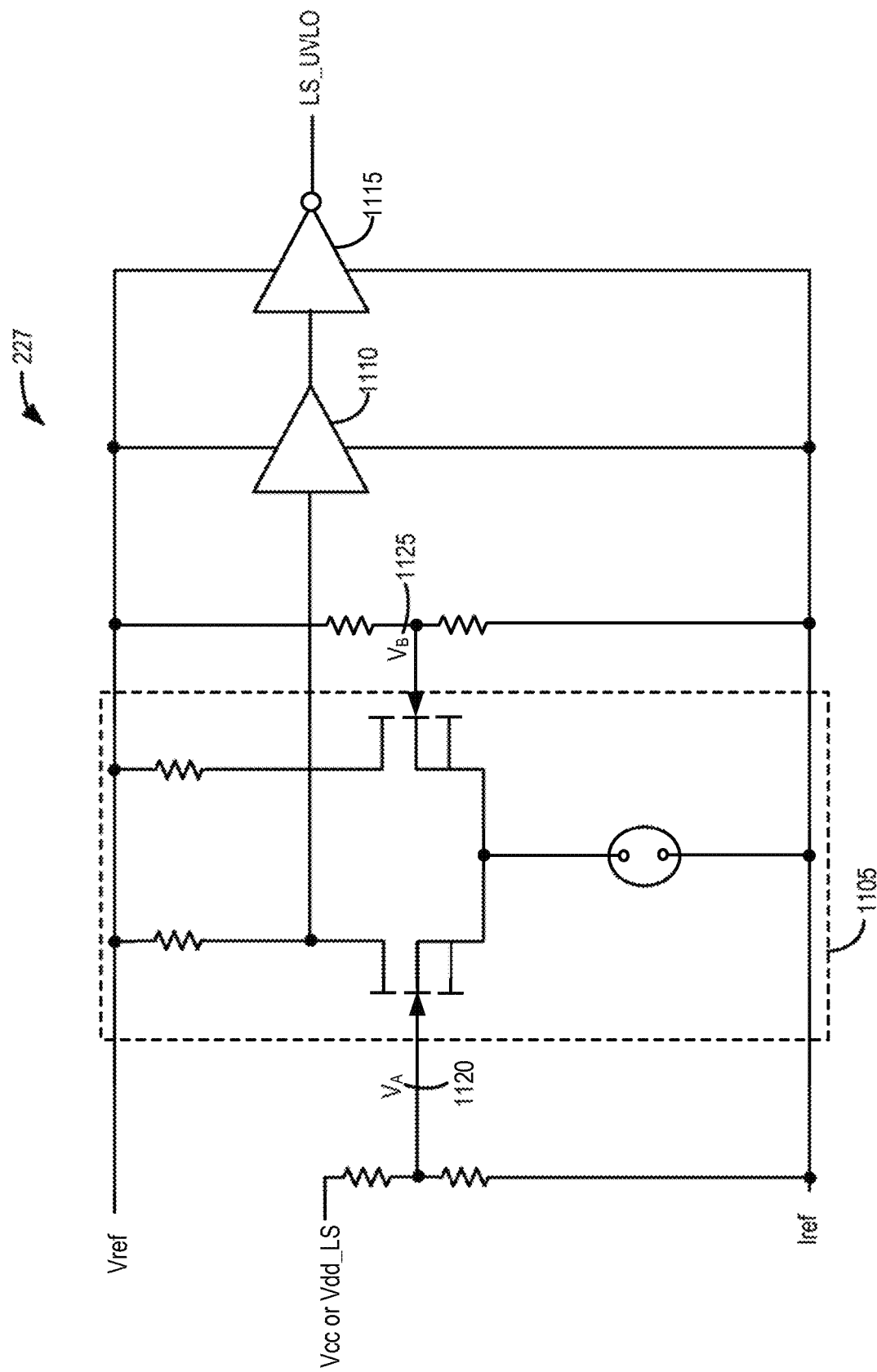
FIG. 11 is a schematic of the UVLO circuit illustrated in FIG. 1.

Now referring to FIG. 11, UVLO circuit 227 is illustrated in greater detail. In some embodiments, UVLO circuit 227 may have a differential comparator 1105, a down level shifter 1110 and an inverter 1115. In further embodiments, UVLO circuit 227 may use (Vref) and (Iref) generated by startup circuit 155 (see FIG. 9) in a differential comparator/down level shifter circuit to generate the (LS_UVLO) signal that feeds into level shift driver circuit 217 (see FIG. 2) and low side transistor driver circuit 120. In some embodiments UVLO circuit 227 can also be designed to have asymmetric hysteresis. In further embodiments the output of UVLO circuit 227 may be independent of threshold voltage. This may be accomplished by choosing a differential comparator with a relatively high gain. In one embodiment the gain can be increased by increasing the value of the current source and the pull up resistors in the differential comparator. In some embodiments the limit on the current and resistor may be set by (Vref).

In other embodiments voltages (VA) and (VB), 1120 and 1125, respectively, may be proportional to (Vcc) or (Vdd_LS) and (Vref) as dictated by the resistor divider ratio on each input. When (VA) 1120>(VB) 1125 the output of the inverting terminal goes to a low state. In one specific embodiment, the low state=(Vth) since the current source creates a source follower configuration. Similarly when (VA) 1120<(VB) 1125 the output goes to a high state (Vref). In some embodiments down level shifter 1110 may be needed because the low voltage needs to be shifted down by one threshold voltage to ensure that the low input to the next stage is below (Vth). The down shifted output may be inverted by a simple resistor pull up inverter 1115. The output of inverter 1115 is the (LS_UVLO) signal.

Figure 12:
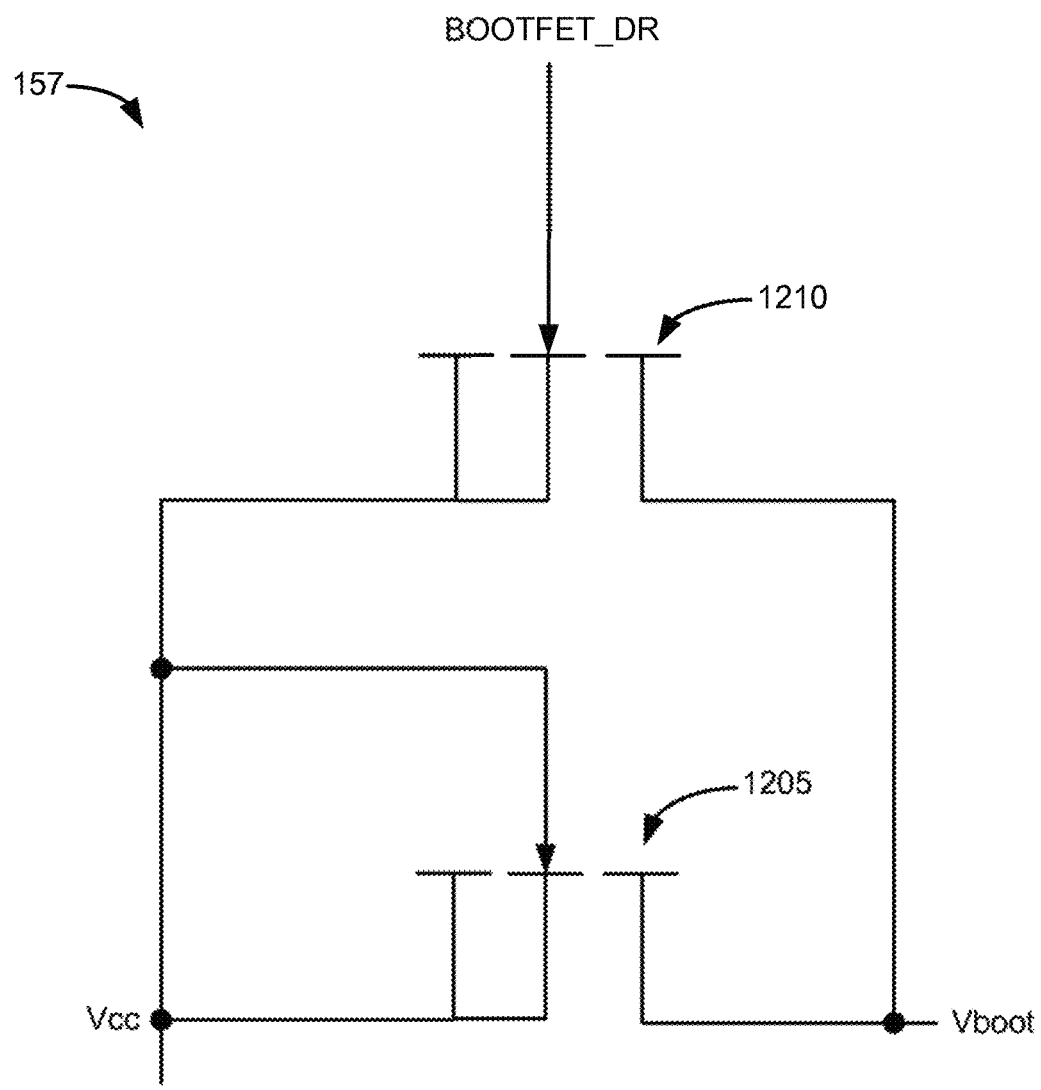
FIG. 12 is a schematic of the bootstrap capacitor charging circuit illustrated in FIG. 1.

Now referring to FIG. 12, bootstrap capacitor charging circuit 157 is illustrated in greater detail. In one embodiment, bootstrap diode and transistor circuit 157 may include a parallel connection of a high voltage diode connected enhancement-mode transistor 1205 and a high voltage bootstrap transistor 1210. In further embodiments, high voltage diode connected enhancement-mode transistor 1205 and high voltage bootstrap transistor 1210 can be designed to share the same drain finger. In some embodiments the (BOOTFET_DR) signal may be derived from bootstrap transistor drive circuit 225 (see FIG. 2). As discussed above, high voltage bootstrap transistor 1210 may be turned on coincident with the turn-on of low side transistor 115 (see FIG. 1).

Figure 13:
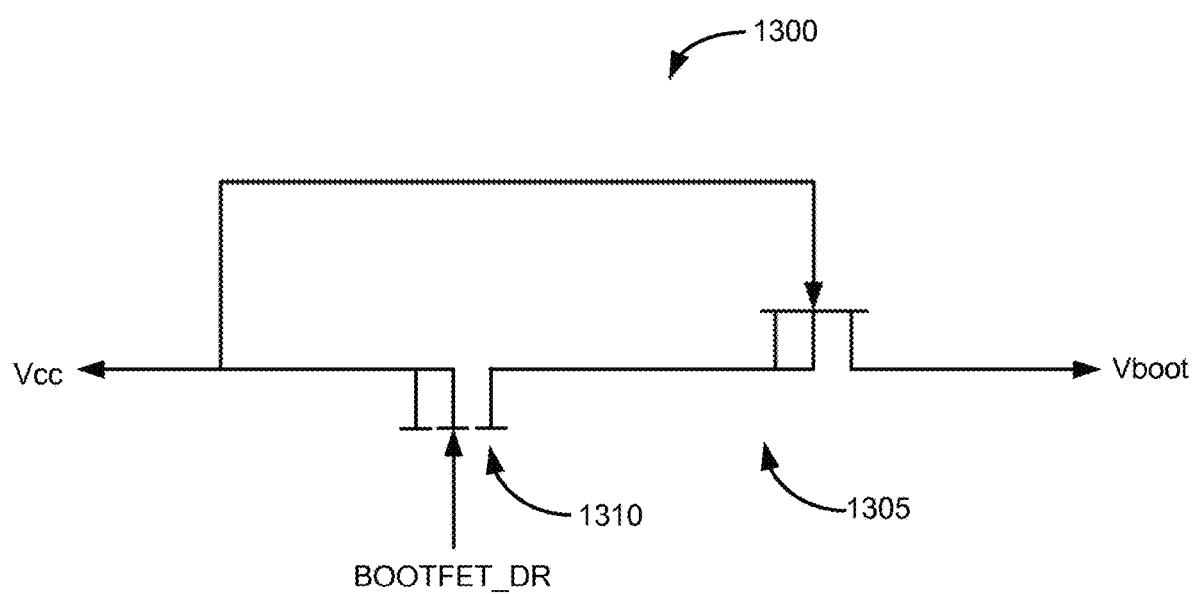
FIG. 13 is a schematic of an alternative bootstrap capacitor charging circuit as compared to the circuit illustrated in FIG. 12.

Now referring to FIG. 13, an alternative bootstrap diode and transistor circuit 1300 may be used in place of bootstrap diode and transistor circuit 157 discussed above in FIG. 12. In the embodiment illustrated in FIG. 13, a depletion-mode device 1305 cascoded by an enhancement-mode low voltage GaN device 1310 may be connected as illustrated in schematic 1300. In another embodiment, a gate of depletion-mode device 1305 can be connected to ground to reduce the voltage stress on cascoded enhancement-mode device 1310, depending upon the pinch-off voltage of the depletion-mode device.

High Side Device

Figure 14:
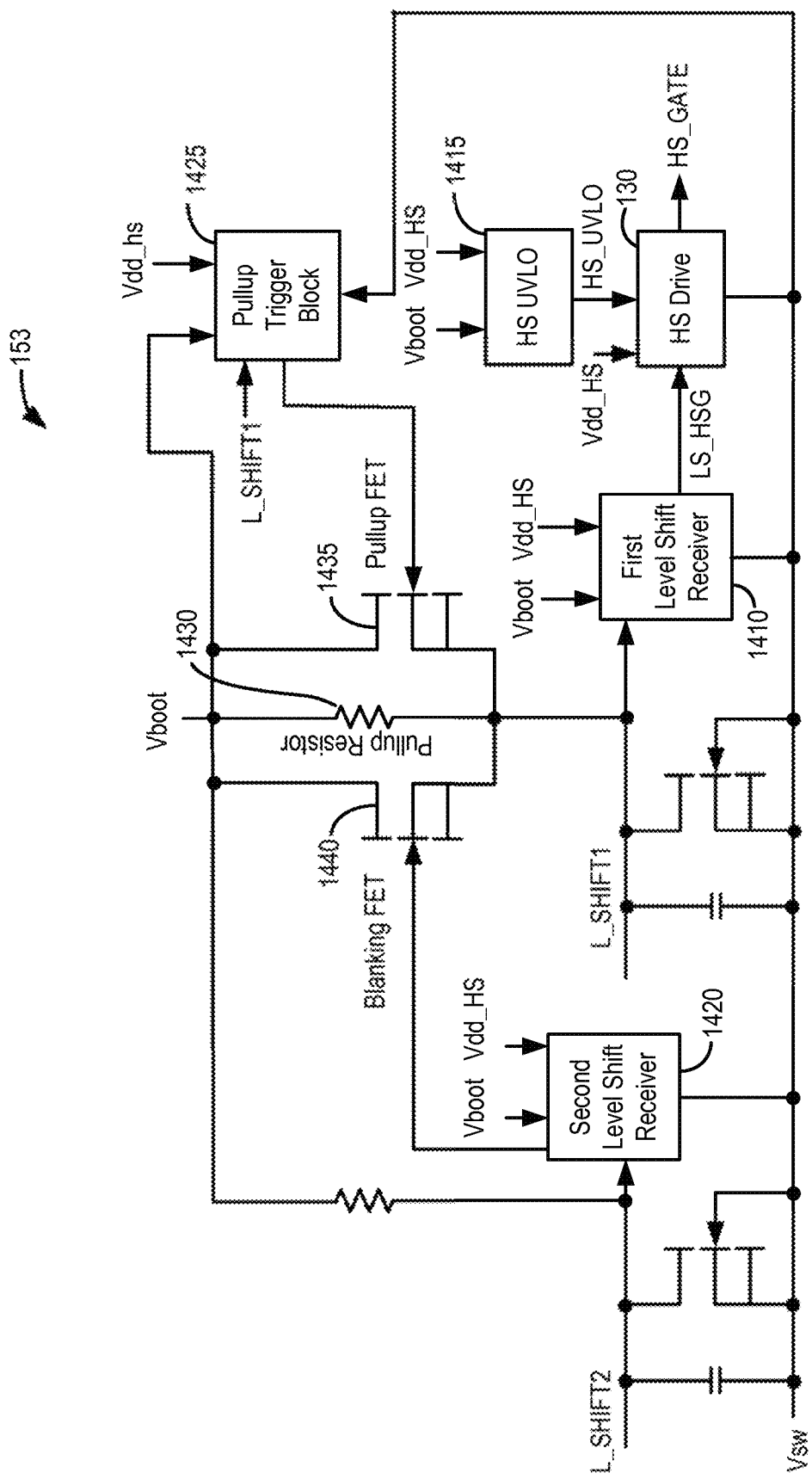
FIG. 14 is a schematic of the high side logic and control circuit illustrated in FIG. 1.

Now referring to FIG. 14, an embodiment of high side logic and control circuit 153 is illustrated in detail. In one embodiment, high side driver 130 receives inputs from first level shift receiver 1410 and high side UVLO circuit 1415 and sends a (HS_GATE) signal to high side transistor 125 (see FIG. 1). In yet further embodiments, a pull up trigger circuit 1425 is configured to receive the (LSHIFT_1) signal and control pull up transistor 1435. In some embodiments, second level shift receiver circuit 1420 is configured to control blanking transistor 1440. Both the pull up transistor 1435 and blanking transistor 1440 may be connected in parallel with pull up resistor 1430. Each circuit within high side logic and control circuit 153 is discussed below, and in some cases is shown in more detail in FIGS. 16-20.

Figure 15:
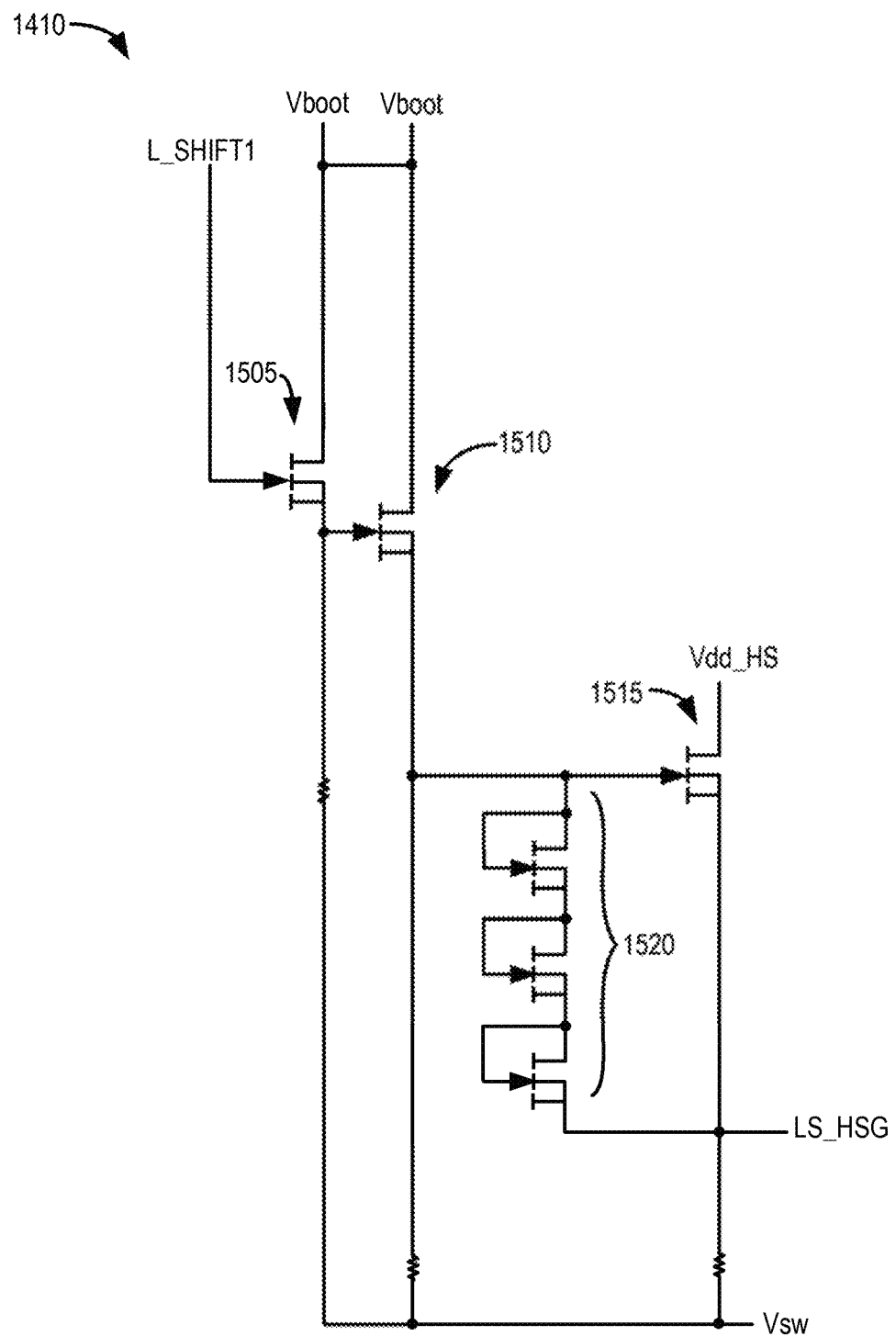
FIG. 15 is a schematic of the first level shift receiver circuit illustrated in FIG. 14.

Now referring to FIG. 15, first level shift receiver 1410 is illustrated in greater detail. In some embodiments, first level shift receiver 1410 may convert the (L_SHIFT1) signal to an (LS_HSG) signal that can be processed by high side transistor driver 130 (see FIG. 14) to drive high side transistor 125 (see FIG. 1). In further embodiments, first level shift receiver 1410 may have three enhancement-mode transistors 1505, 1510, 1515 employed in a multiple level down shifter and a plurality of diode connected transistors 1520 acting as a diode clamp, as discussed in more detail below.

In one embodiment, first level shift receiver 1410 may down shift the (L_SHIFT1) signal by 3*Vth (e.g., each enhancement-mode transistor 1505, 1510, 1515 may have a gate to source voltage close to Vth). In some embodiments the last source follower transistor (e.g., in this case transistor 1515) may have a three diode connected transistor clamp 1520 across its gate to source. In further embodiments this arrangement may be used because its source voltage can only be as high as (Vdd_HS) (i.e., because its drain is connected to Vdd_HS) while its gate voltage can be as high as V (L_SHIFT1)−2*Vth. Thus, in some embodiments the maximum gate to source voltage on last source follower transistor 1515 may be greater than the maximum rated gate to source voltage of the device technology. The output of final source follower transistor 1515 is the input to high side transistor drive 130 (see FIG. 1), (i.e., the output is the LS_HSG signal). In further embodiments fewer or more than three source follower transistors may be used. In yet further embodiments, fewer or more than three diode connected transistors may be used in clamp 1520.

Figure 16:
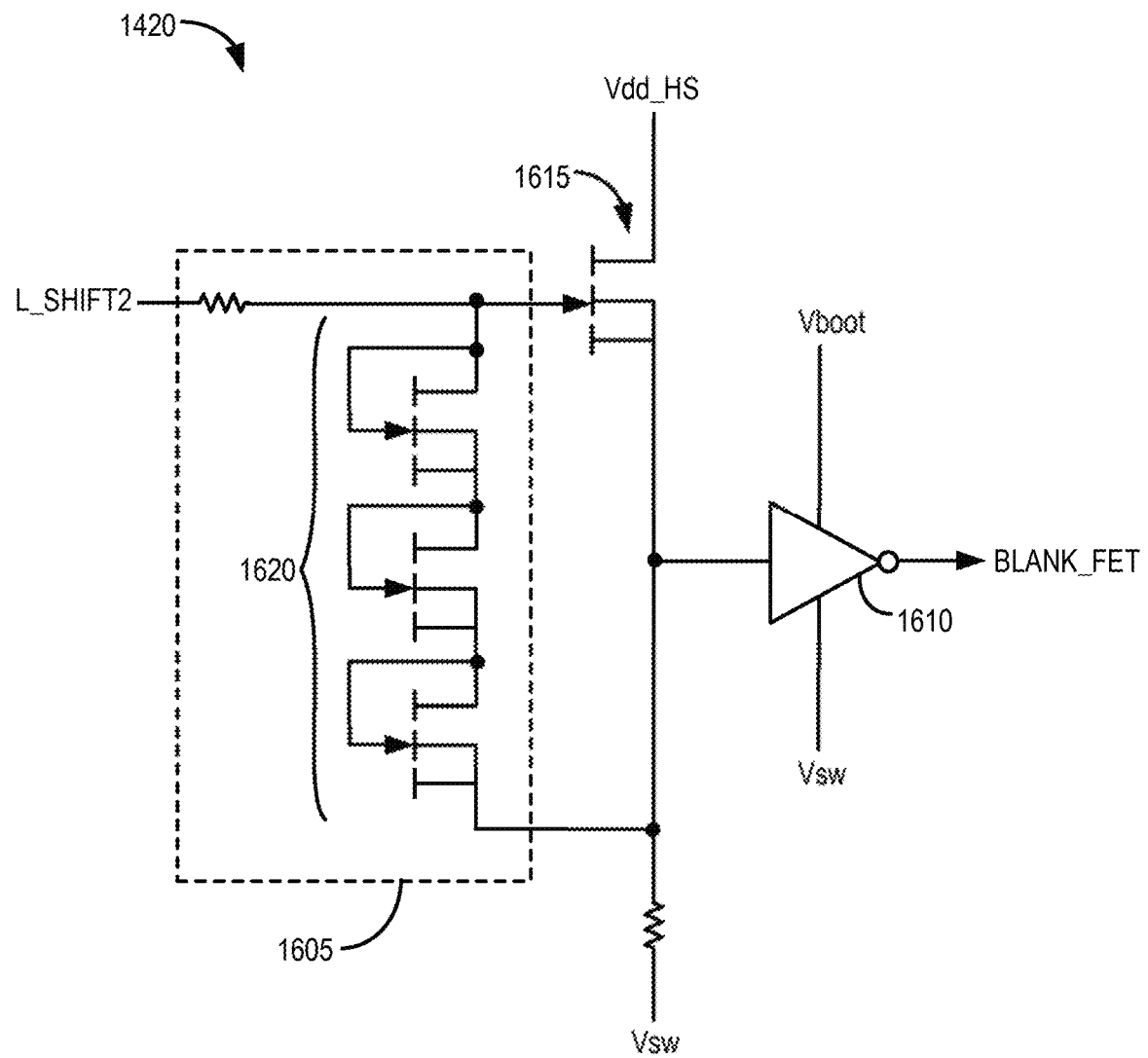
FIG. 16 is a schematic of the second level shift receiver circuit illustrated in FIG. 14.

Now referring to FIG. 16, second level shift receiver 1420 is illustrated in greater detail. In one embodiment, second level shift receiver 1420 may have a down level shift circuit 1605 and an inverter circuit 1610. In some embodiments second level shift receiver 1420 may be constructed in a similar manner as first level shift receiver 1410 (see FIG. 15), except the second level shift receiver may have only one down level shifting circuit (e.g., enhancement-mode transistor 1615) and a follow on inverter circuit 1610. In one embodiment, down level shift circuit 1605 may receive the (L_SHIFT2) signal from second level shift transistor 205 (see FIG. 2). In one embodiment, inverter circuit 1610 may be driven by the (Vboot) signal, and the gate voltage of the pull up transistor of the inverter may be used as the (BLANK_FET) signal driving blanking transistor 1440 (see FIG. 14). In some embodiments the voltage may go from 0 volts in a low state to (Vboot+0.5*(Vboot−Vth)) in a high state. Similar to first level shift receiver 1410, second level shift receiver 1420 may have a diode connected transistor clamp 1620 across the gate to source of source follower transistor 1615. In other embodiments, clamp 1620 may include fewer or more than three diode connected transistors.

Figure 17:
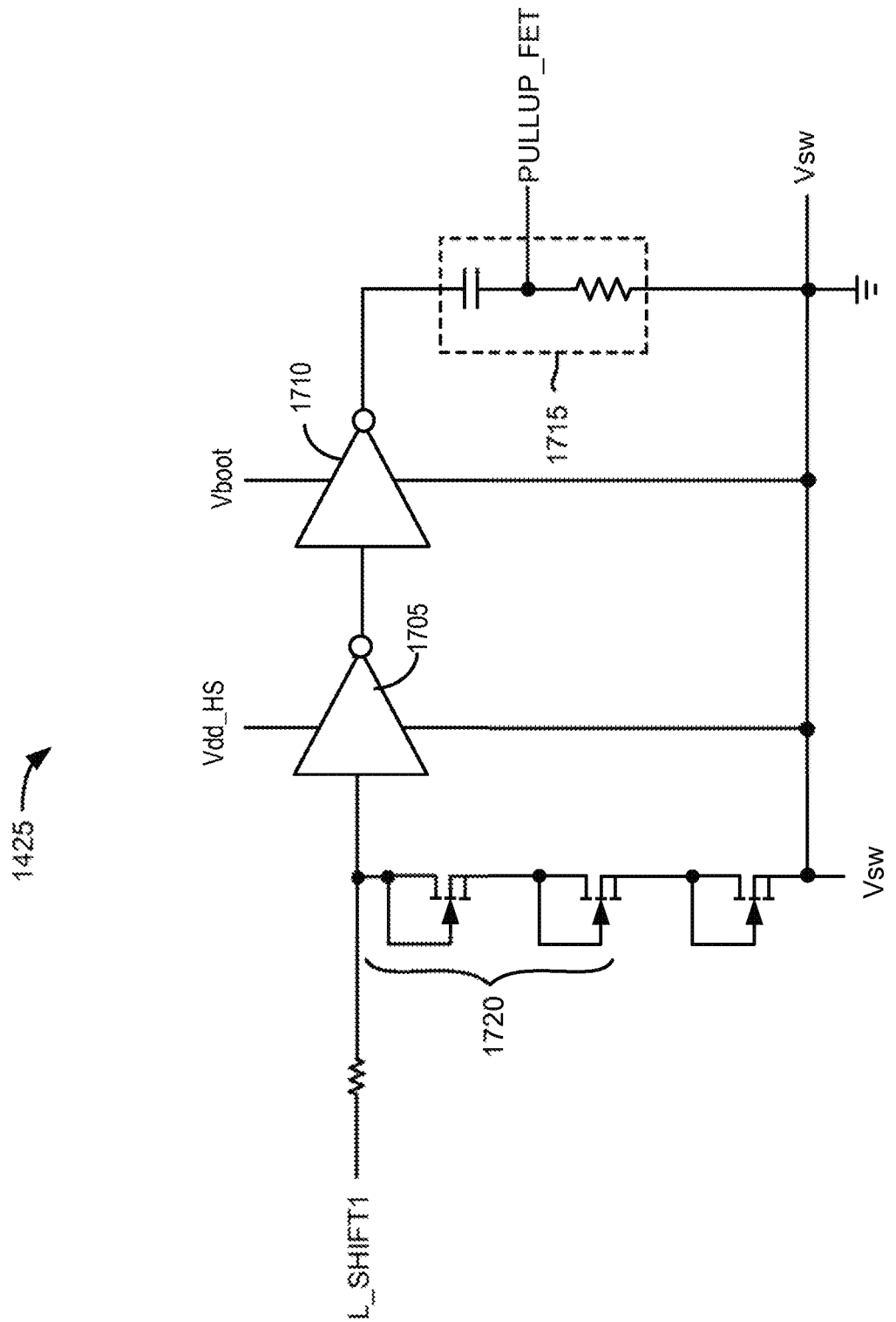
FIG. 17 is a schematic of the pull up trigger circuit illustrated in FIG. 14.

Now referring to FIG. 17, pull up trigger circuit 1425 is illustrated in greater detail. In one embodiment, pull up trigger circuit 1425 may have a first inverter 1705, a second inverter 1710, an RC pulse generator 1715 and a gate to source clamp 1720. In some embodiments pull up trigger circuit 1425 may receive the (L_SHIFT1) signal as an input, and in response, generate a pulse as soon as the (L_SHIFT1) voltage transitions to approximately the input threshold of first inverter 1705. The generated pulse may be used as the (PULLUP_FET) signal that drives pull up transistor 1435 (see FIG. 14). Second inverter 1710 may be driven by (Vboot) instead of (Vdd_HS) because pull up transistor 1435 gate voltage may need to be larger than the (L_SHIFT1) signal voltage.

Figure 18:
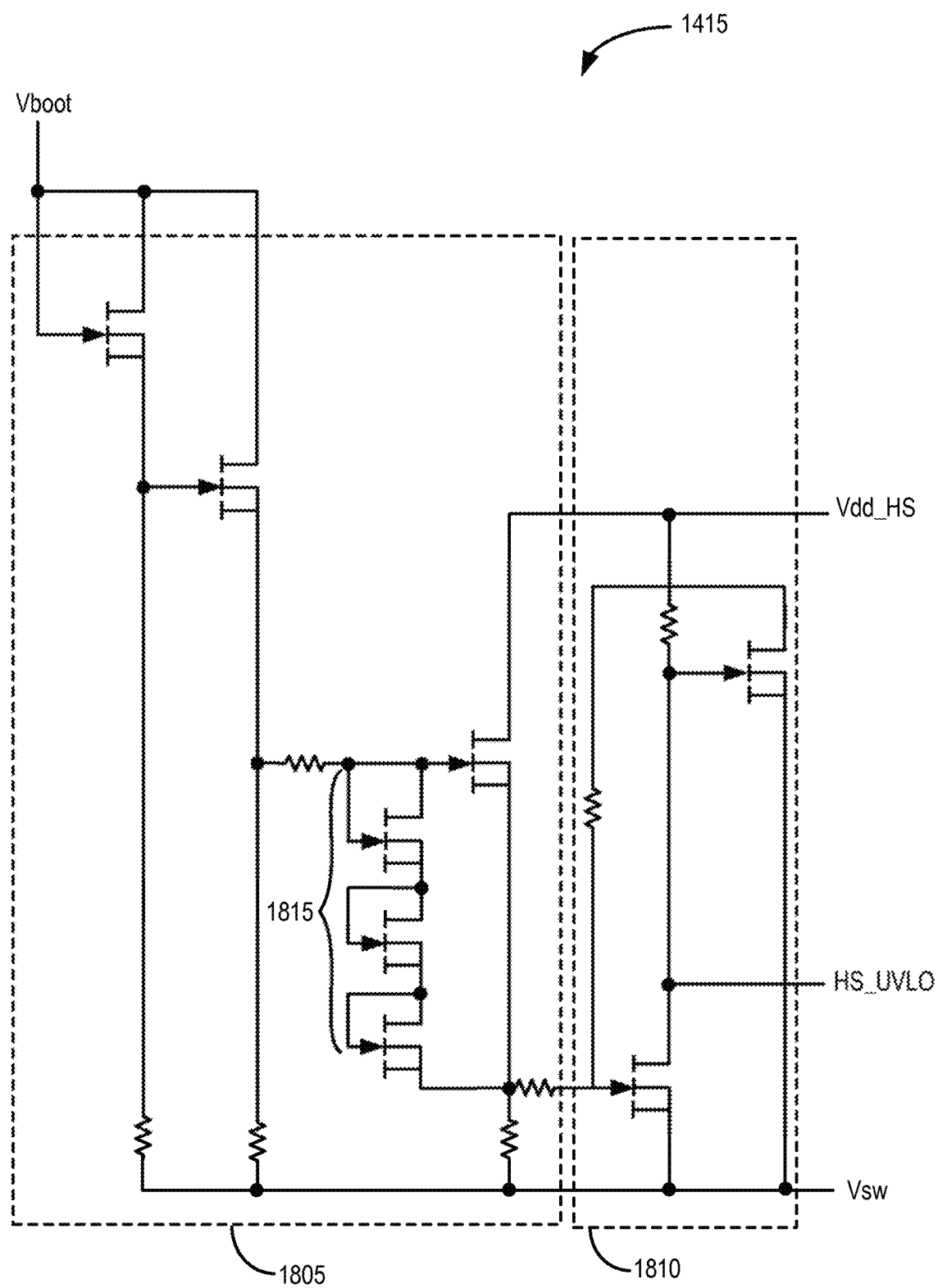
FIG. 18 is a schematic of the high side UVLO circuit illustrated in FIG. 14.

Now referring to FIG. 18, high side UVLO circuit 1415 is illustrated in greater detail. In one embodiment, high side UVLO circuit 1415 may have down level shifter 1805, a resistor pull up inverter with asymmetric hysteresis 1810 and a gate to source clamp 1815. In further embodiments, the (HS_UVLO) signal generated by high side UVLO circuit 1415 may aid in preventing circuit failure by turning off the (HS_GATE) signal generated by high side drive circuit 130 (see FIG. 14) when bootstrap capacitor 110 voltage goes below a certain threshold. In some embodiments, bootstrap capacitor 110 voltage (Vboot) (i.e., a floating power supply voltage) is measured, and in response, a logic signal is generated and combined with the output signal (LS_HSG) from first level shift receiver 1410 which is then used as the input to the high side gate drive circuit 130. More specifically, in this embodiment, for example, the UVLO circuit is designed to engage when (Vboot) reduces to less than 4*Vth above switch node (Vsw) 145 voltage. In other embodiments a different threshold level may be used.

In further embodiments, high side UVLO circuit 1415 may down shift (Vboot) in down level shifter 1805 and transfer the signal to inverter with asymmetric hysteresis 1810. The output of inverter with asymmetric hysteresis 1810 may generate the (HS_UVLO) signal which is logically combined with the output from the first level shift receiver 1410 to turn off high side transistor 125 (see FIG. 1). In some embodiments the hysteresis may be used to reduce the number of self-triggered turn-on and turn-off events of high side transistor 125 (see FIG. 1), that may be detrimental to the overall performance of half bridge circuit 100.

Figure 19:
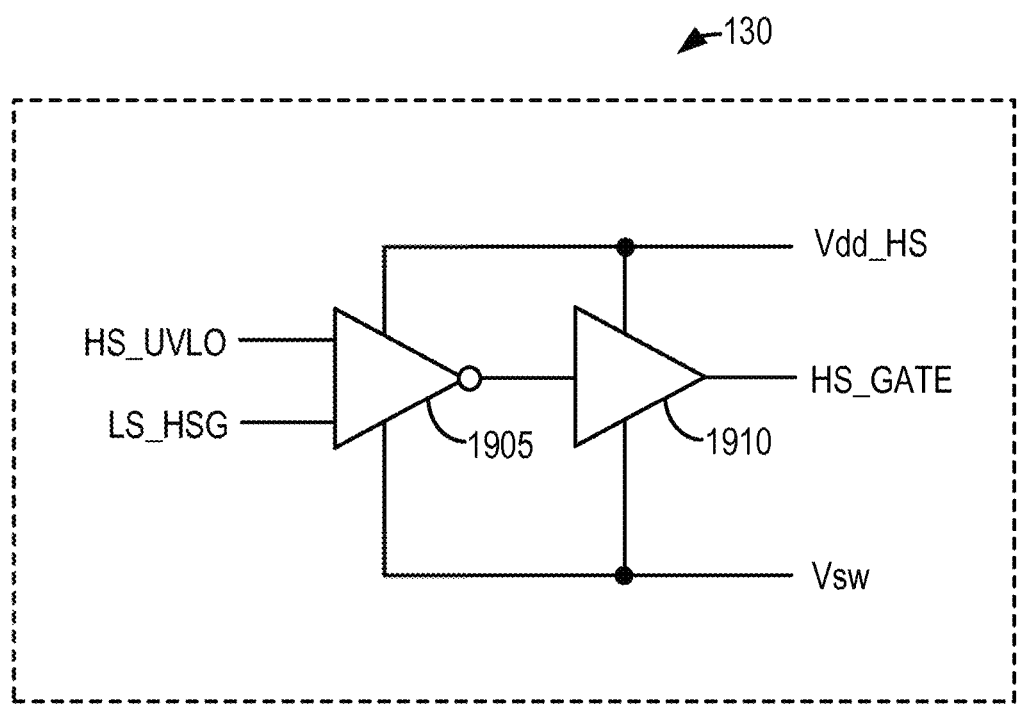
FIG. 19 is a schematic of the high side transistor driver circuit illustrated in FIG. 14.

Now referring to FIG. 19, high side transistor driver 130 is illustrated in greater detail. High side transistor driver 130 may have a first inverter stage 1905 followed by a high side drive stage 1910. First inverter stage 1905 may invert the down shifted (LS_HSG) signal received from level shift 1 receiver 1410 (see FIG. 15). The downshifted signal may then be sent through high side drive stage 1910. High side drive stage 1910 may generate the (HS_GATE) signal to drive high side transistor 125 (see FIG. 1). In further embodiments first inverter stage 1905 may contain a two input NOR gate that may ensure high side transistor 125 (see FIG. 1) is turned off when the (HS_UVLO) signal is in a high state.

Figure 20:
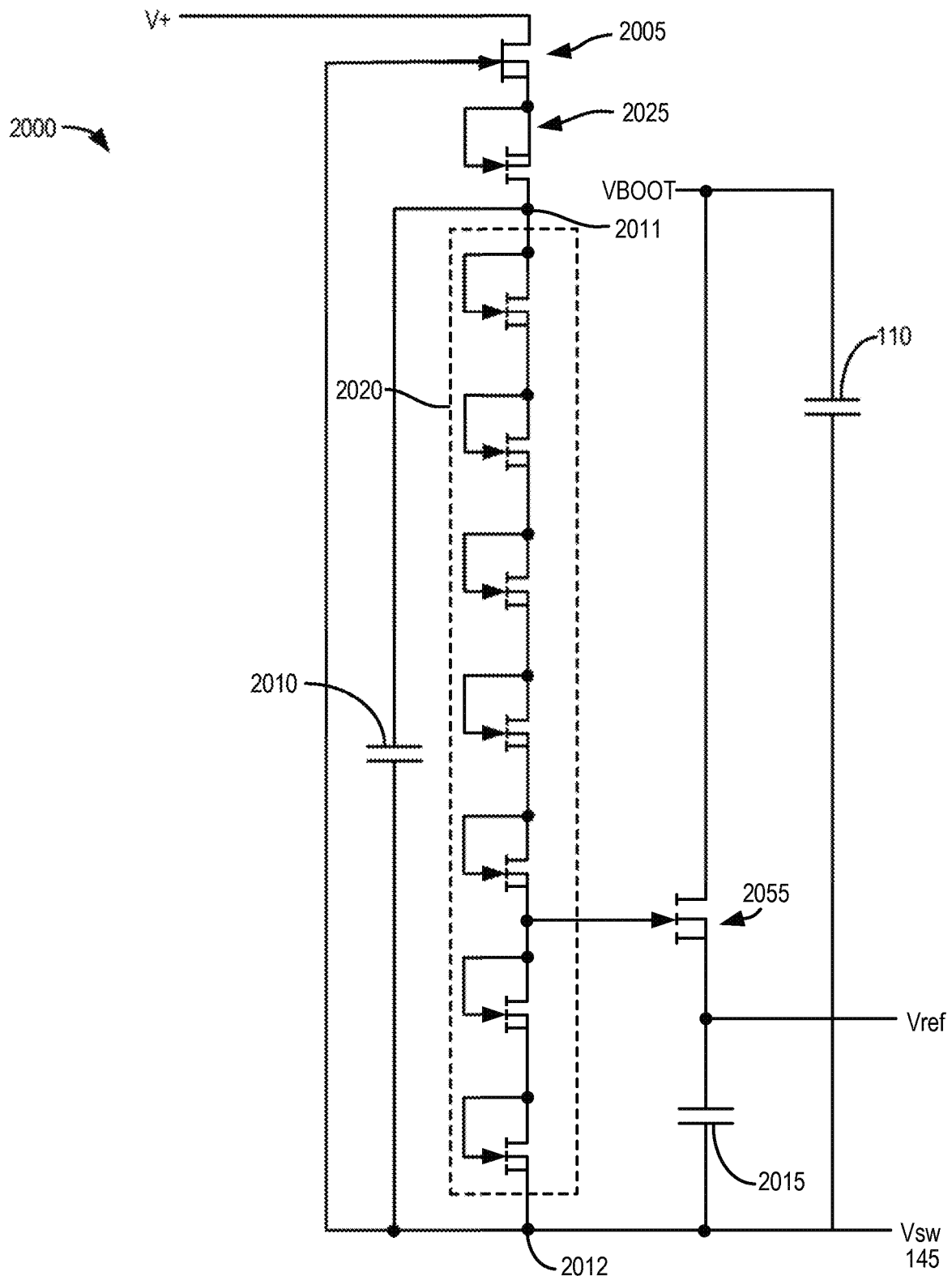
FIG. 20 is a schematic of a high side reference voltage generation circuit illustrated in FIG. 14.

Now referring to FIG. 20, a reference voltage generation circuit 2000 may be used, to generate a high side reference voltage from a supply rail. Such a circuit maybe placed on the high side GaN device 105 for generating internal power supplies which are referenced to the switch node voltage 145. In some embodiments, circuit 2000 may be similar to startup circuit 155 in FIG. 9. One difference in circuit 2000 may be the addition of a source follower capacitor 2010 connected between first node 2011 and second node 2012. In some embodiments, source follower capacitor 2010 may be needed to ensure that a well regulated voltage, which does not fluctuate with dv/dt appearing at the switch node (Vsw) 145, develops between the first node 2011 and the second node 2012. In other embodiments a reference voltage capacitor 2015 may be connected between a source of reference voltage transistor 2055 and second node 2012. In some embodiments the drain of the reference voltage transistor 2055 may be connected to the (Vboot) node. In some embodiments, reference voltage capacitor 2015 may be needed to ensure that (Vref) is well regulated and does not respond to high dv/dt conditions at switch node (Vsw) 145 (see FIG. 1). In yet further embodiments, another difference in circuit 2000 may be that second node 2012 may be coupled to a constantly varying voltage, such as switch node (Vsw) 145 (see FIG. 1), rather than a ground connection through a current sink circuit 915 (see FIG. 9). In yet further embodiments (Vref) can be used as (Vdd_HS) in the half bridge circuit 100.

Another difference in circuit 2000 may be the addition of a high-voltage diode connected transistor 2025 (i.e., the gate of the transistor is coupled to the source of the transistor) coupled between depletion-mode transistor 2005 and series of identical diode connected enhancement-mode low-voltage transistors 2020. More specifically, high-voltage diode connected transistor 2025 may have source coupled to the source of depletion-mode transistor 2005, a drain coupled to first node 2011 and a gate coupled to its source. High-voltage diode connected transistor 2025 may be used to ensure that source follower capacitor 2010 does not discharge when the voltage at the top plate of the source follower capacitor rises above (V+). In further embodiments source follower capacitor 2010 may be relatively small and may be integrated on a semiconductor substrate or within an electronic package. Also shown in FIG. 20 is bootstrap capacitor 110 that may be added externally in a half bridge circuit.

In some embodiments, shield capacitor 160 (see FIG. 1) may be connected from first level shift node 305 (see FIG. 3) and second level shift node (not shown) to switch node 145 to assist in reducing the false triggering discussed above. In some embodiments, the larger the value of shield capacitor 160, the more immune the circuit will be to false triggering effects due to the parasitic capacitance to ground. However, during high side transistor 125 turn-off, shield capacitor 160 may be discharged through pull up resistor 303 (see FIG. 3) connected to first level shift node 305. This may significantly slow down high side transistor 125 turn-off process. In some embodiments this consideration may be used to set an upper limit on the value of shield capacitor 160. In further embodiments, an overvoltage condition on first level shift node 305 (see FIG. 3) may be prevented by the use of a clamp circuit 161 (see FIG. 1) between the first level shift node and switch node 145. In some embodiments, clamp circuit 161 maybe composed of a diode connected transistor where a drain of the transistor is connected to first level shift node 305 (see FIG. 3) and a gate and a source are connected to switch node (Vsw) 145 (see FIG. 1). In further embodiments, a second shield capacitor and a second clamp circuit may be placed between the second level shift node and switch node (Vsw) 145 (see FIG. 1).

Half Bridge Circuit #1 Operation

The following operation sequence for half bridge circuit 100 is for example only and other sequences may be used without departing from the disclosure. Reference will now be made simultaneously to FIGS. 1, 2 and 14.

In one embodiment, when the (PWM_LS) signal from the controller is high, low side logic, control and level shift circuit 150 sends a high signal to low side transistor driver 120. Low side transistor driver 120 then communicates through the (LS_GATE) signal to low side transistor 115 to turn it on. This will set the switch node voltage (Vsw) 145 close to 0 volts. When low side transistor 115 turns on, it provides a path for bootstrap capacitor 110 to become charged through bootstrap charging circuit 157 which may be connected between (Vcc) and (Vboot). The charging path has a parallel combination of a high voltage bootstrap diode 1205 (see FIG. 12) and transistor 1210. The (BOOT-FET_DR) signal provides a drive signal to bootstrap transistor 1210 (see FIG. 12) that provides a low resistance path for charging bootstrap capacitor 110.

Bootstrap diode 1205 (see FIG. 12) may be used to ensure that there is a path for charging bootstrap capacitor 110 during startup when there is no low side transistor 115 gate drive signal (LS_GATE). During this time the (PWM_HS) signal should be low. If the (PWM_HS) signal is inadvertently turned on (i.e., in a high state) during this time the (STP_HS) signal generated from low side transistor driver 120 will prevent high side transistor 125 from turning on. If the (PWM_LS) signal is turned on while the (PWM_HS) signal is on, the (STP_LS) signal generated from level shift driver circuit 217 will prevent low side transistor 115 from turning on. Also, in some embodiments the (LS_UVLO) signal may prevent low side transistor 115 and high side transistor 125 from turning on when either (Vcc) or (Vdd_LS) goes below a preset threshold voltage level.

In further embodiments, when the (PWM_LS) signal is low, low side gate signal (LS_GATE) to low side transistor 115 is also low. During the dead time between the (PWM_LS) signal low state to the (PWM_HS) high state transition, an inductive load will force either high side transistor 125 or low side transistor 115 to turn on in the synchronous rectifier mode, depending on direction of power flow. If high side transistor 125 turns on during the dead time (e.g., during boost mode operation), switch node (Vsw) 145 voltage may rise close to (V+) 135 (rail voltage).

In some embodiments, a dv/dt condition on switch node 145 (Vsw) may tend to pull first level shift node (LSHIFT_1) 305 (see FIG. 3) to a low state relative to switch node (Vsw) 145, due to capacitive coupling to ground. This may turn on high side gate drive circuit 130 causing unintended triggering of high side transistor 125. In one embodiment, this may result in no dead time which may harm half bridge circuit 100 with a shoot through condition. In further embodiments, to prevent this condition from occurring, blanking pulse generator 223 may sense the turn-off transient of low side transistor 115 and send a pulse to turn on second level shift transistor 205. This may pull the (L_SHIFT2) signal voltage to a low state which then communicates with second level shift receiver 1420 to generate a blanking pulse signal (B_PULSE) to drive blanking transistor 1440. Blanking transistor 1440 may then act as a pull up to prevent first level shift node (LSHIFT_1) 305 (see FIG. 3) from going to a low state relative to switch node (Vsw) 145.

In further embodiments, after the dead time, when the (PWM_HS) signal goes to a high state, level shift driver circuit 217 may send a high signal to the gate of first level shift transistor 203 (via the L1_DR signal from level shift driver circuit 217). The high signal will pull first level shift node (LSHIFT_1) 305 (see FIG. 3) low relative to switch node (Vsw) 145 which will result in a high signal at the input of high side transistor 125, turning on high side transistor 125. Switch node voltage (Vsw) 145 will remain close to (V+) 135. In one embodiment, during this time, bootstrap capacitor 110 may discharge through first level shift transistor 203 (which is in an on state during this time).

If high side transistor 125 stays on for a relatively long time (i.e., a large duty cycle) bootstrap capacitor 110 voltage will go down to a low enough voltage that it will prevent high side transistor 125 from turning off when the (PWM_HS) signal goes low. In some embodiments this may occur because the maximum voltage the (L_SHIFT1) signal can reach is (Vboot) which may be too low to turn off high side transistor 125. In some embodiments, this situation may be prevented by high side UVLO circuit 1415 that forcibly turns off high side transistor 125 by sending a high input to high side gate drive circuit 130 when (Vboot) goes below a certain level.

In yet further embodiments, when the (PWM_HS) signal goes low, first level shift transistor 203 will also turn off (via the L1_DR signal from the level shift driver circuit 217). This will pull first level shift node (LSHIFT_1) 305 (see FIG. 3) to a high state. However, in some embodiments this process may be relatively slow because the high value pull up resistor 303 (see FIG. 3) (used to reduce power consumption in some embodiments) needs to charge all the capacitances attached to first level shift node (L_SHIFT1) 305 (see FIG. 3) including the output capacitance (Coss) of first level shift transistor 213 and shield capacitor 160. This may increase the turn-off delay of high side transistor 125. In order to reduce high side transistor 125 turn-off delay, pull up trigger circuit 1425 may be used to sense when first level shift node (L_SHIFT1) 305 (see FIG. 3) goes above (Vth). This condition may generate a (PULLUP_FET) signal that is applied to pull up transistor 1435 which, acting in parallel with pull up resistor 1430, may considerably speed up the pull up of first level shift node (L_SHIFT1) 305 (see FIG. 3) voltage, hastening the turn-off process.

Half Bridge Circuit #2

Figure 21:
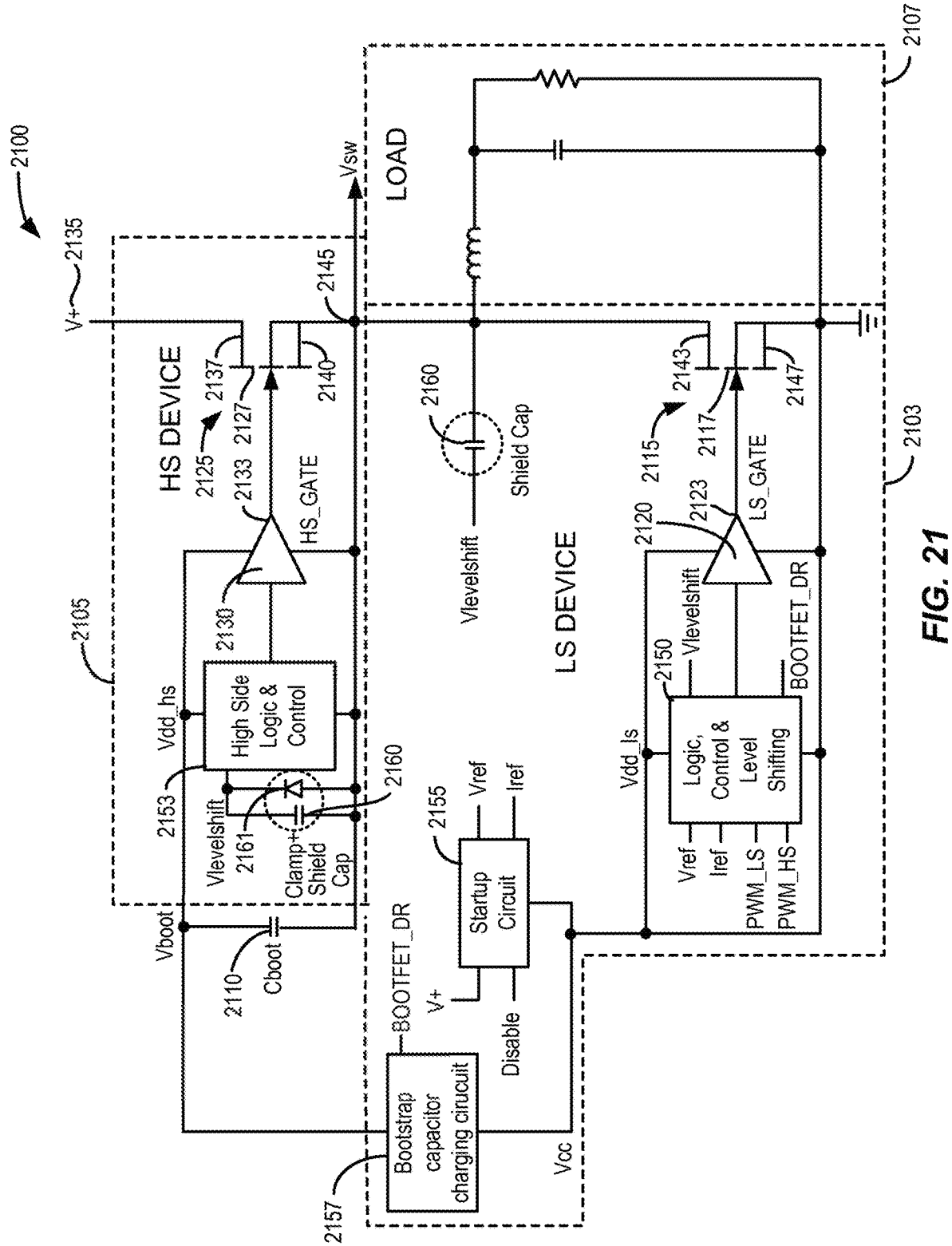
FIG. 21 is a simplified schematic of a half bridge power conversion circuit according to another embodiment of the disclosure.

Now referring to FIG. 21, a second embodiment of a half bridge circuit 2100 is disclosed. Half bridge circuit 2100 may have the same block diagram as circuit 100 illustrated in FIG. 1, however the level shift transistors in circuit 2100 may operate with pulsed inputs, rather than a continuous signal, as described in more detail below. In some embodiments, pulsed inputs may result in lower power dissipation, reduced stress on the level shift transistors and reduced switching time, as discussed in more detail below.

Continuing to refer to FIG. 21, one embodiment includes an integrated half bridge power conversion circuit 2100 employing a low side GaN device 2103, a high side GaN device 2105, a load 2107, a bootstrap capacitor 2110 and other circuit elements, as discussed in more detail below. Some embodiments may also have an external controller (not shown in FIG. 21) providing one or more inputs to circuit 2100 to regulate the operation of the circuit. Circuit 2100 is for illustrative purposes only and other variants and configurations are within the scope of this disclosure.

As further illustrated in FIG. 21, in one embodiment, integrated half bridge power conversion circuit 2100 may include a low side circuit disposed on low side GaN device 2103 that includes a low side transistor 2115 having a low side control gate 2117. The low side circuit may further include an integrated low side transistor driver 2120 having an output 2123 connected to a low side transistor control gate 2117. In another embodiment there may be a high side circuit disposed on high side GaN device 2105 that includes a high side transistor 2125 having a high side control gate 2127. The high side circuit may further include an integrated high side transistor driver 2130 having an output 2133 connected to high side transistor control gate 2127.

High side transistor 2125 may be used to control the power input into power conversion circuit 2100 and have a voltage source (V+) 2135 (sometimes called a rail voltage) connected to a drain 2137 of the high side transistor. High side transistor 2125 may further have a source 2140 that is coupled to a drain 2143 of low side transistor 2115, forming a switch node (Vsw) 2145. Low side transistor 2115 may have a source 2147 connected to ground. In one embodiment, low side transistor 2115 and high side transistor 2125 may be enhancement-mode field-effect transistors. In other embodiments low side transistor 2115 and high side transistor 2125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 2105 and low side device 2103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN Low Side Device Low side device 2103 may have numerous circuits used for the control and operation of the low side device and high side device 2105. In some embodiments, low side device 2103 may include a low side logic, control and level shift circuit (low side control circuit) 2150 that controls the switching of low side transistor 2115 and high side transistor 2125 along with other functions, as discussed in more detail below. Low side device 2103 may also include a startup circuit 2155, a bootstrap capacitor charging circuit 2157 and a shield capacitor 2160, as also discussed in more detail below.

Figure 22:
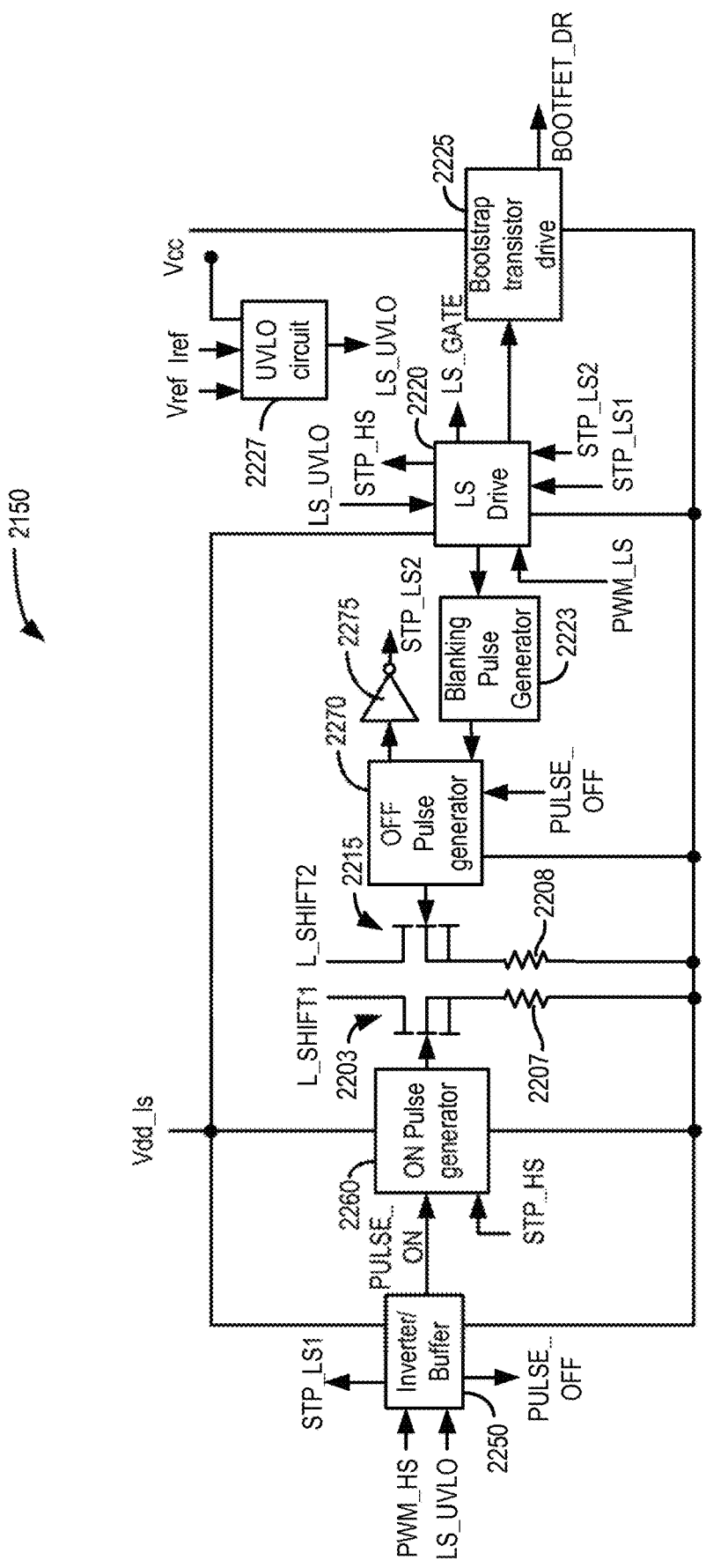
FIG. 22 is a simplified schematic of the circuits within the low side control circuit illustrated in FIG. 21.

Now referring to FIG. 22, the circuits within low side control circuit 2150 are functionally illustrated. Each circuit within low side control circuit 2150 is discussed below, and in some cases is shown in more detail in FIGS. 23-28. In one embodiment the primary function of low side control circuit 2150 may be to receive one or more input signals, such as a PWM signal from a controller, and control the operation of low side transistor 2115, and high side transistor 2125.

First level shift transistor 2203, may be an "on" pulse level shift transistor, while second level shift transistor 2215 may be an "off" pulse level shift transistor. In one embodiment, a pulse width modulated high side (PWM_HS) signal from a controller (not shown) may be processed by inverter/buffer 2250 and sent on to an on pulse generator 2260 and an off pulse generator 2270. On pulse generator 2260 may generate a pulse that corresponds to a low state to high state transient of the (PWM_HS) signal, thus turning on first level shift transistor 2203 during the duration of the pulse. Off pulse generator 2270 may similarly generate a pulse that corresponds to the high state to low state transition of the (PWM_HS) signal, thus turning on second level shift transistor 2205 for the duration of the off pulse.

First and second level shift transistors 2203, 2205, respectively, may operate as pull down transistors in resistor pull up inverter circuits. More specifically, turning on may mean the respective level shift node voltages get pulled low relative to switch node (Vsw) 2145 voltage, and turning off may result in the respective level shift nodes assuming the (Vboot) voltage. Since first and second level shift transistors 2203, 2215, respectively, are "on" only for the duration of the pulse, the power dissipation and stress level on these two devices may be less than half bridge circuit 100 illustrated in FIG. 1.

First and second resistors 2207, 2208, respectively, may be added in series with the sources of first and second level shift transistors 2203, 2215, respectively to limit the gate to source voltage and consequently the maximum current through the transistors. First and second resistors 2207, 2208, respectively, could be smaller than the source follower resistors in half bridge circuit 100 illustrated in FIG. 1, which may help make the pull down action of first and second level shift transistors 2203, 2215 faster, reducing the propagation delays to high side transistor 2125.

In further embodiments, first and second resistors 2207, 2208, respectively, could be replaced by any form of a current sink. One embodiment may connect the source of first and second level shift transistors 2203, 2205, respectively to a gate to source shorted depletion-mode device. One embodiment of a depletion-mode transistor formed in a high-voltage GaN technology may be to replace the enhancement-mode gate stack with one of the high-voltage field plate metals superimposed on top of the field dielectric layers. The thickness of the field dielectric and the work function of the metal may control the pinch-off voltage of the stack.

In further embodiments, first and second resistors 2207, 2208, respectively may be replaced by a current sink. In one embodiment a reference current (Iref) that is generated by startup circuit 2155 (see FIG. 21) may be used. Both the depletion-mode transistor and current sink embodiments may result in a significant die area reduction compared to the resistor option (i.e., because a small depletion transistor would suffice and Iref is already available).

Bootstrap transistor drive circuit 2225 may be similar to bootstrap transistor drive circuit 225 illustrated in FIG. 2 above. Bootstrap transistor drive circuit 2225 may receive input from low side drive circuit 2220 (see FIG. 22) and provide a gate drive signal called (BOOTFET_DR) to the bootstrap transistor in bootstrap capacitor charging circuit 2157 (see FIG. 21), as discussed in more detail above.

Figure 23:
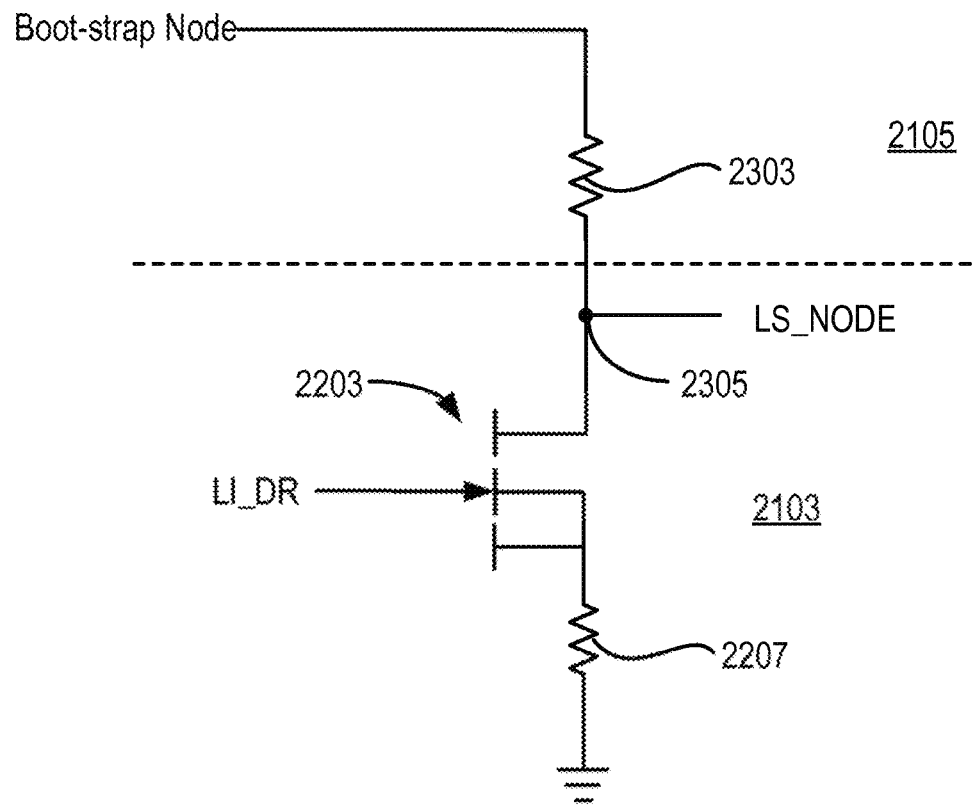
FIG. 23 is a schematic of the first level shift transistor illustrated in FIG. 22.

Now referring to FIG. 23, first level shift transistor 2203 is illustrated along with a pull up resistor 2303 that may be located in high side device 2105. In some embodiments, first level shift transistor 2203 may operate as a pull down transistor in a resistor pull up inverter similar to first level shift transistor 203 illustrated in FIG. 3. As discussed above, pull up resistor 2303 may be disposed in high side device 2105 (see FIG. 21). Second level shift transistor 2215 may have a similar configuration. In some embodiments there may be a first capacitance between the first output terminal (LS_NODE) 2305 and switch node (Vsw) 2145 (see FIG. 21), and a second capacitance between a first output terminal 2305 and ground, where the first capacitance is greater than the second capacitance. The first capacitance may be designed such that in response to a high dv/dt signal at the switch node (Vsw) 2145 (see FIG. 21), a large portion of the C*dv/dt current is allowed to conduct through the first capacitance ensuring that the voltage at first output terminal 2305 tracks the voltage at the switch node (Vsw). A shield capacitor 2160 (see FIG. 21) may be configured to act as the first capacitor as described above. In further embodiments shield capacitor 2160 (see FIG. 21) may be used to create capacitance between first output terminal 2305 and switch node (Vsw) 2145 (see FIG. 21) in the half bridge power conversion circuit 2100. Shield capacitor 2160 may also be used to minimize the capacitance between first output terminal 2305 and a substrate of the semiconductor device. In further embodiments shield capacitor 2160 may be constructed on low side GaN device 2103.

Figure 24:
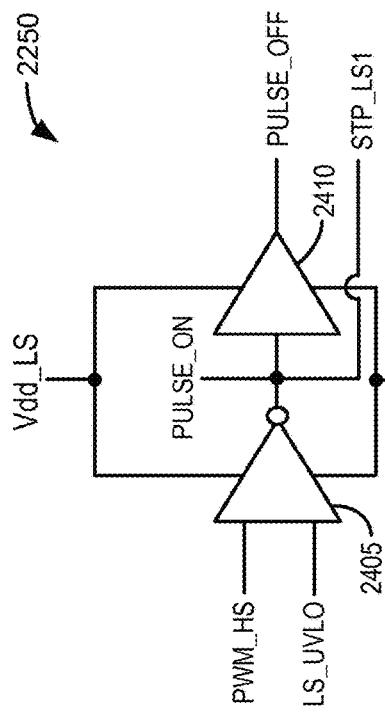
FIG. 24 is a schematic of the inverter/buffer circuit illustrated in FIG. 22.

Now referring to FIG. 24, inverter/buffer circuit 2250 is illustrated in greater detail. In one embodiment inverter/buffer circuit 2250 may have a first inverter stage 2405 and a first buffer stage 2410. In further embodiments, inverter/buffer circuit 2250 may be driven directly by the (PWM_HS) signal from the controller (not shown). The output of first inverter stage 2405 may be the input signal (PULSE_ON) to on pulse generator 2260 (see FIG. 22) while the output of first buffer stage 2410 may be an input signal (PULSE_OFF) to off pulse generator 2270.

In some embodiments, an optional (LS_UVLO) signal may be generated by sending a signal generated by UVLO circuit 2227 (see FIG. 22) in to a NAND gate disposed in first inverter stage 2405. This circuit may be used to turn off the level shift operation if either (Vcc) or (Vdd_LS) go below a certain reference voltage (or a fraction of the reference voltage). In further embodiments, inverter/buffer circuit 2250 may also generate a shoot through protection signal (STP_LS1) for low side transistor 2115 (see FIG. 21) that may be applied to low side transistor gate drive circuit 2120. This may turn off low side transistor gate drive circuit 2120 (see FIG. 21) when the (PWM_HS) signal is high, preventing shoot through.

Figure 25:
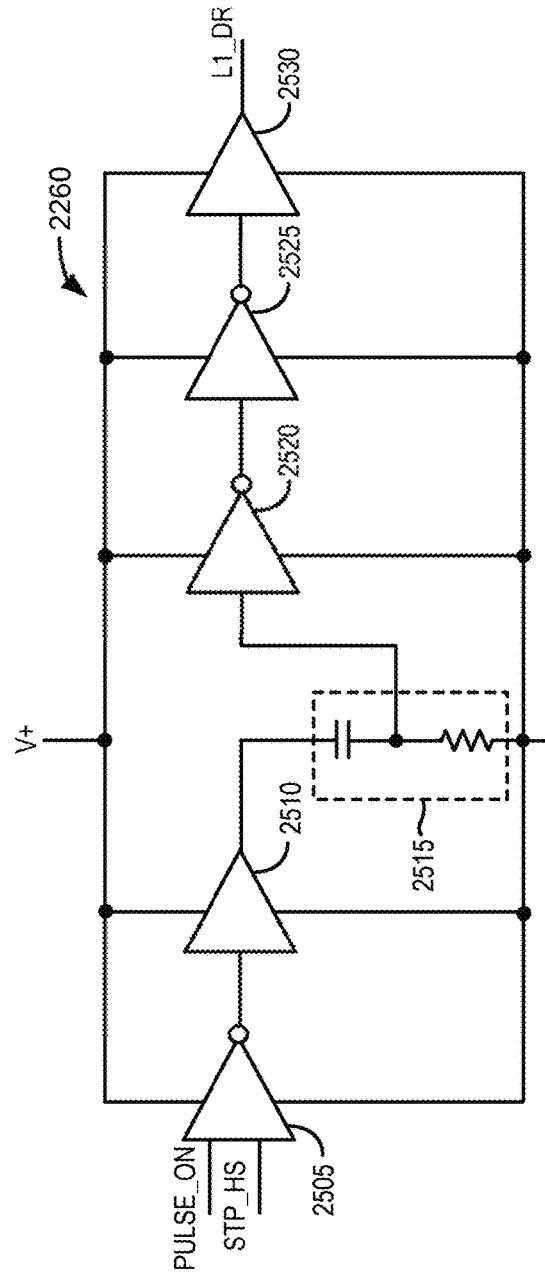
FIG. 25 is a schematic of the on pulse generator circuit illustrated in FIG. 22.

Now referring to FIG. 25, on pulse generator 2260 is illustrated in greater detail. In one embodiment on pulse generator 2260 may have a first inverter stage 2505, a first buffer stage 2510, an RC pulse generator 2515, a second inverter stage 2520 a third inverter stage 2525 and a third buffer stage 2530. In further embodiments the (PULSE_ON) signal input from inverter/buffer circuit 2250 (see FIG. 22) may be first inverted and then transformed into an on pulse by RC pulse generator 2515 and a square wave generator. The result of this operation is the gate drive signal (LI_DR) that is transmitted to first level shift transistor 2203 (see FIG. 22).

In further embodiments, on pulse generator 2260 may comprise one or more logic functions, such as for example, a binary or combinatorial function. In one embodiment, on pulse generator 2260 may have a multiple input NOR gate for the (STP_HS) signal. The (STP_HS) signal may have the same polarity as the (LS_GATE) signal. Therefore, if the (STP_HS) signal is high (corresponding to LS_GATE signal being high) the on pulse may not be generated because first inverter circuit 2505 in FIG. 25 will be pulled low which will deactivate pulse generator 2515.

In further embodiments, RC pulse generator 2515 may include a clamp diode (not shown). The clamp diode may be added to ensure that RC pulse generator 2515 works for very small duty cycles for the (PWM_LS) signal. In some embodiments, on pulse generator 2260 may be configured to receive input pulses in a range of 2 nanoseconds to 20 microseconds and to transmit pulses of substantially constant duration within the range. In one embodiment the clamp diode may turn on and short out a resistor in RC pulse generator 2515 (providing a very small capacitor discharge time) if the voltage across the clamp diode becomes larger than (Vth). This may significantly improve the maximum duty cycle of operation (with respect to the PWM_HS signal) of pulse generator circuit 2260.

Figure 26:
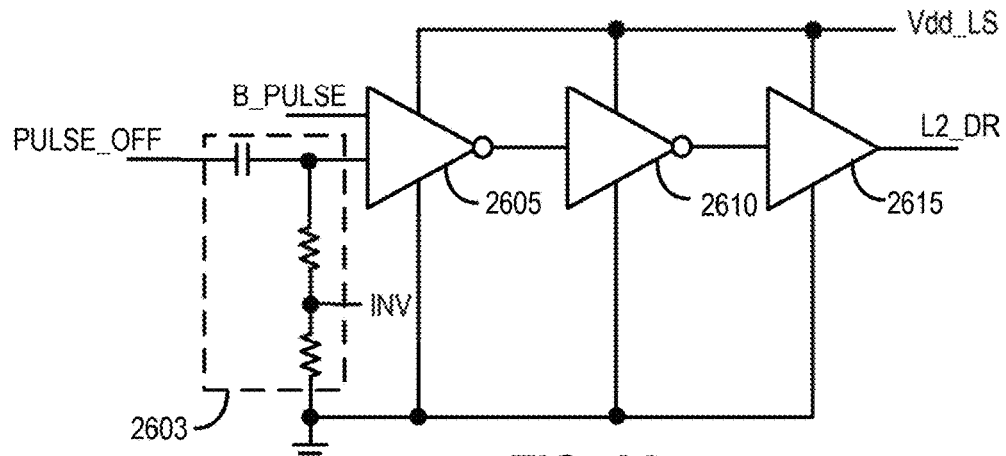
FIG. 26 is a schematic of the off pulse generator circuit illustrated in FIG. 22.

Now referring to FIG. 26, off pulse generator 2270 is illustrated in greater detail. In one embodiment off pulse generator 2270 may have an RC pulse generator 2603, a first inverter stage 2605, a second inverter stage 2610 and a first buffer stage 2615. In further embodiments, off pulse generator 2270 may receive an input signal (PULSE_OFF) from inverter/buffer circuit 2250 (see FIG. 22) that may be subsequently communicated to RC pulse generator 2603.

In further embodiments the pulse from RC pulse generator 2603 is sent through first inverter stage 2605, second inverter stage 2610 and buffer stage 2615. The pulse may then be sent as the (L2_DR) signal to second level shift transistor 2215 (see FIG. 22). A clamp diode may also be included in off pulse generator 2270. In some embodiments, the operating principle may be similar to the operating principle discussed above with regard to on pulse generator 2260 (see FIG. 25). Such operating principles may ensure that off pulse generator 2270 operates for very low on times of high side transistor 2125 (see FIG. 21) (i.e. the circuit will operate for relatively small duty cycles). In some embodiments, off pulse generator 2270 may be configured to receive input pulses in a range of 2 nanoseconds to 20 microseconds and to transmit pulses of substantially constant duration within the range. In further embodiments an off level shift pulse can be shortened by an on input pulse to enable an off time of less than 50 nanoseconds on high side transistor 2125.

In some embodiments, RC pulse generator 2603 may include a capacitor connected with a resistor divider network. The output from the resistor may be a signal (INV) that is sent to an inverter 2275 (see FIG. 22) that generates a shoot through protection signal (STP_LS2) transmitted to low side driver circuit 2220. In further embodiments, off pulse generator 2270 may comprise one or more logic functions, such as for example, a binary or combinatorial function. In one embodiment the (STP_LS2) signal is sent to a NAND logic circuit within low side driver circuit 2220, similar to the (STP_LS1) signal. In some embodiments, these signals may be used to ensure that during the duration of the off pulse signal (PULSE_OFF), low side transistor 2115 (see FIG. 21) does not turn on (i.e., because high side transistor 2125 turns off during the off pulse). In some embodiments this methodology may be useful to compensate for a turn-off propagation delay (i.e., the PULSE_OFF signal may enable shoot through protection), ensuring that low side transistor 2115 will only turn on after high side transistor 2125 gate completely turns off.

In further embodiments, a blanking pulse can be level shifted to high side device 2105 using second level shift transistor 2215. To accomplish this, a blanking pulse may be sent into a NOR input into first inverter stage 2605. The blanking pulse may be used to inhibit false triggering due to high dv/dt conditions at switch node Vsw 2145 (see FIG. 20). In some embodiments no blanking pulse may be used to filter dv/dt induced or other unwanted level shift output pulses.

Figure 27:
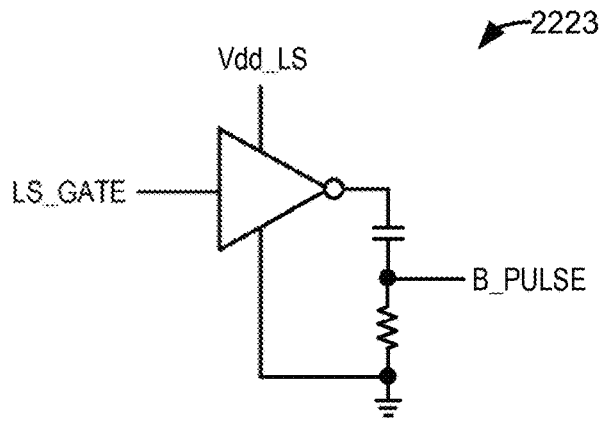
FIG. 27 is a schematic of the blanking pulse generator circuit illustrated in FIG. 22.

Now referring to FIG. 27, blanking pulse generator 2223 is illustrated in greater detail. In one embodiment, blanking pulse generator 2223 may be a more simple design than used in half bridge circuit 100 illustrated in FIG. 1 because the square wave pulse generator is already part of off pulse generator 2270. In one embodiment the (LS_GATE) signal is fed as the input to blanking pulse generator 2223 from low side gate drive circuit 2220 (see FIG. 22). This signal may be inverted and then sent through an RC pulse generator to generate a positive going pulse. In some embodiments, an inverted signal may be used because the pulse needs to correspond to the falling edge of the (LS_GATE) signal. The output of this may be used as the blanking pulse input (B_PULSE) to off pulse generator 2270.

Figure 28:
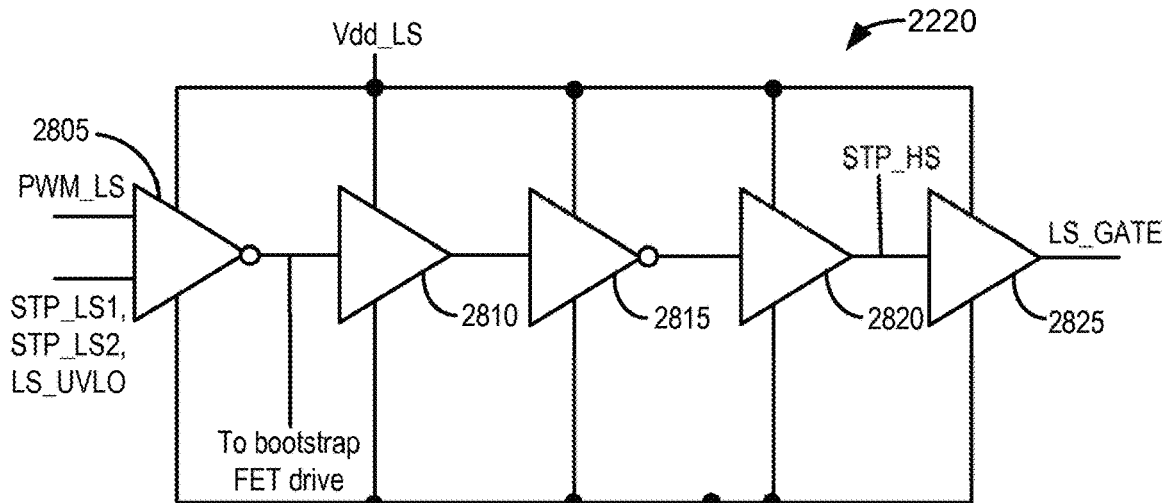
FIG. 28 is a schematic of the low side transistor drive circuit illustrated in FIG. 22.

Now referring to FIG. 28, low side transistor drive circuit 2220 is illustrated in greater detail. In one embodiment low side transistor drive circuit 2220 may have a first inverter stage 2805, a first buffer stage 2810, a second inverter stage 2815, a second buffer stage 2820 and a third buffer stage 2825. In some embodiments two inverter/buffer stages may be used because the input to the gate of low side transistor 2115 is synchronous with the (PWM_LS) signal. Thus, in some embodiments a (PWM_LS) high state may correspond to a (LS_GATE) high state and vice versa.

In further embodiments, low side transistor drive circuit 2220 may also include an asymmetric hysteresis using a resistor divider with a transistor pull down similar to the scheme described in 120 (see FIG. 8). In one embodiment low side transistor drive circuit 2220 includes multiple input NAND gates for the (STP_LS1) and (STP_LS2) (shoot through prevention on low side transistor 2115) signals. The (STP_LS1) and (STP_LS2) signals may ensure that low side transistor drive circuit 2220 (see FIG. 22) does not communicate with low side transistor 2115 (see FIG. 21) when high side transistor 2125 is on. This technique may be used to avoid the possibility of shoot-through. Other embodiments may include NAND gates (similar to the ones employed above in FIG. 28) for the (LS_UVLO) signal. One embodiment may include a turn-off delay resistor in series with the gate of the final pull down transistor. This may be used to ensure the bootstrap transistor is turned off before low side transistor 2115 turns off.

In further embodiments, low side device 2103 (see FIG. 21) may also include a startup circuit 2155, bootstrap capacitor charging circuit 2157, a shield capacitor 2160, and a UVLO circuit 2227 that may be similar to startup circuit 155, bootstrap capacitor charging circuit 157, shield capacitor 160 and UVLO circuit 227, respectively, as discussed above.

High Side Device

Figure 29:
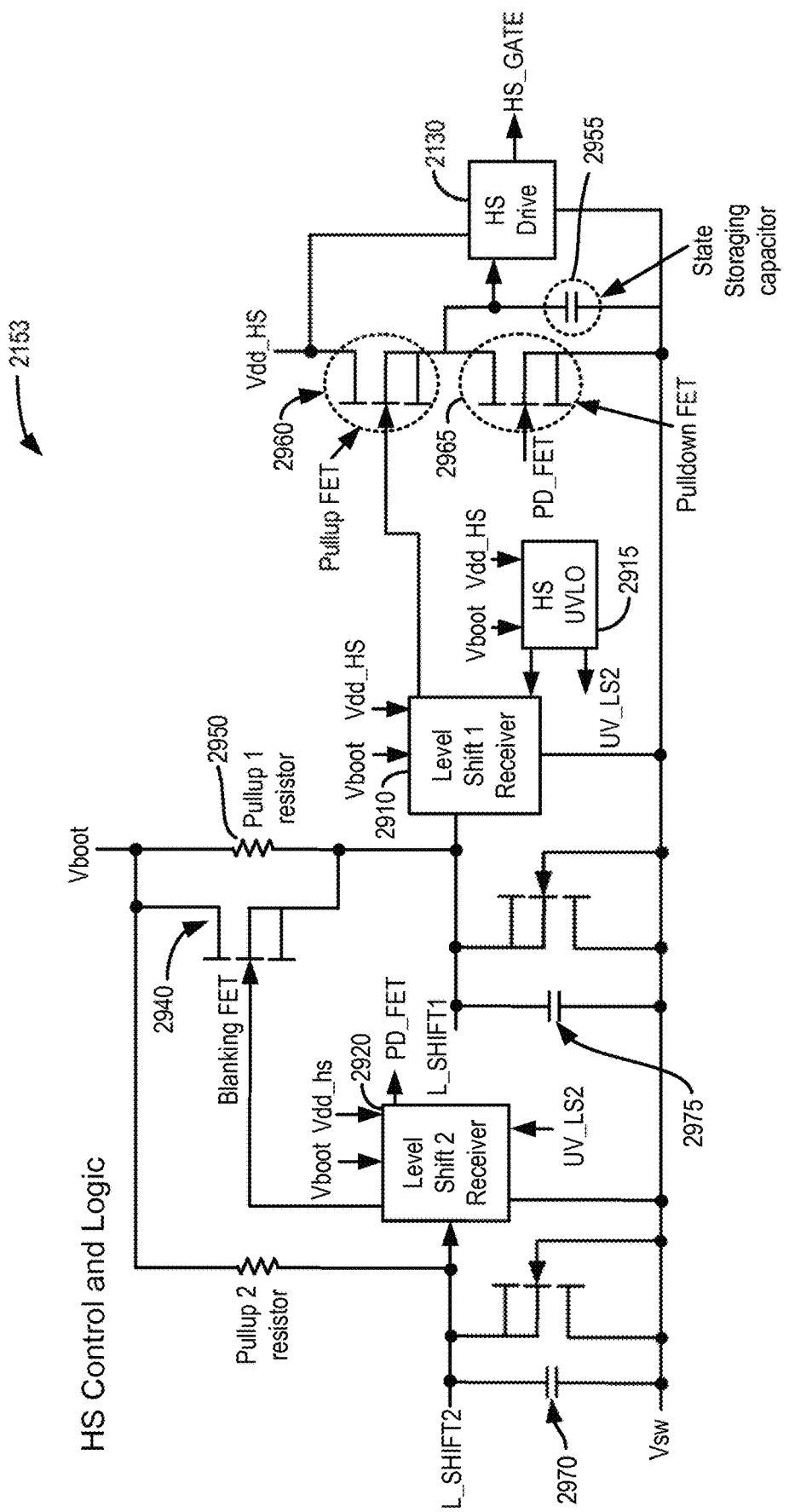
FIG. 29 is a simplified schematic of the circuits within the high side control circuit illustrated in FIG. 21.

Now referring to FIG. 29, high side logic and control circuit 2153 and how it interacts with high side transistor driver 2130 is illustrated in greater detail. In some embodiments, high side logic and control circuit 2153 may operate in similar ways as high side logic and control circuit 153, discussed above in FIG. 15. In further embodiments, high side logic and control circuit 2153 may operate in different ways, as discussed in more detail below.

In one embodiment, level shift 1 receiver circuit 2910 receives an (L_SHIFT1) signal from first level shift transistor 2203 (see FIG. 22) that receives an on pulse at the low state to high state transition of the (PWM_HS) signal, as discussed above. In response, level shift 1 receiver circuit 2910 drives a gate of pull up transistor 2960 (e.g., in some embodiments a low-voltage enhancement-mode GaN transistor). In further embodiments, pull up transistor 2960 may then pull up a state storing capacitor 2955 voltage to a value close to (Vdd_HS) with respect to switch node (Vsw) 2145 voltage. The voltage on a state storing capacitor 2955 may then be transferred to high side transistor driver 2130 and on to the gate of high side transistor gate 2127 (see FIG. 21) to turn on high side transistor 2125. In some embodiments state storing capacitor 2955 may be a latching storage logic circuit configured to change state in response to a first pulsed input signal and to change state in response to a second pulsed input signal. In further embodiments, state storing capacitor 2955 may be replaced by any type of a latching circuit such as, but not limited to an RS flip-flop.

In further embodiments, during this time, level shift 2 receiver circuit 2920 may maintain pull down transistor 2965 (e.g., in some embodiments a low-voltage enhancement-mode GaN transistor) in an off state. This may cut off any discharge path for state storing capacitor 2955. Thus, in some embodiments, state storing capacitor 2955 may have a relatively small charging time constant and a relatively large discharge time constant.

Similarly, level shift 2 receiver 2920 may receive an (L_SHIFT2) signal from second level shift transistor 2215 (see FIG. 22) that receives an off pulse at the high state to low state transition of the (PWM_HS) signal, as discussed above. In response, level shift 2 receiver circuit 2920 drives a gate of pull down transistor 2965 (e.g., in some embodiments a low-voltage enhancement-mode GaN transistor). In further embodiments, pull down transistor 2965 may then pull down (i.e., discharge) state storing capacitor 2955 voltage to a value close to switch node (Vsw) 2145, that may consequently turn off high side transistor 2125 through high side transistor driver 2130.

Continuing to refer to FIG. 29, first and second shield capacitors 2970, 2975, respectively, may be connected from (L_SHIFT1) and (L_SHIFT2) nodes to help prevent false triggering during high dv/dt conditions at switch node (Vsw)

2145 (see FIG. 21). In further embodiments there may also be a clamp diode between the (L_SHIFT1) and (L_SHIFT2) nodes and the switch node (Vsw) 2145 (see FIG. 21). This may ensure that the potential difference between switch node (Vsw) 2145 (see FIG. 21) and the (L_SHIFT1) and (L_SHIFT2) nodes never goes above (Vth). This may be used to create a relatively fast turn-on and turn-off for high side transistor 2125 (see FIG. 21).

Figure 30:
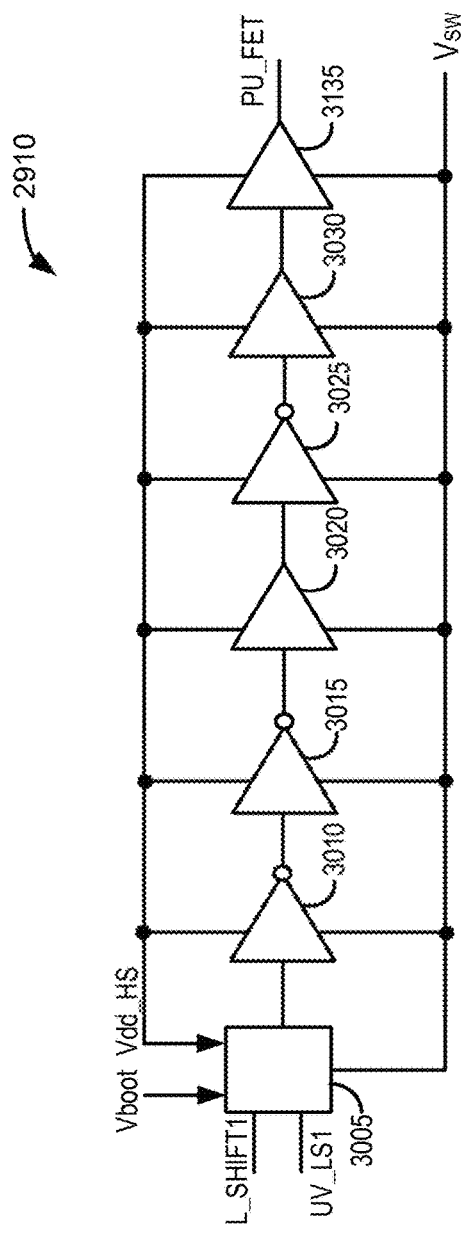
FIG. 30 is a schematic of the level shift 1 receiver circuit illustrated in FIG. 29.

Now referring to FIG. 30, level shift 1 receiver 2910 is illustrated in greater detail. In one embodiment level shift 1 receiver 2910 may include a down level shifter 3005, a first inverter 3010, a second inverter 3015, a first buffer 3020, a third inverter 3025, a second buffer 3030 and a third buffer 3135. In some embodiments, level shift 1 receiver 2910 down shifts (i.e., modulates) the (L_SHIFT1) signal by a voltage of 3*Vth (e.g., using three enhancement-mode transistors where each may have a gate to source voltage close to Vth). In other embodiments a fewer or more downshift transistors may be used.

In further embodiments, the last source follower transistor may have a three diode connected transistor clamp across its gate to its source. In some embodiments this configuration may be used because its source voltage can only be as high as (Vdd_HS) (i.e., because its drain is connected to Vdd_HS) while its gate voltage can be as high as V (L_SHIFT1)−2*Vth. Thus, in some embodiments the maximum gate to source voltage on the final source follower transistor can be greater than the maximum rated gate to source voltage in the technology.

In further embodiments, first inverter 3010 may also have a NOR Gate for the high side under voltage lock out using the (UV_LS1) signal generated by high side UVLO circuit 2915. In one embodiment, an output of level shift 1 receiver 2910 (see FIG. 29) may be a (PU_FET) signal that is communicated to a gate of pull up transistor 2960 (see FIG. 29). This signal may have a voltage that goes from 0 volts in a low state to (Vdd_HS)+(Vdd_HS−Vth) in a high state. This voltage may remain on for the duration of the on pulse.

Figure 31:
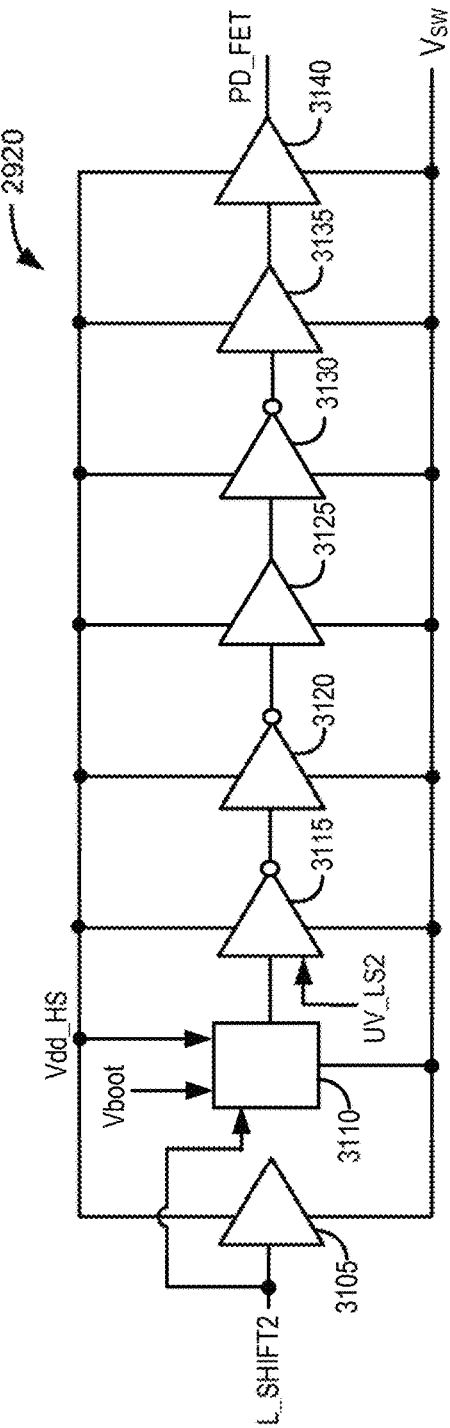
FIG. 31 is a schematic of level shift 2 receiver circuit illustrated in FIG. 29.

Now referring to FIG. 31, level shift 2 receiver 2920 is illustrated in greater detail. In one embodiment level shift 2 receiver 2920 may be similar to level shift 1 receiver 2910 discussed above. In further embodiments level shift 2 receiver 2920 may include a blanking pulse generator 3105, a down level shifter 3110, a first inverter 3115, a second inverter 3120, a first buffer 3125, an third inverter 3130, a second buffer 3135 and a third buffer 3140. In one embodiment, blanking pulse generator 3105 may be used in addition to a 3*Vth down level shifter 3110 and multiple inverter/buffer stages.

In other embodiments different configurations may be used. In some embodiments, this particular configuration may be useful when level shift 2 receiver 2920 doubles as a high side transistor 2125 (see FIG. 21) turn-off as well as a blanking transistor 2940 (see FIG. 29) drive for better dv/dt immunity. In some embodiments, blanking pulse generator 3105 may be identical to level shift 2 receiver 1520 illustrated in FIG. 17. In one embodiment level shift 2 receiver 2920 (see FIG. 29) may receive (L_SHIFT2) and (UV_LS2) signals and in response, transmit a (PD_FET) signal to pull down transistor 2965. In further embodiments, first inverter 3115 may have a two input NAND gate for the (UV_LS2) signal from high side UVLO circuit 2915 (see FIG. 29).

Figure 32:
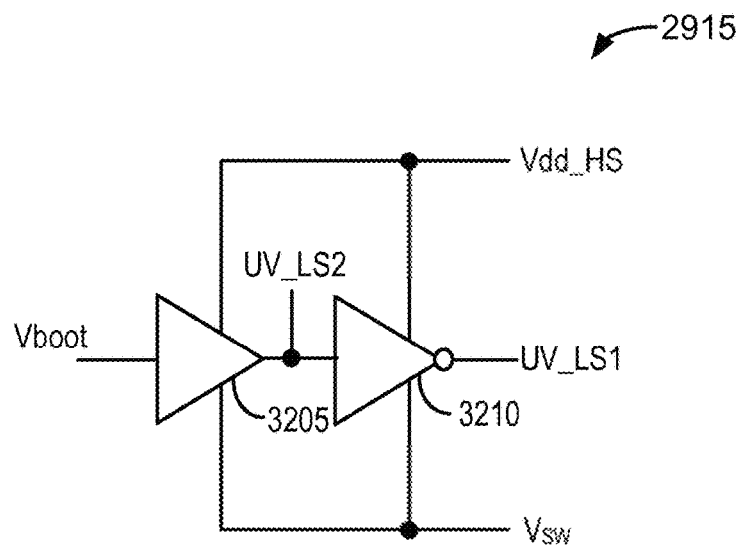
FIG. 32 is a schematic of the high side UVLO circuit illustrated in FIG. 29.

Now referring to FIG. 32, high side UVLO circuit 2915 is illustrated in greater detail. In one embodiment high side UVLO circuit 2915 may include a down level shifter 3205 and a resistor pull up inverter stage 3210. In some embodiments, high side UVLO circuit 2915 may be configured to prevent circuit failure by turning off the (HS_GATE) signal to high side transistor 2125 (see FIG. 21) when bootstrap capacitor 2110 voltage goes below a certain threshold. In one example embodiment high side UVLO circuit 2915 is designed to engage when (Vboot) reduces to a value less than 4*Vth below switch node (Vsw) 2145 voltage. In another embodiment the output of down level shifter 3205 may be a (UV_LS2) signal transmitted to second level shift receiver 2920 and the output of resistor pull up inverter stage 3210 may be an (UV_LS1) signal that is transmitted to first level shift receiver 2910.

As discussed below, in some embodiments high side UVLO circuit 2915 may be different from high side UVLO circuit 1415 for half bridge circuit 100 discussed above in FIGS. 14 and 18, respectively. In one embodiment, the (Vboot) signal may be down shifted by 3*Vth and transferred to resistor pull up inverter stage 3210. In further embodiments, since level shift 2 receiver circuit 2920 (see FIG. 29) controls the turn-off process based on high side transistor 2125 (see FIG. 21), directly applying a 3*Vth down shifted output to the NAND gate at the input of level shift 2 receiver circuit 2920 will engage the under voltage lock out.

However, in some embodiments, because the bootstrap voltage may be too low, this may also keep pull up transistor 2960 (see FIG. 29) on. In some embodiments, this may result in a conflict. While level shift 2 receiver circuit 2920 (see FIG. 29) tries to keep high side transistor 2125 (see FIG. 21) off, level shift 1 receiver circuit 2910 may try to turn the high side transistor on. In order to avoid this situation, some embodiments may invert the output of the 3*Vth down shifted signal from high side UVLO circuit 2915 (see FIG. 29) and send it to a NOR input on level shift 1 receiver circuit 2910. This may ensure that level shift 1 receiver circuit 2910 does not interfere with the UVLO induced turn-off process.

Figure 33:
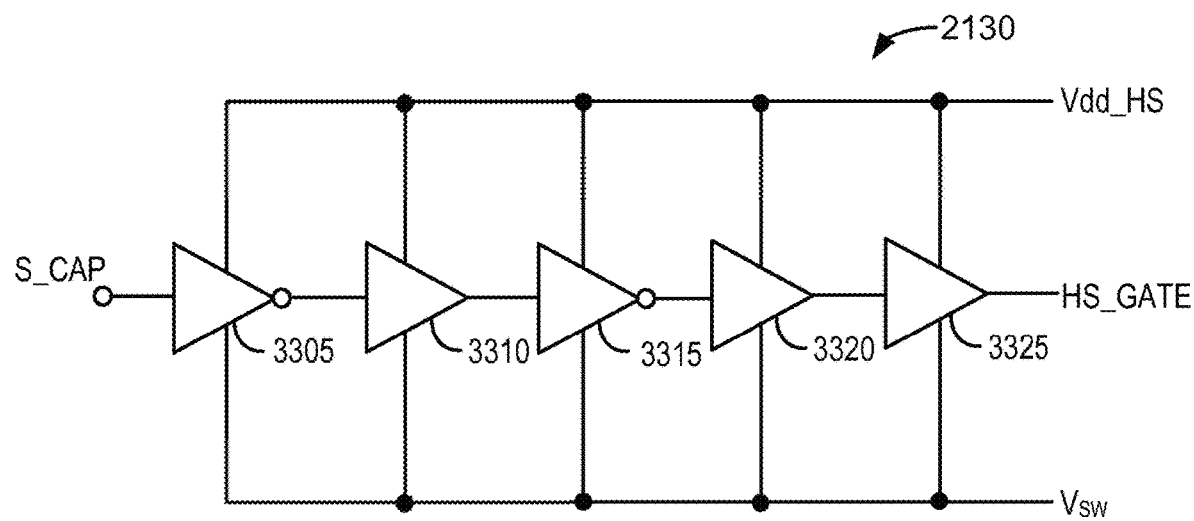
FIG. 33 is a schematic of the high side transistor driver circuit illustrated in FIG. 29.

Now referring to FIG. 33, high side transistor driver 2130 is illustrated in greater detail. In one embodiment high side transistor driver 2130 may include a first inverter 3305, a first buffer 3310, a second inverter 3315, a second buffer 3320 and a third buffer 3325. In some embodiments high side transistor driver 2130 may be a more basic design than high side transistor driver 130 employed in half bridge circuit 100 illustrated in FIG. 1. In one embodiment, high side transistor driver 2130 receives an (S_CAP) signal from state storage capacitor 2955 (see FIG. 29) and delivers a corresponding drive (HS_GATE) signal to high side transistor 2125 (see FIG. 21). More specifically, when the (S_CAP) signal is in a high state, the (HS_GATE) signal is in a high state and vice versa.

Half Bridge Circuit #2 Operation

The following operation sequence for half bridge circuit 2100 (see FIG. 21) is for example only and other sequences may be used without departing from the disclosure. Reference will now be made simultaneously to FIGS. 21, 22 and 29.

In one embodiment, when the (PWM_LS) signal is in a high state, low side logic, control and level shift circuit 2150 may send a high signal to low side transistor driver 2120 which then communicates that signal to low side transistor 2115 to turn it on. This may set switch node (Vsw) 2145 voltage close to 0 volts. In further embodiments, when low side transistor 2115 turns on it may provide a path for bootstrap capacitor 2110 to charge. The charging path may have a parallel combination of a high-voltage bootstrap diode and transistor.

In some embodiments, bootstrap transistor drive circuit 2225 may provide a drive signal (BOOTFET_DR) to the bootstrap transistor that provides a low resistance path for charging bootstrap capacitor 2110. In one embodiment, the bootstrap diode may ensure that there is a path for charging bootstrap capacitor 2110 during startup when there is no low side gate drive signal (LS_GATE). During this time the (PWM_HS) signal should be in a low state. If the (PWM_HS) signal is inadvertently turned on during this time, the (STP_HS) signal generated from low side driver circuit 2220 may prevent high side transistor 2125 from turning on. If the (PWM_LS) signal is turned on while the (PWM_HS) signal is on, then the (STP_LS1) and (STP_LS2) signals generated from inverter/buffer 2250 and inverter 2275, respectively will prevent low side transistor 2115 from turning on. In addition, in some embodiments the (LS_UVLO) signal may prevent low side gate 2117 and high side gate 2127 from turning on when either (Vcc) or (Vdd_LS) go below a predetermined voltage level.

Conversely, in some embodiments when the (PWM_LS) signal is in a low state, the (LS_GATE) signal to low side transistor 2115 may also be in a low state. In some embodiments, during the dead time between the (PWM_LS) low signal and the (PWM_HS) high signal transition, the inductive load may force either high side transistor 2125 or low side transistor 2115 to turn-on in the synchronous rectifier mode, depending on the direction of power flow. If high side transistor 2125 turns on during the dead time (e.g., in a boost mode), switch node (Vsw) 2145 voltage may rise close to (V+) 2135 (i.e., the rail voltage). This dv/dt condition on switch node (Vsw) 2145 may tend to pull the (L_SHIFT1) node to a low state relative to the switch node (i.e., because of capacitive coupling to ground) which may turn on high side transistor driver 2130 causing unintended conduction of high side transistor 2125. This condition may negate the dead time, causing shoot through.

In some embodiments this condition may be prevented by using blanking pulse generator 2223 to sense the turn-off transient of low side transistor 2115 and send a pulse to turn on second level shift transistor 2205. This may pull the (L_SHIFT2) signal to a low state which may then communicate with level shift 2 receiver circuit 2920 to generate a blanking pulse to drive blanking transistor 2940. In one embodiment, blanking transistor 2940 may act as a pull up to prevent the (L_SHIFT1) signal from going to a low state relative to switch node (Vsw) 2145.

In further embodiments, after the dead time when the (PWM_HS) signal transitions from a low state to a high state, an on pulse may be generated by on pulse generator 2260. This may pull the (L_SHIFT1) node voltage low for a brief period of time. In further embodiments this signal may be inverted by level shift 1 receiver circuit 2910 and a brief high signal will be sent to pull up transistor 2960 that will charge state storage capacitor 2955 to a high state. This may result in a corresponding high signal at the input of high side transistor driver 2130 which will turn on high side transistor 2125. Switch node (Vsw) 2145 voltage may remain close to (V+) 2135 (i.e., the rail voltage). State storing capacitor 2955 voltage may remain at a high state during this time because there is no discharge path.

In yet further embodiments, during the on pulse, bootstrap capacitor 2110 may discharge through first level shift transistor 2203. However, since the time period is relatively short, bootstrap capacitor 2110 may not discharge as much as it would if first level shift transistor 2203 was on during the entire duration of the (PWM_HS) signal (as was the case in half bridge circuit 100 in FIG. 1). More specifically, in some embodiments this may result in the switching frequency at which the UVLO engages to be a relatively lower value than in half bridge circuit 100 in FIG. 1.

In some embodiments, when the (PWM_HS) signal transitions from a high state to a low state, an off pulse may be generated by off pulse generator 2270. This may pull the (L_SHIFT2) node voltage low for a brief period of time. This signal may be inverted by level shift 2 receiver circuit 2920 and a brief high state signal may be sent to pull down transistor 2965 that will discharge state storing capacitor 2955 to a low state. This will result in a low signal at the input of high side transistor driver 2130 that will turn off high side transistor 2125. In further embodiments, state storing capacitor 2955 voltage may remain at a low state during this time because it has no discharge path.

In one embodiment, since the turn-off process in circuit 2100 does not involve charging level shift node capacitors through a high value pull up resistor, the turn-off times may be relatively shorter than in half bridge circuit 100 in FIG. 1. In further embodiments, high side transistor 2125 turn-on and turn-off processes may be controlled by the turn-on of substantially similar level shift transistors 2203, 2205, therefore the turn-on and turn-off propagation delays may be substantially similar. This may result in embodiments that have no need for a pull up trigger circuit and/or a pull up transistor as were both used in half bridge circuit 100 in FIG. 1.

ESD Circuits

Figure 34:
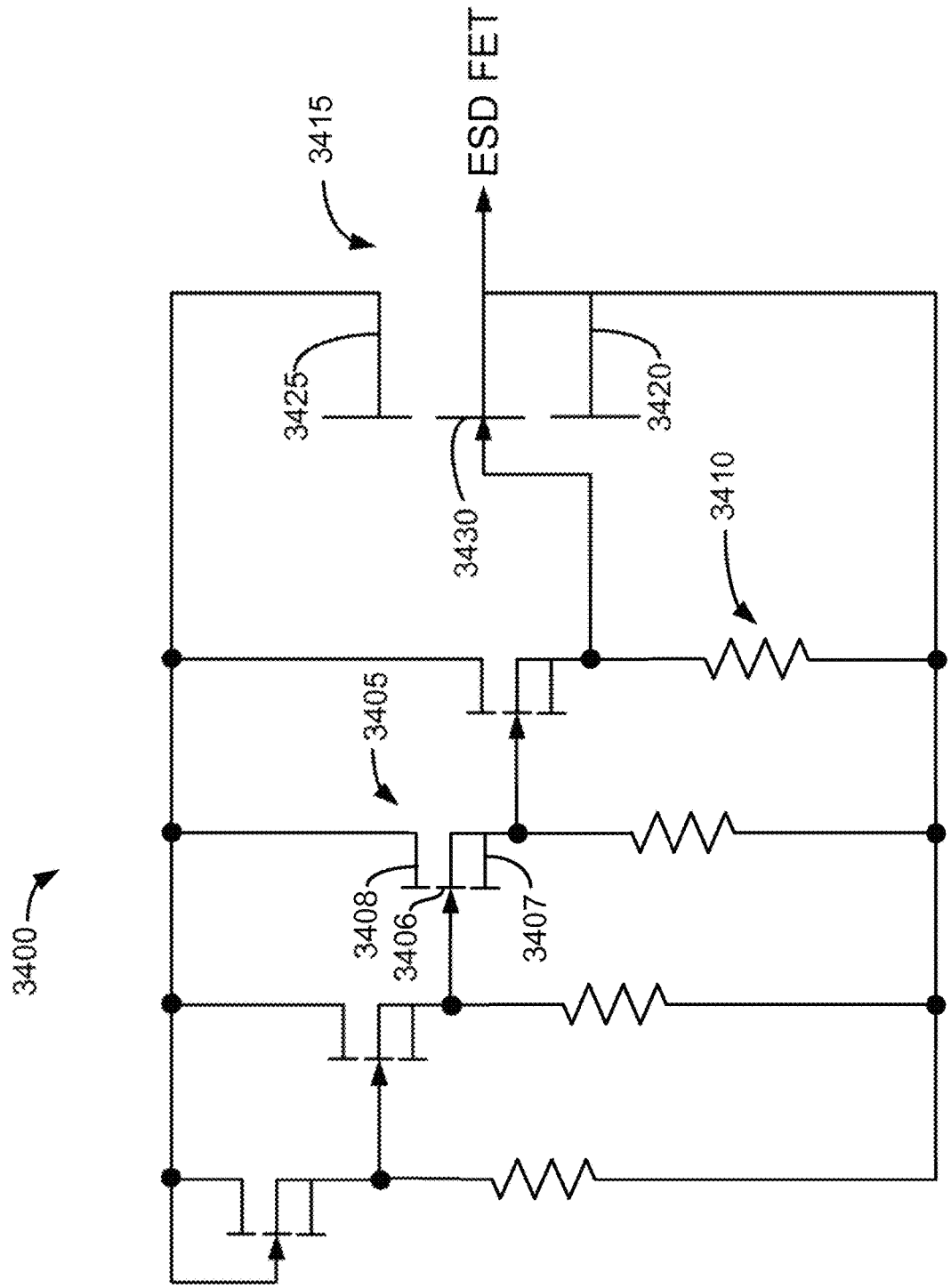
FIG. 34 is a schematic of an electro-static discharge (ESD) clamp circuit according to an embodiment of the disclosure.

Now referring to FIG. 34, in some embodiments, one or more pins (i.e., connections from a semiconductor device within an electronic package to an external terminal on the electronic package) may employ an electro-static discharge (ESD) clamp circuit to protect the circuit. The following embodiments illustrate ESD clamp circuits that may be used on one or more pins in one or more embodiments disclosed herein, as well as other embodiments that may require ESD protection. In further embodiments, the ESD clamp circuits disclosed herein may be employed on GaN-based devices.

One embodiment of an electro-static discharge (ESD) clamp circuit 3400 is illustrated. ESD clamp circuit 3400 may have a configuration employing one or more source follower stages 3405 made from enhancement-mode transistors. Each source follower stage 3405 may have a gate 3406 connected to a source 3407 of an adjacent source follower stage. In the embodiment illustrated in FIG. 34, four source follower stages 3405 are employed, however in other embodiments fewer or more may be used. Resistors 3410 are coupled to sources 3407 of source follower stages' 3405.

An ESD transistor 3415 is coupled to one or more source follower stages 3405 and may be configured to conduct a current greater than 500 mA when exposed to an overvoltage pulse, as discussed below. Resistors 3410 are disposed between source 3420 of ESD transistor 3415 and each source 3407 of source follower stages 3405. Drains 3408 of source follower stages 3405 are connected to drain 3425 of ESD transistor 3415. Source 3407 of the last source follower stage is coupled to gate 3430 of ESD transistor 3415.

In one embodiment, a turn-on voltage of ESD clamp circuit 3400 can be set by the total number of source follower stages 3405. However, since the last source follower stage is a transistor with a certain drain 3408 to source 3407 voltage and gate 3406 to source voltage the current through the final resistor 3410 may be relatively large and may result in a larger gate 3430 to source 3420 voltage across ESD transistor 3415. This condition may result in a relatively large ESD current capability and in some embodiments an improved leakage performance compared to other ESD circuit configurations.

In further embodiments, ESD clamp circuit 3400 may have a plurality of degrees of freedom with regard to transistor sizes and resistor values. In some embodiments ESD clamp circuit 3400 may be able to be made smaller than other ESD circuit configurations. In other embodiments, the performance of ESD clamp circuit 3400 may be improved by incrementally increasing the size of source follower stages 3405 as they get closer to ESD transistor 3415. In further embodiments, resistors 3410 can be replaced by depletion-mode transistors, reference current sinks or reference current sources, for example.

Figure 35:
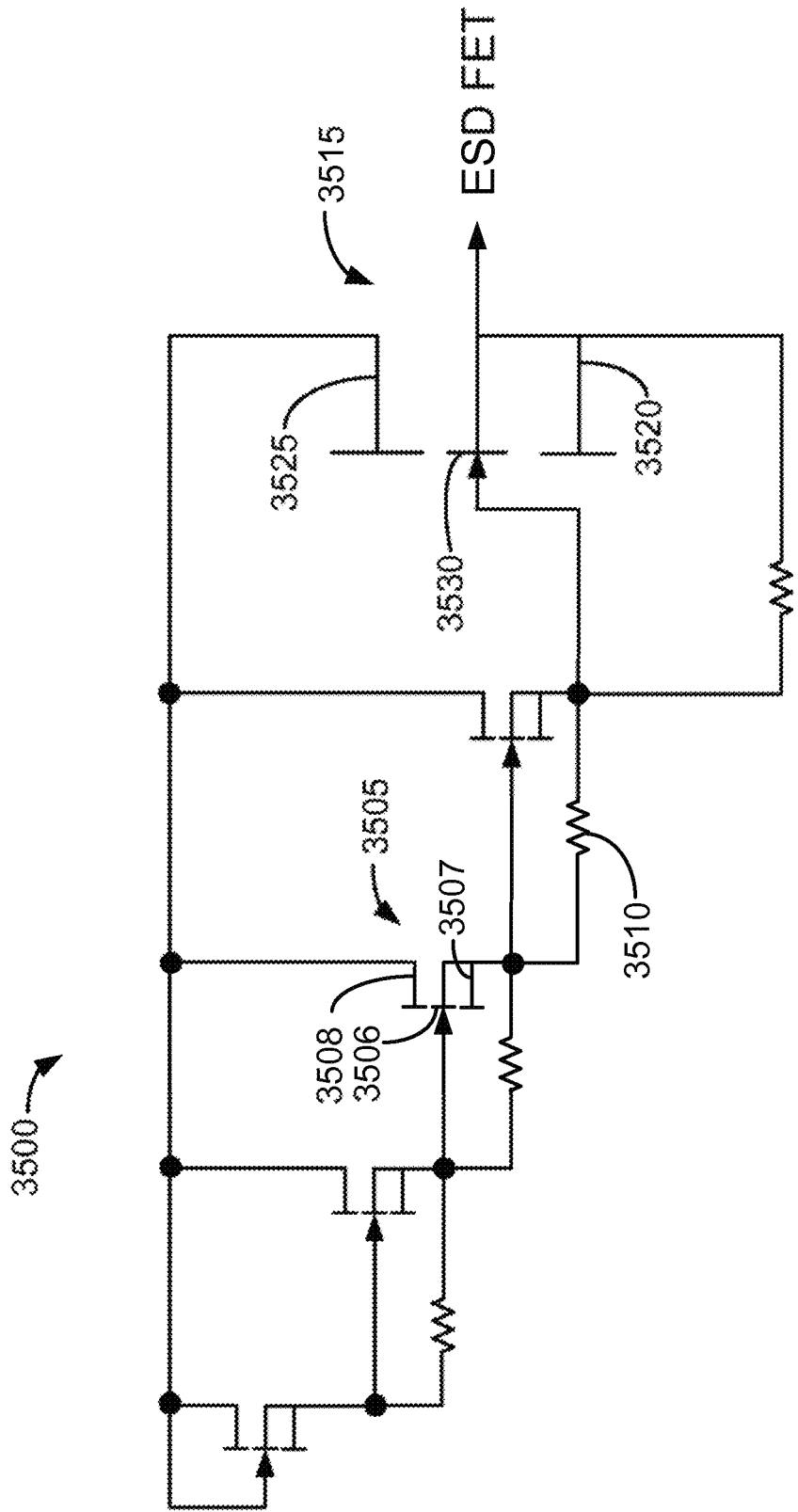
FIG. 35 is a schematic of an electro-static discharge (ESD) clamp circuit according to an embodiment of the disclosure.

Now referring to FIG. 35 an embodiment similar to ESD clamp circuit 3400 in FIG. 34 is illustrated, however ESD clamp circuit 3500 may have resistors in a different configuration, as discussed in more detail below. ESD clamp circuit 3500 may have a configuration employing one or more source follower stages 3505 made from one or more enhancement-mode transistors. Each source follower stage 3505 may have a gate 3506 connected to a source 3507 of an adjacent source follower stage. In the embodiment illustrated in FIG. 35, four source follower stages 3505 are employed, however in other embodiments fewer or more may be used. Resistors 3510 are coupled between sources 3507 of adjacent source follower stages 3505. An ESD transistor 3515 is coupled to source follower stages 3505 with resistor 3510 disposed between source 3520 of ESD transistor 3515 and source 3507 of a source follower stage 3505. Drains 3508 of source follower stages 3505 may be coupled together and to drain 3525 of ESD transistor 3515.

Electronic Packaging

Figure 36:
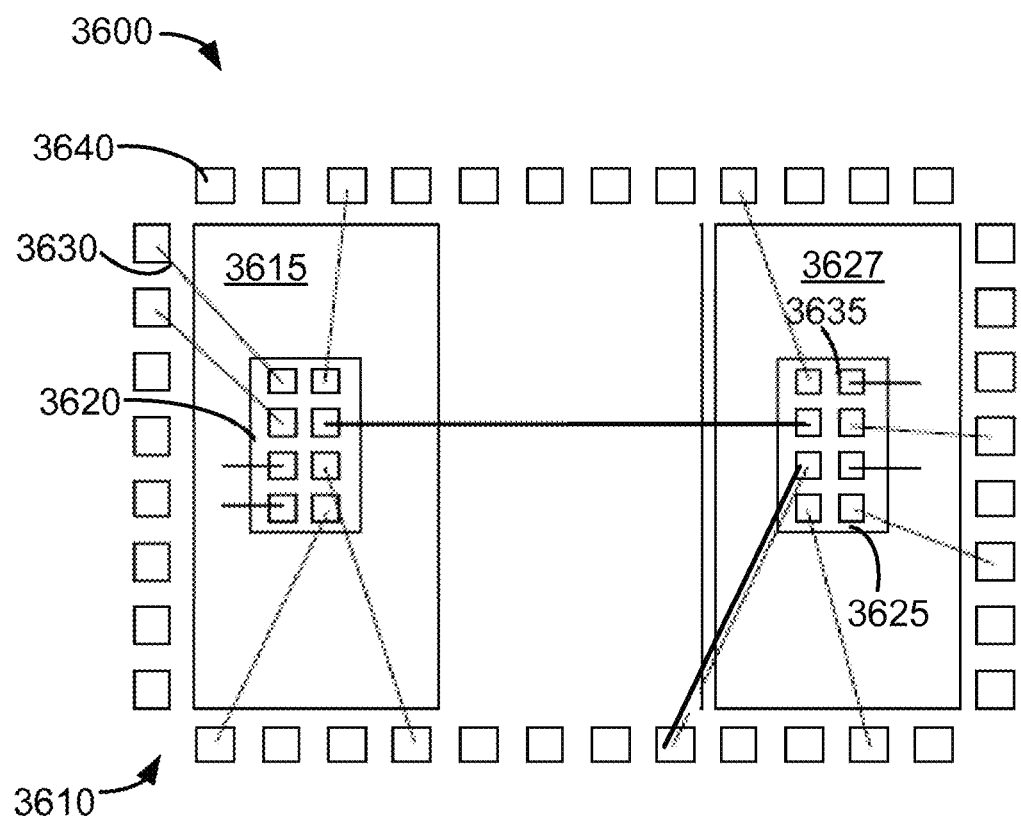
FIG. 36 is an illustration of a portion of an electronic package according to an embodiment of the disclosure.
Figure 37:
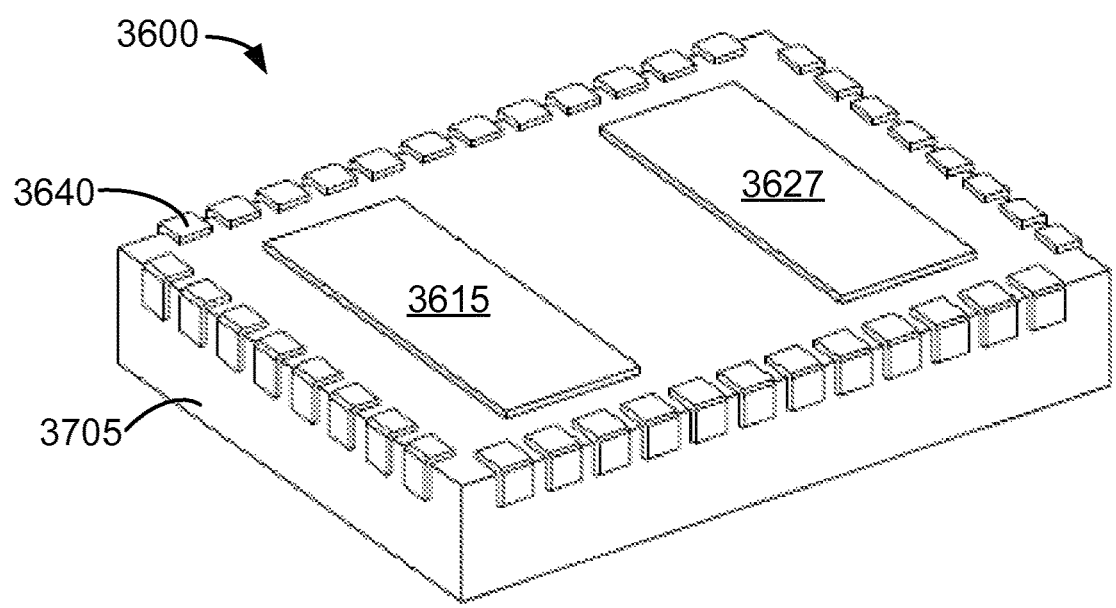
FIG. 37 is an illustration of the electronic package of FIG. 36.

Now referring to FIGS. 36 and 37, in some embodiments, one or more semiconductor devices may be disposed in one or more electronic packages. Myriad packaging configurations and types of electronic packages are available and are within the scope of this disclosure. FIG. 36 illustrates one example of what is known as a quad-flat no-lead electronic package with two semiconductor devices within it.

Electronic package 3600 may have a package base 3610 that has one or more die pads 3615 surrounded by one or more terminals 3620. In some embodiments package base 3610 may comprise a leadframe while in other embodiments it may comprise an organic printed circuit board, a ceramic circuit or another material.

In the embodiment depicted in FIG. 36, a first device 3620 is mounted to a first die pad 3615 and a second device 3625 is mounted to a second die pad 3627. In another embodiment one or more of first and second devices 3620, 3625, respectively may be mounted on an insulator (not shown) that is mounted to package base 3610. In one embodiment the insulator may be a ceramic or other non-electrically conductive material. First and second devices 3620, 3625, respectively are electrically coupled to terminals 3640 with wire bonds 3630 or any other type of electrical interconnect such as, for example, flip-chip bumps or columns that may be used in a flip-chip application. Wirebonds 3630 may extend between device bond pads 3635 to terminals 3640, and in some cases to die pads 3615, 3627 and in other cases to device bond pads 3635 on an adjacent device.

Now referring to FIG. 37, an isometric view of electronic package 3600 is shown. Terminals 3640 and die attach pads 3615 and 3627 may be disposed on an external surface and configured to attach to a printed circuit board or other device. In further embodiments, terminals 3640 and die attach pads 3615 and 3627 may only be accessible within the inside of electronic package 3600 and other connections may be disposed on the outside of the electronic package. More specifically, some embodiments may have internal electrical routing and there may not be a one to one correlation between internal and external connections.

In further embodiments first and second devices 3620, 3625, respectively (see FIG. 36) and a top surface of package base 3610 may be encapsulated by a non-electrically conductive material, such as for example, a molding compound. Myriad other electronic packages may be used such as, but not limited to, SOIC's, DIPS, MCM's and others. Further, in some embodiments each device may be in a separate electronic package while other embodiments may have two or more electronic devices within a single package. Other embodiments may have one or more passive devices within one or more electronic packages.

Alternative Driver Circuit

FIG. 38 is a schematic illustration of an embodiment of a driver circuit 3900. Driver circuit 3900 may be used as any of the driver circuits discussed herein and in some embodiments can be used to drive a bootstrap FET. Driver circuit 3900 may also be used in other suitable applications.

Driver circuit 3900 includes pull down switches 3902, 3904, 3906, 3908, and 3910; pull up switches 3912, 3914, and 3916; resistive elements 3922, 3924, and 3926; capacitors 3932 and 3934; and pass gate switch 3942.

Pull down switch 3904 has a source connected to a ground node, a drain connected to node N1, and a gate connected to the input node IN. In alternative embodiments, a resistive element is connected between the drain of pull down switch 3904 and node N1. Pull down switch 3902 has a source connected to the ground node, a drain connected to node N2, and a gate connected to the input node IN. Pull up switch 3912 has a drain connected to a supply node Vcc, a source connected to node N2, and a gate connected to node N1. Resistive element 3922 is connected between node N1 and node N3. Capacitor 3932 has a bottom plate connected to node N2 and a top plate connected to node N3. Pull up switch 3914 has a drain connected to power supply node Vdd, a source connected to node N3, and a gate connected to the input node INH.

In response to the voltage signal at the input node IN being greater than the ground voltage by at least a threshold voltage Vt of pull down switch 3902, pull down switch 3902 is conductive and causes the voltage at node N2 to become equal or substantially equal to the ground voltage. Similarly, in response to the voltage signal at the input node IN being greater than the ground voltage by at least a threshold voltage Vt of pull down switch 3904, pull down switch 3904 is conductive and causes the voltage at node N1 to become equal or substantially equal to the ground voltage. Furthermore, in response to the voltage signal at the input node INH being equal or substantially equal to two times the voltage at power supply node Vdd (e.g., 6 V), pull up switch 3914 is conductive and causes the voltage at node N3 to become equal or substantially equal to the voltage at power supply node Vdd.

In response to the voltage signal at the input node IN being equal or substantially equal to the ground voltage, pull down switches 3902 and 3904 are nonconductive. In addition, in response to the voltage signal at the input node INH being equal or substantially equal to the voltage at power supply node Vdd, pull up switch 3914 is also nonconductive. As a result of the voltage at node N3 having previously been charged to a value equal or substantially equal to the voltage at power supply node Vdd, and the voltage at node N1 having been previously charged to a value equal or substantially equal to the ground voltage, current flows through resistive element 3922, as understood by those of skill in the art. In response, the voltage at node N1 increases. Once the voltage at node N1 is greater than the voltage at node N2 by at least a threshold voltage Vt of pull up switch 3912, pull up switch 3912 becomes conductive, and causes current to flow from power supply node Vcc to node N2. As a result, the voltage at node N2 increases toward the voltage Vcc at power supply node Vcc.

In response to the voltage at node N2 increasing, the increase in the voltage at node N2 is coupled by capacitor 3932 to node N3. Because the voltage at node N3 increases, the voltage at node N1 increases, and because the voltage at node N1 increases, the voltage at node N2 increases, causing a further increase in the voltage at node N3. The process continues until the voltage at node N2 is equal or substantially equal to the voltage Vcc at power supply node Vcc, and the voltages at nodes N3 and N1 are equal or substantially equal to the voltage Vdd at power supply node Vdd plus the voltage Vcc at power supply node Vcc.

Pull down switch 3906 has a source connected to the ground node, a drain connected to node N4, and a gate connected to the input node IN. Capacitor 3934 has a bottom plate connected to node N4, and a top plate connected to node N5. Pull up switch 3916 has a drain connected to power supply node Vdd, a source connected to node N5, and a gate connected to the input node INH. Resistive element 3924 is connected between node N3 and node N4.

In response to the voltage signal at the input node IN being greater than the ground voltage by at least a threshold voltage Vt of pull down switch 3906, pull down switch 3906 is conductive and causes the voltage at node N4 to become equal or substantially equal to the ground voltage. In response to the voltage signal at the input node INH being equal or substantially equal to two times the voltage at power supply node Vdd, pull up switch 3916 is conductive and causes the voltage at node N5 to become equal or substantially equal to the voltage at power supply node Vdd.

In response to the voltage signal at the input node IN being equal or substantially equal to the ground voltage, pull down switch 3906 is nonconductive. In addition, in response to the voltage signal at the input node INH being equal or substantially equal to the voltage at power supply node Vdd, pull up switch 3916 is also nonconductive. As discussed above, in response to the voltage signal at input node IN being equal or substantially equal to the ground voltage and the voltage signal at the input node INH being equal or substantially equal to the voltage at power supply node Vdd, the voltage at node N3 increases from the voltage Vdd to the voltage Vdd plus the voltage Vcc. Because pull down switch 3906 is nonconductive, pull up switch 3916 is nonconductive, and the voltage at node N3 increases to the voltage Vdd plus the voltage Vcc, the voltage at node N4 also increases to be equal or substantially equal to the voltage Vdd plus the voltage Vcc.

The increase in the voltage at node N4 is coupled by capacitor 3934 to node N5. Accordingly, because the voltage at node N4 increases from the ground voltage to the voltage Vdd plus the voltage Vcc, the voltage at node N5 increases from the voltage Vdd to two times the voltage Vdd plus the voltage Vcc.

Pull down switch 3908 has a source connected to the ground node, a drain connected to node N6, and a gate connected to the input node IN. In alternative embodiments, a resistive element is connected between the drain of pull down switch 3908 and node N6. In addition, resistive element 3926 is connected between node N5 and node N6.

In response to the voltage signal at the input node IN being greater than the ground voltage by at least a threshold voltage Vt of pull down switch 3908, pull down switch 3908 is conductive and causes the voltage at node N6 to become equal or substantially equal to the ground voltage.

In response to the voltage signal at the input node IN being equal or substantially equal to the ground voltage, pull down switch 3908 is nonconductive. As discussed above, in response to the voltage signal at input node IN being equal or substantially equal to the ground voltage and in response to the voltage signal at the input node INH being equal or substantially equal to the voltage at power supply node Vdd, the voltage at node N5 increases from the voltage Vdd to two times the voltage Vdd plus the voltage Vcc. Because pull down switch 3908 is nonconductive and the voltage at node N5 increases to two times the voltage Vdd plus the voltage Vcc, the voltage at node N6 also increases to be equal or substantially equal to two times the voltage Vdd plus the voltage Vcc.

Pull down switch 3910 has a source connected to the ground node, a drain connected to the output node Out, and a gate connected to the input node IN. In addition, pass gate switch 3942 has a first drain/source terminal connected to node N3, a second drain/source terminal connected to output node Out, and a gate connected to node N6.

In response to the voltage signal at the input node IN being greater than the ground voltage by at least a threshold voltage Vt of pull down switch 3910, pull down switch 3910 is conductive and causes the voltage at the output node Out to become equal or substantially equal to the ground voltage.

In response to the voltage signal at the input node IN being equal or substantially equal to the ground voltage, pull down switch 3910 is nonconductive. As discussed above, in response to the voltage signal at input node IN being equal or substantially equal to the ground voltage and in response to the voltage signal at the input node INH being equal or substantially equal to the voltage at power supply node Vdd, the voltage at node N3 increases from the voltage Vdd to the voltage Vdd plus the voltage Vcc, and the voltage at node N6 increases to be equal or substantially equal to two times the voltage Vdd plus the voltage Vcc. Because pull down switch 3910 is nonconductive, the pass gate switch 3942 is conductive, and the voltage at node N3 is equal to the voltage Vdd plus the voltage Vcc, the voltage at output node Out becomes equal or substantially equal to the voltage Vdd plus the voltage Vcc.

In some embodiments, the drain of pull up switch 3912 is connected to supply node Vdd instead of to supply node Vcc. In various embodiments, pull down switch 3910 can be omitted. In some embodiments, pass gate switch 3942 may be omitted. In various embodiments, the output of driver circuit 3900 can be taken from node N2.

FIG. 39 is a timing diagram illustrating timing relationships between various signals of the driver circuit 3900.

With reference to FIGS. 38 and 39, the control signals at input nodes IN and INH are in phase or substantially in phase with each other. While the input voltage at input node IN is equal to voltage Vdd, the voltages at nodes N1 and N2 are caused to be equal or substantially equal to the ground voltage GND. In addition, in response to the voltage signal at the input node INH being equal or substantially equal to two times the voltage at power supply node Vdd, the voltage at node N3 is caused to be equal or substantially equal to voltage Vdd. Accordingly, capacitor 3932 is charged. In addition, current flows from the power supply Vdd through pull up switch 3914, resistive element 3922, and pull down switch 3904 to ground.

Furthermore, while the input voltage at input node IN is equal to voltage Vdd, the voltage at node N4 is caused to be equal or substantially equal to the ground voltage GND. In addition, in response to the voltage signal at the input node INH being equal or substantially equal to two times the voltage at power supply node Vdd, the voltage at node N5 is caused to be equal or substantially equal to voltage Vdd. Accordingly, current also flows from the power supply Vdd through pull up switch 3914, resistive element 3924, and pull down switch 3906 to ground.

In addition, while the input voltage at input node IN is equal to voltage Vdd, the voltage at node N6 is caused to be equal or substantially equal to the ground voltage GND. Accordingly, current also flows from the power supply Vdd through pull up switch 3916, resistive element 3926, and pull down switch 3908 to ground.

Furthermore, while the input voltage at input node IN is equal to voltage Vdd, pass gate switch 3942 is nonconductive, and pull down switch 3910 causes the voltage at output node Out to be equal to the ground voltage.

While the input voltage at input node IN is equal to the ground voltage, the voltage at node N1 increases because of current flowing through the resistive element 3922 from node N3. In addition, the voltage at node N2 increases because of current from pull up switch 3912. Because the increase in voltage at node N2 is coupled to node N3 by capacitor 3932, the voltage at node N3 increases to become equal or substantially equal to voltage Vdd plus voltage Vcc, the voltage at node N1 increases to become equal or substantially equal to voltage Vdd plus voltage Vcc, and the voltage at node N2 increases to become equal or substantially equal to voltage Vcc.

Furthermore, while the input voltage at input node IN is equal to the ground voltage, the voltage at node N4 is caused to be equal or substantially equal to voltage Vdd plus voltage Vcc because of current flowing through resistive element 3924 from node N3. In addition, because the increase in voltage at node N4 is coupled to node N5 by capacitor 3934, the voltage at node N5 increases to become equal or substantially equal to two times voltage Vdd plus voltage Vcc.

In addition, while the input voltage at input node IN is equal to the ground voltage, the voltage at node N6 is caused to be equal or substantially equal to two times voltage Vdd plus voltage Vcc because of current flowing through resistive element 3926 from node N5.

Furthermore, while the input voltage at input node IN is equal to the ground voltage, pass gate switch 3942 is conductive, and the voltage at the output node Out becomes equal or substantially equal to the voltage at node N3, which is voltage Vdd plus voltage Vcc.

In some embodiments, driver circuit 3900 is modified by removing pull down switch 3910 and connecting a charging circuit to output node Out, where the charging circuit causes the voltage at output node Out to be equal to a voltage other than ground while the input at input node IN is equal to the voltage Vdd, as understood by those of skill in the art.

For example, embodiments of circuit 3900 may be used as a bootstrap transistor driver circuit, such as bootstrap transistor drive circuit 225, discussed above with reference to FIG. 7, which drives a bootstrap capacitor charging circuit, such as bootstrap capacitor charging circuit 157, discussed above with reference to FIG. 12. In these embodiments, pull down switch 3910 may be replaced with a circuit which causes the voltage at output node Out to be equal to a voltage of a power source, such as a Vcc power source while the input at input node IN is equal to the voltage Vdd.

FIG. 40 is a schematic illustration of an embodiment of a driver circuit 4100. Driver circuit 4100 may be used as any of the driver circuits discussed herein. Driver circuit may also be used in other applications.

Driver circuit 4100 includes pull down switches 4102, 4104, 4106, 4108, and 4110; pull up switches 4112, 4114, and 4116; resistive elements 4122, 4124, and 4126; capacitors 4132 and 4134; pass gate switch 4142; and feedback switches 4162 and 4164.

Pull down switch 4104 has a source connected to a ground node, a drain connected to node N1, and a gate connected to the input node IN. Pull down switch 4102 has a source connected to the ground node, a drain connected to node N2, and a gate connected to the input node IN. Pull up switch 4112 has a drain connected to a supply node Vcc, a source connected to node N2, and a gate connected to node N1. Resistive element 4122 is connected between node N1 and node N3. Capacitor 4132 has a bottom plate connected to node N2 and a top plate connected to node N3. Pull up switch 4114 has a drain connected to power supply node Vdd, a source connected to node N3, and a gate connected to the input node INH.

In response to the voltage signal at the input node IN being greater than the ground voltage by at least a threshold voltage Vt of pull down switch 4102, pull down switch 4102 is conductive and causes the voltage at node N2 to become equal or substantially equal to the ground voltage. Similarly, in response to the voltage signal at the input node IN being greater than the ground voltage by at least a threshold voltage Vt of pull down switch 4104, pull down switch 4104 is conductive and causes the voltage at node N1 to become equal or substantially equal to the ground voltage. Furthermore, in response to the voltage signal at the input node INH being equal or substantially equal to two times the voltage at power supply node Vdd (e.g. 6 V), pull up switch 4114 is conductive and causes the voltage at node N3 to become equal or substantially equal to the voltage at power supply node Vdd.

In response to the voltage signal at the input node IN being equal or substantially equal to the ground voltage, pull down switches 4102 and 4104 are nonconductive. In addition, in response to the voltage signal at the input node INH being equal or substantially equal to the voltage at power supply node Vdd, pull up switch 4114 is also nonconductive. As a result of the voltage at node N3 having previously been charged to a value equal or substantially equal to the voltage at power supply node Vdd, and the voltage at node N1 having been previously charged to a value equal or substantially equal to the ground voltage, current flows through resistive element 4122, as understood by those of skill in the art. In response, the voltage at node N1 increases. Once the voltage at node N1 is greater than the voltage at node N2 by at least a threshold voltage Vt of pull up switch 4112, pull up switch 4112 becomes conductive, and causes current to flow from power supply node Vcc to node N2. As a result, the voltage at node N2 increases toward the voltage Vcc at power supply node Vcc.

In response to the voltage at node N2 increasing, the increase in the voltage at node N2 is coupled by capacitor 4132 to node N3. Because the voltage at node N3 increases, the voltage at node N1 increases, and because the voltage at node N1 increases, the voltage at node N2 increases, causing a further increase in the voltage at node N3. The process continues until the voltage at node N2 is equal or substantially equal to the voltage Vcc at power supply node Vcc, and the voltages at nodes N3 and N1 are equal or substantially equal to the voltage Vdd at power supply node Vdd plus the voltage Vcc at power supply node Vcc.

Pull down switch 4106 has a source connected to the ground node, a drain connected to node N4, and a gate connected to the input node IN. Capacitor 4134 has a bottom plate connected to node N4, and a top plate connected to node N5. Pull up switch 4116 has a drain connected to power supply node Vdd, a source connected to node N5, and a gate connected to the input node INH. Resistive element 4124 is connected between node N3 and node N4.

In response to the voltage signal at the input node IN being greater than the ground voltage by at least a threshold voltage Vt of pull down switch 4106, pull down switch 4106 is conductive and causes the voltage at node N4 to become equal or substantially equal to the ground voltage. In response to the voltage signal at the input node INH being equal or substantially equal to two the voltage at power supply node Vdd, pull up switch 4116 is conductive and causes the voltage at node N5 to become equal or substantially equal to the voltage at power supply node Vdd.

In response to the voltage signal at the input node IN being equal or substantially equal to the ground voltage, pull down switch 4106 is nonconductive. In addition, in response to the voltage signal at the input node INH being equal or substantially equal to the voltage at power supply node Vdd, pull up switch 4116 is also nonconductive. As discussed above, in response to the voltage signal at input node IN being equal or substantially equal to the ground voltage and the voltage signal at the input node INH being equal or substantially equal to the voltage at power supply node Vdd, the voltage at node N3 increases from the voltage Vdd to the voltage Vdd plus the voltage Vcc. Because pull down switch 4106 is nonconductive, pull up switch 4116 is nonconductive, and the voltage at node N3 increases to the voltage Vdd plus the voltage Vcc, the voltage at node N4 also increases to be equal or substantially equal to the voltage Vdd plus the voltage Vcc.

The increase in the voltage at node N4 is coupled by capacitor 4134 to node N5. Accordingly, because the voltage at node N4 increases from the ground voltage to the voltage Vdd plus the voltage Vcc, the voltage at node N5 increases from the voltage Vdd to two times the voltage Vdd plus the voltage Vcc.

Pull down switch 4108 has a source connected to the ground node, a drain connected to node N6, and a gate connected to the input node IN. In addition, resistive element 4126 is connected between node N5 and node N6. Furthermore, feedback switch 4162 has a first source/drain terminal connected to node N3, a second source/drain terminal connected to node N1, and a gate connected to node N6, and feedback switch 4164 has a first source/drain terminal connected to node N3, a second source/drain terminal connected to node N4, and a gate connected to node N6.

In response to the voltage signal at the input node IN being greater than the ground voltage by at least a threshold voltage Vt of pull down switch 4108, pull down switch 4108 is conductive and causes the voltage at node N6 to become equal or substantially equal to the ground voltage GND. Because the voltage at node N6 is equal or substantially equal to the ground voltage, feedback switches 4162 and 4164 are non-conductive.

In response to the voltage signal at the input node IN being equal or substantially equal to the ground voltage, pull down switch 4108 is nonconductive. As discussed above, in response to the voltage signal at input node IN being equal or substantially equal to the ground voltage and in response to the voltage signal at the input node INH being equal or substantially equal to the voltage at power supply node Vdd, the voltage at node N5 increases from the voltage Vdd to two times the voltage Vdd plus the voltage Vcc. Because pull down switch 4108 is nonconductive and the voltage at node N5 increases to two times the voltage Vdd plus the voltage Vcc, the voltage at node N6 also increases to be equal or substantially equal to two times the voltage Vdd plus the voltage Vcc.

In response to the voltage at node N6 being equal or substantially equal to two times the voltage Vdd plus the voltage Vcc, the feedback switches 4162 and 4164 are conductive. In response to feedback switches 4162 and 4164 being conductive, the impedances between nodes N3 and N1 and between nodes N3 and N4 decrease.

Because the impedance between nodes N3 and N1 decreases, the current from node N3 to node N1 increases, which causes the voltages at nodes N1 and N2 to increase faster than if the feedback switch 4162 was not used. As a result, the voltage at node N3 also increases faster than if the feedback switch 4162 was not used.

Because the impedance between nodes N3 and N4 decreases, the current from node N3 to node N4 increases, which causes the voltage at node N4 to increase faster than if the feedback switch 4164 was not used. As a result, the voltages at nodes N5 and N6 also increase faster than if the feedback switch 4164 was not used.

Pull down switch 4110 has a source connected to the ground node, a drain connected to the output node Out, and a gate connected to the input node IN. In addition, pass gate switch 4142 has a first drain/source terminal connected to node N3, a second drain/source terminal connected to output node Out, and a gate connected to node N6.

In response to the voltage signal at the input node IN being greater than the ground voltage by at least a threshold voltage Vt of pull down switch 4110, pull down switch 4110 is conductive and causes the voltage at the output node Out to become equal or substantially equal to the ground voltage.

In response to the voltage signal at the input node IN being equal or substantially equal to the ground voltage, pull down switch 4110 is nonconductive. As discussed above, in response to the voltage signal at input node IN being equal or substantially equal to the ground voltage and in response to the voltage signal at the input node INH being equal or substantially equal to the voltage at power supply node Vdd, the voltage at node N3 increases from the voltage Vdd to the voltage Vdd plus the voltage Vcc, and the voltage at node N6 increases to be equal or substantially equal to two times the voltage Vdd plus the voltage Vcc. Because pull down switch 4110 is nonconductive, the pass gate switch 4142 is conductive, and the voltage at node N3 is equal to the voltage Vdd plus the voltage Vcc, the voltage at output node Out becomes equal or substantially equal to the voltage Vdd plus the voltage Vcc.

As discussed above, because feedback switches 4162 and 4164 are used, the pass gate 4142 becomes conductive faster than if they were not used. Therefore, because feedback switches 4162 and 4164 are used, the voltage at output node Out increases to the voltage Vdd plus the voltage Vcc faster than if feedback switches 4162 and 4164 were not used.

In alternative embodiments, one of feedback switches 4162 and 4164 can be omitted. In some embodiments, the drain of pull up switch 4112 can be connected to supply node Vdd instead of to supply node Vcc. In various embodiments, pull down switch 4110 can be omitted. In some embodiments, pass gate switch 4142 may be omitted. In various embodiments, the output of driver circuit 4100 can be taken from node N2.

FIG. 41 is a timing diagram illustrating timing relationships between various signals of the driver circuit 4100.

With reference to FIGS. 40 and 41, the control signals at input nodes IN and INH are in phase or substantially in phase with each other. While the input voltage at input node IN is equal to voltage Vdd, the voltages at nodes N1 and N2 are caused to be equal or substantially equal to the ground voltage GND. In addition, in response to the voltage signal at the input node INH being equal or substantially equal to two times the voltage at power supply node Vdd, the voltage at node N3 is caused to be equal or substantially equal to voltage Vdd. Accordingly, capacitor 4132 is charged. In addition, current flows from the power supply Vdd through pull up switch 4114, resistive element 4122, and pull down switch 4104 to ground.

Furthermore, while the input voltage at input node IN is equal to voltage Vdd, the voltage at node N4 is caused to be equal or substantially equal to the ground voltage GND. In addition, in response to the voltage signal at the input node INH being equal or substantially equal to two times the voltage at power supply node Vdd, the voltage at node N5 is caused to be equal or substantially equal to voltage Vdd. Accordingly, current also flows from the power supply Vdd through pull up switch 4114, resistive element 4124, and pull down switch 4106 to ground.

In addition, while the input voltage at input node IN is equal to voltage Vdd, the voltage at node N6 is caused to be equal or substantially equal to the ground voltage GND. Accordingly, current also flows from the power supply Vdd through pull up switch 4116, resistive element 4126, and pull down switch 4108 to ground.

Furthermore, while the input voltage at input node IN is equal to voltage Vdd, pass gate switch 4142 is nonconductive, and pull down switch 4110 causes the voltage at output node Out to be equal to the ground voltage.

While the input voltage at input node IN is equal to the ground voltage, the voltage at node N1 increases because of current flowing through the resistive element 4122 from node N3. In addition, the voltage at node N2 increases because of current from pull up switch 4112. Because the increase in voltage at node N2 is coupled to node N3 by capacitor 4132, the voltage at node N3 increases to become equal or substantially equal to voltage Vdd plus voltage Vcc, the voltage at node N1 increases to become equal or substantially equal to voltage Vdd plus voltage Vcc, and the voltage at node N2 increases to become equal or substantially equal to voltage Vcc.

The increases in the voltages at nodes N1 and N3 to become equal or substantially equal to voltage Vdd plus voltage Vcc, respectively illustrated with solid lines, occur faster because of feedback switch 4162 than corresponding increases, illustrated with dashed lines, which would occur without feedback switch 4162. Similarly, the increase in the voltage at node N2 to become equal or substantially equal to voltage Vcc, illustrated with a solid line, occurs faster because of feedback switch 4162 than a corresponding increase, illustrated with a dashed line, which would occur without feedback switch 4162.

Furthermore, while the input voltage at input node IN is equal to the ground voltage, the voltage at node N4 is caused to be equal or substantially equal to voltage Vdd plus voltage Vcc because of current flowing through resistive element 4124 from node N3. In addition, because the increase in voltage at node N4 is coupled to node N5 by capacitor 4134, the voltage at node N5 increases to become equal or substantially equal to two times voltage Vdd plus voltage Vcc.

The increase in the voltage at node N4 to become equal or substantially equal to voltage Vdd plus voltage Vcc, illustrated with a solid line, occurs faster because of feedback switches 4162 4164 than a corresponding increase, illustrated with a dashed line, which would occur without feedback switches 4162 and 4164. Therefore, the increase in the voltage at node N5 to become equal or substantially equal to two times voltage Vdd plus voltage Vcc, illustrated with a solid line, occurs faster because of feedback switches 4162 4164 than a corresponding increase, illustrated with a dashed line, which would occur without feedback switches 4162 and 4164.

In addition, while the input voltage at input node IN is equal to the ground voltage, the voltage at node N6 is caused to be equal or substantially equal to two times voltage Vdd plus voltage Vcc because of current flowing through resistive element 4126 from node N5.

The increase in the voltage at node N6 to become equal or substantially equal to two times voltage Vdd plus voltage Vcc, illustrated with a solid line, occurs faster because of feedback switches 4162 4164 than a corresponding increase, illustrated with a dashed line, which would occur without feedback switches 4162 and 4164.

Furthermore, while the input voltage at input node IN is equal to the ground voltage, pass gate switch 4142 is conductive, and the voltage at the output node Out becomes equal or substantially equal to the voltage at node N3, which is voltage Vdd plus voltage Vcc.

The increase in the voltage at the output node Out to become equal or substantially equal to voltage Vdd plus voltage Vcc, illustrated with a solid line, occurs faster because of feedback switches 4162 and 4164 than a corresponding increase, illustrated with a dashed line, which would occur without feedback switches 4162 and 4164.

In some embodiments, driver circuit 4100 is modified by removing pull down switch 4110 and connecting another circuit to output node Out, where the other circuit causes the voltage at output node Out to be equal to a voltage other than ground while the input at input node IN is equal to the voltage Vdd, as understood by those of skill in the art.

For example, embodiments of circuit 4100 may be used as a bootstrap transistor driver circuit, such as bootstrap transistor drive circuit 225, discussed above with reference to FIG. 7, which drives a bootstrap capacitor charging circuit, such as bootstrap capacitor charging circuit 157, discussed above with reference to FIG. 12. In these embodiments, pull down switch 4110 may be replaced with a circuit which causes the voltage at output node Out to be equal to a voltage of a power source, such as a Vcc power source while the input at input node IN is equal to the voltage Vdd.

In some embodiments, because of the increased speed achieved by feedback switches 4162 and 4164, the impedance of one or more of resistive elements 3922, 3924, and 3926 may be increased. The increased impedance causes the respective voltage changes to occur slower or later, but the increased impedance also causes the circuit to use less power, and may cause the circuit to use less area, as understood by those of skill in the art.

In some embodiments, a ratio of the charge conducted by feedback switch 4162 from node N3 to node N2 to the charge conducted by resistive element 4122 from node N3 to node N2 is greater than about 0.1, about 0.2, about 0.4, about 0.75, about 1, about 1.5, about 2, about 5, about 10, or about 100. In some embodiments, a ratio of the charge conducted by feedback switch 4164 from node N3 to node N4 to the charge conducted by resistive element 4124 from node N3 to node N4 is greater than about 0.1, about 0.2, about 0.4, about 0.75, about 1, about 1.5, about 2, about 5, about 10, or about 100.

As understood by those of skill in the art, when the voltages of nodes discussed herein as being equal or substantially equal to a particular value, the particular value communicated includes voltage values differing from the specified particular value is a result of expected electronic circuit performance. For example, actual values may differ from the specified particular value as a result of incomplete charging, charge sharing, noise, capacitive coupling, and other effects, such as those caused by parasitics, as understood by those of skill in the art.

Certain circuits, such as basic logic circuits are illustrated herein using schematic symbols, and no transistor level description is given. These circuits may be implemented using techniques known to those of skill in the art. For example, those circuits described in U.S. patent application Ser. No. 16/375,394, titled "GaN LOGIC CIRCUITS," which was filed on Apr. 4, 2019, may be used. Other circuits may alternatively be used.

While various embodiments of present disclosure have been described, it will be apparent to those of skill in the art that many more embodiments and implementations are possible that are within the scope of this disclosure. Accordingly, the present disclosure is not to be restricted except in light of the attached claims and their equivalents.

Though the present disclosure is disclosed by way of specific embodiments as described above, those embodiments are not intended to limit the present disclosure. Based on the methods and the technical aspects disclosed above, variations and changes may be made to the presented embodiments by those skilled in the art without departing from the spirit and the scope of the present disclosure.

What is claimed is:

1. A driver circuit comprising:
    an input for receiving an input signal;
    an output for transmitting a drive signal;
    a first switch having a first source, a first drain and a first gate, wherein the first gate is coupled to a circuit node, the first drain is coupled to a first voltage source and the first source is coupled to the circuit node via a capacitor;
    a resistor coupled between the first gate and the circuit node;
    a second switch coupled between the first gate and the circuit node;
    a feedback signal generator circuit coupled to the second switch; and
    a third switch having a third source, a third drain and a third gate, wherein the third source is coupled to the circuit node, the third gate is directly coupled to the feedback signal generator circuit and the third drain is coupled to the output.

2. The driver circuit of claim 1, further comprising a fourth switch coupled between the first source and a ground.

3. The driver circuit of claim 2, further comprising a fifth switch coupled between a second voltage source and the capacitor.

4. The driver circuit of claim 3, further comprising a sixth switch coupled between the first gate and the ground.

5. The driver circuit of claim 4, wherein a gate of the fourth switch is coupled to a gate of the sixth switch.

6. The driver circuit of claim 5, wherein the gate of the fourth switch and the gate of the sixth switch are coupled to the input.

7. The driver circuit of claim 6, wherein the circuit node is a first circuit node, and wherein the first circuit node is coupled to a second circuit node, the second circuit node coupled to the third gate via the feedback signal generator circuit.

8. A method of operating a driver circuit, the method comprising:
   providing a driver circuit, the driver circuit comprising:
      an input node and an output node;
      a first switch having a first source, a first drain and a first gate, wherein the first gate is coupled to a first node, the first drain is coupled to a first voltage source and the first source is coupled to a second node, the second node coupled to a third node via a capacitor;
      a resistor coupled between the third node and the first node;
      a second switch coupled between the third node and the first node;
      a feedback signal generator circuit coupled to the second switch;
      a third switch having a third source, a third drain and a third gate, wherein the third source is coupled to the third node, the third gate is coupled to the feedback signal generator circuit and the third drain is coupled to the output node;
   receiving an input signal at the input node; and
   generating an output signal at the output node in response to receiving the input signal at the input node, the driver circuit operating in at least three states comprising:
      wherein in a first state the capacitor is coupled between a second voltage source having a second voltage and a ground causing the capacitor to charge to the second voltage;
      wherein in a second state a charge on the capacitor causes the first switch to transition to an on state; and
      wherein in a third state the feedback signal generator circuit turns on the third switch, thereby connecting the third node to the output node.

9. The method of claim 8, wherein the driver circuit further comprises a fourth switch coupled between the second node and the ground.

10. The method of claim 9, wherein the driver circuit further comprises a fifth switch coupled between the third node and the second voltage source.

11. The method of claim 10, wherein in the first state the fourth switch is in an on state, the first switch is on an off state, the fifth switch is in an on state, such that the capacitor is coupled between the second voltage source and the ground causing the capacitor to charge to the second voltage.

12. The method of claim 11, wherein in the second state the fourth and fifth switches transition to an off state, such that a charge on the capacitor causes the first switch to transition to an on state.

13. The method of claim 12, wherein in the second state a value of a voltage at the first node increases.

14. The method of claim 13, wherein a transitioning of the first switch to an on state causes the second node to follow the first node, thereby causing a value of a voltage at the second node to increase.

15. The method of claim 14, wherein an increase of the value of the voltage at the second node causes an increase of a voltage value at the third node.

16. A driver circuit comprising:
   an input for receiving an input signal;
   an output for transmitting a drive signal;
   a first switch having a first source, a first drain and a first gate, wherein the first gate is coupled to a circuit node, the first drain is coupled to a first voltage source and the first source is coupled to the circuit node via a capacitor;
   a resistor coupled between the first gate and the circuit node;
   a pass gate switch control circuit; and
   a second switch having a second source, a second drain and a second gate, wherein the second source is coupled to the circuit node, the second gate is directly coupled to the pass gate switch control circuit and the second drain is coupled to the output.

17. The driver circuit of claim 16, further comprising a third switch coupled between the first source and a ground.

18. The driver circuit of claim 17, further comprising a fourth switch coupled between a second voltage source and the capacitor.

19. The driver circuit of claim 18, further comprising a fifth switch coupled between the first gate and the ground.

20. The driver circuit of claim 19, wherein a gate of the third switch is coupled to a gate of the fifth switch.

* * * * *